(12) United States Patent
Yamamoto et al.

(10) Patent No.: US 8,008,507 B2
(45) Date of Patent: Aug. 30, 2011

(54) FLUORESCENT DIKETOPYRROLOPYRROLES

(75) Inventors: Hiroshi Yamamoto, Nishinomiya (JP); Hidetaka Oka, Takarazuka (JP); Mathias Düggeli, Basel (CH)

(73) Assignee: BASF SE Ludwigshafen (DE)

( * ) Notice: Subject to any disclaimer, the term of this patent is extended or adjusted under 35 U.S.C. 154(b) by 973 days.

(21) Appl. No.: 11/792,028

(22) PCT Filed: Nov. 30, 2005

(86) PCT No.: PCT/EP2005/056335
§ 371 (c)(1), (2), (4) Date: Oct. 30, 2007

(87) PCT Pub. No.: WO2006/061343
PCT Pub. Date: Jun. 15, 2006

(65) Prior Publication Data
US 2008/0217581 A1 Sep. 11, 2008

(30) Foreign Application Priority Data

Dec. 9, 2004 (EP) .................................. 04106432
Apr. 28, 2005 (EP) .................................. 05103489

(51) Int. Cl.
*C07D 487/02* (2006.01)
*B32B 9/00* (2006.01)
*C09K 11/06* (2006.01)

(52) U.S. Cl. ........ 548/453; 548/452; 428/690; 428/917; 252/301.16

(58) Field of Classification Search .................. 548/452, 548/453; 428/690, 917; 252/301.16
See application file for complete search history.

(56) References Cited

U.S. PATENT DOCUMENTS

| | | | | |
|---|---|---|---|---|
| 4,585,878 | A | 4/1986 | Jost et al. ...................... | 548/453 |
| 5,484,943 | A | 1/1996 | Zambounis et al. .......... | 548/453 |
| 5,969,154 | A | 10/1999 | Hao et al. ...................... | 548/453 |
| 6,451,459 | B1 | 9/2002 | Tieke et al. .................... | 428/690 |
| 6,603,020 | B1 | 8/2003 | Moretti et al. ................ | 548/453 |
| 6,805,978 | B2 * | 10/2004 | Murase et al. ................ | 428/690 |
| 7,001,677 | B2 | 2/2006 | Otani et al. .................... | 428/690 |
| 7,060,843 | B1 | 6/2006 | Otani et al. .................... | 548/453 |
| 7,063,806 | B2 | 6/2006 | Yamamoto et al. ........... | 252/301.16 |
| 7,501,076 | B2 * | 3/2009 | Yamamoto et al. ........... | 252/301.16 |
| 7,749,404 | B2 * | 7/2010 | Yamamoto et al. ........... | 252/301.16 |
| 2003/0082406 | A1 * | 5/2003 | Murase et al. ................ | 428/690 |
| 2004/0009368 | A1 * | 1/2004 | Otani et al. .................... | 428/690 |
| 2004/0151944 | A1 | 8/2004 | Onikubo et al. .............. | 428/690 |
| 2005/0008892 | A1 | 1/2005 | Yamamoto et al. ........... | 428/690 |
| 2006/0186376 | A1 | 8/2006 | Yamamoto et al. ........... | 252/301.16 |
| 2007/0010672 | A1 | 1/2007 | Yamamoto et al. ........... | 544/333 |

FOREIGN PATENT DOCUMENTS

| | | |
|---|---|---|
| EP | 0 499 011 | 2/1991 |
| EP | 0 648 770 | 4/1995 |
| EP | 1 078 970 | 2/2001 |
| EP | 1 087 005 | 3/2001 |
| EP | 1 087 006 | 3/2001 |
| EP | 1 253 151 | 10/2002 |
| EP | 1 399 514 | 1/2003 |
| JP | 2001-257077 | 9/2001 |
| JP | 2001-257078 | 9/2001 |
| WO | 03/048268 | 6/2003 |

OTHER PUBLICATIONS

Patent abstracts of Japan vol. 015, No. 072(C-0808; JP-A-02296891).
Patent abstracts of Japan vol. 018, No. 145(C-1178; JP-A-05320633).
Patent abstracts of Japan vol. 1997, No. 5 (JP-A-09003448).
XP-02223019 (JP-A-2001257077).
XP-02223020 (JP-A-2001257078).

* cited by examiner

*Primary Examiner* — Golam M Shameem
(74) *Attorney, Agent, or Firm* — Qi Zhuo

(57) ABSTRACT

The present invention relates to fluorescent diketopyrrolopyrroles of the formula (I), or (III), a process for their preparation and their use for the preparation of inks, colorants, pigmented plastics for coatings, non-impact-printing material, color filters, cosmetics, polymeric ink particles, toners, as fluorescent tracers, in color changing media, in solid dye lasers, EL lasers and electroluminescent devices. A luminescent device comprising a compound, or composition according to the present invention is high in the efficiency of electrical energy utilization and high in luminance.

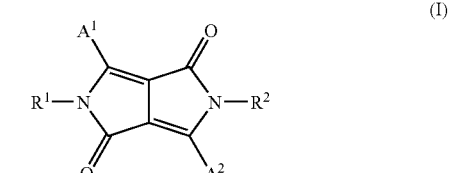

(I)

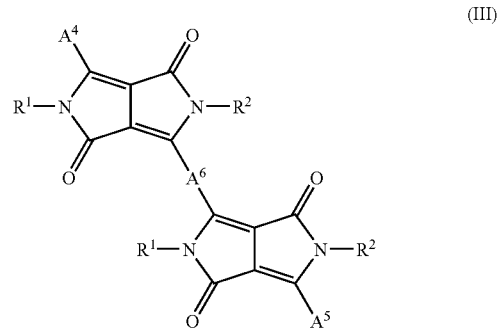

(III)

4 Claims, No Drawings

FLUORESCENT DIKETOPYRROLOPYRROLES

The present invention relates to fluorescent diketopyrrolopyrroles (DPPs) of the formula

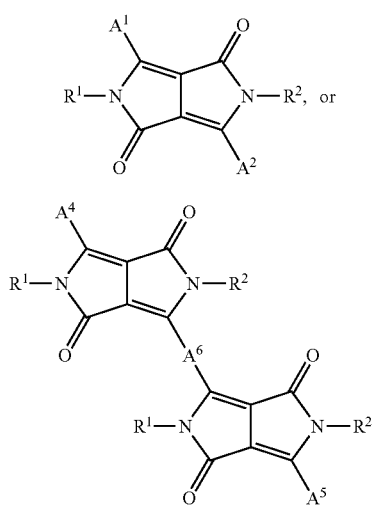

a process for their preparation and their use for the preparation of inks, colorants, pigmented plastics for coatings, non-impact-printing material, color filters, cosmetics, polymeric ink particles, toners, as fluorescent tracers, in color changing media, solid dye lasers, EL lasers and electroluminescent (EL) devices. A luminescent device comprising a compound according to the present invention is high in the efficiency of electrical energy utilisation and high in luminance.

EP-A-648770 relates to DPPs containing carbamate groups and their use as fluorescence dyestuff. In Examples 6 and 9 the following DPP compounds are disclosed:

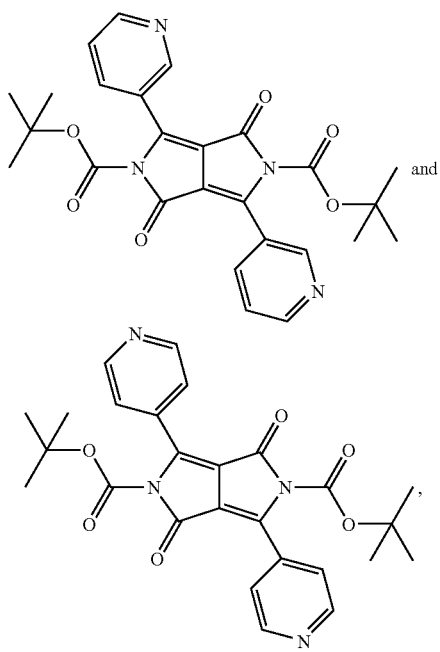

respectively.

WO90/01480 relates to substances, among others DPP compounds, with at least two different coloured forms, one of which can be converted to the other by supplying energy and their use in storage media. In Examples 10 and 11 the following DPP compounds are disclosed

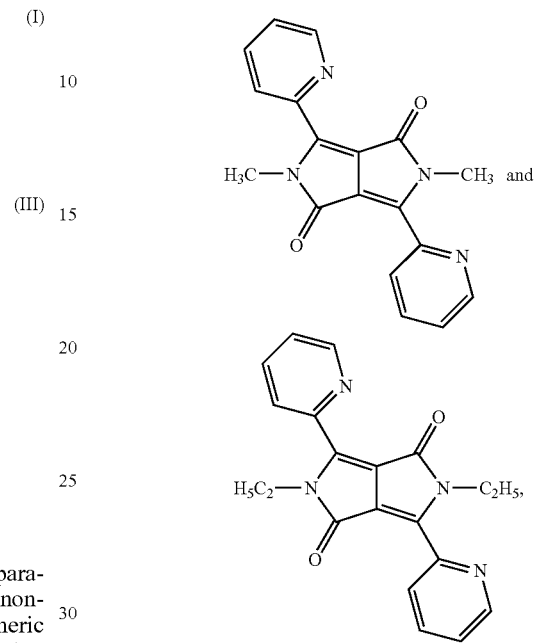

respectively.

It is presently common to prepare organic electroluminescent ("EL") devices which contain an organic fluorescent substance by a vacuum evaporation process, e.g. described in Appl. Phys. Lett., 51, 913 (1987). In general, two types of such vacuum evaporation processes are applied according to the constitution of light emitting material: a one-component type process and a two-component type (or "Host-Guest type" or "binary system") process (e.g. described in J. Appl. Phys., 65, 3610 (1989)).

JP-A2 2,296,891 (Ricoh) claims an electroluminescent element comprising a positive electrode, a negative electrode and one organic compound layer or a plurality of organic compound layers held between the positive and negative electrodes, but no hole transporting substance. At least one layer of said organic compound layers is a layer containing a pyrrolopyrrole compound represented by the following formula II"

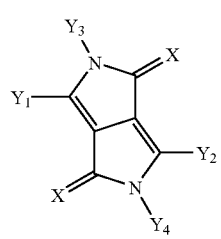

wherein $Y_1$ and $Y_2$ independently from each other represent a substituted or unsubstituted alkyl, cycloalkyl or aryl group, $Y_3$ and $Y_4$ independently represent a hydrogen atom or a substituted or unsubstituted alkyl or aryl group, and X represents an oxygen or a sulfur atom. Four compounds are mentioned explicitly, namely wherein X stands for oxygen in all cases, and wherein (a) $Y_3=Y_4$=methyl and $Y_1=Y_2$=p-tolyl, (b) $Y_3=Y_4$=methyl and $Y_1=Y_2$=hydrogen, (c) $Y_3=Y_4$=hydrogen and $Y_1=Y_2$=p-tolyl, and (d) $Y_3=Y_4=Y_1$=hydrogen and $Y_2$=p-chlorophenyl. No emission is observed, if DPP II" is used alone, i.e. without the addition of tris(8-hydroxyquinolinato) aluminium ("Alq$_3$").

JP-A2 5,320,633 (Sumitomo) claims an organic EL device having a light emitting layer comprising a light emitting material in an amount of 0.005 to 15 parts by weight of a DPP of the formula

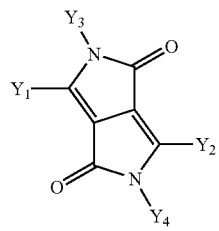

I' between a pair of electrodes, wherein at least one electrode being transparent or semi-transparent, wherein $Y_1$ and $Y_2$ independently of each other stand for a $C_6$-$C_{14}$-aryl group or a $C_6$-$C_{12}$heterocyclic group, such as thienyl, 2-pyridyl, 3-pyridyl and 4-pyridyl, and $Y_3$ and $Y_4$ independently of each other stand for a hydrogen atom, a $C_1$-$C_{12}$-alkyl group or a $C_6$-$C_{14}$aryl group. Although the main claim is silent about the use of Alq$_3$, it is clear from the specification and the examples, especially from comparative example 2, that Alq$_3$ is an essential feature in the claimed EL element or device.

JP-A2 9003448 (Toyo) describes an organic EL element having between a pair of electrodes a luminous layer containing a DPP-compound as electron-transporting material or an organic compound thin film layer including a luminous layer and an electron-injecting layer wherein the electron-injecting layer contains a DPP compound as the electron-transporting material. The following three heteroarylpyrrolopyrroles are explicitly mentioned:

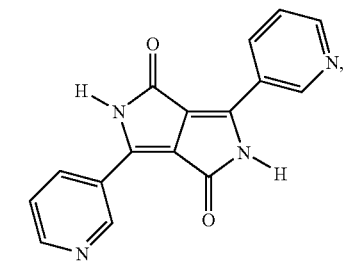

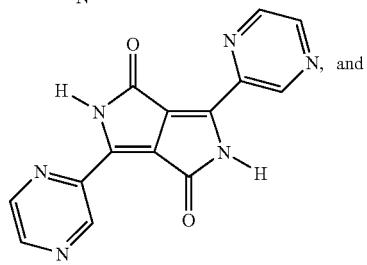

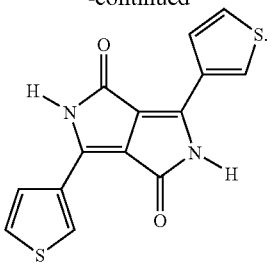

The disadvantage of the claimed EL devices is that according to the examples always Alq$_3$ and a phenanthrene diamine (as hole-injecting material) have to be used.

EP-A-499,011 describes electroluminescent devices comprising DPP-compounds of the formula

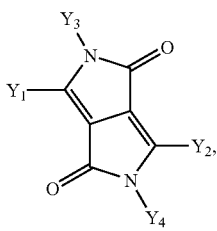

I' wherein $Y_1$ and $Y_2$ can be a substituted or unsubstituted phenyl group, a 3-pyridyl- or 4-pyridyl group and $Y_3$ and $Y_4$ independently of each other stand for a hydrogen atom, a $C_1$-$C_{18}$-alkyl group, an $C_3$-$C_{18}$alkenyl group and the double bond not being the $C_1$-position. In example 1 and 7 the following DPP compounds are explicitly mentioned

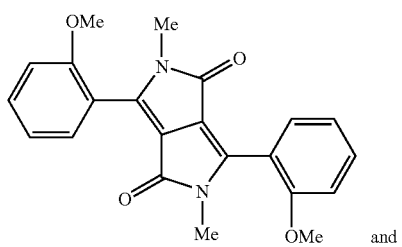

and

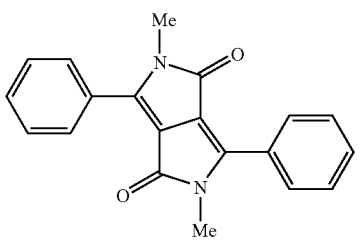

WO98/33862 describes the use of the DPP-compound of formula IV'

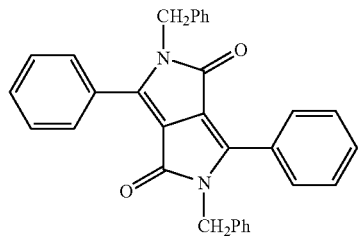

as a guest molecule in electroluminescent devices.

EP-A-1087005 relates to fluorescent N-substituted diketopyrrolopyrroles ("DPPs") of the formula I'

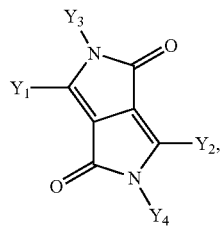

characterized in that $Y^1$ and $Y^2$ are derived from the following groups:
example

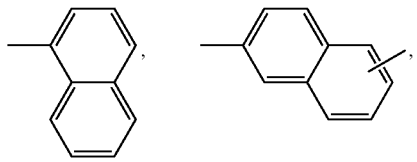

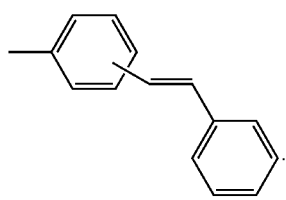

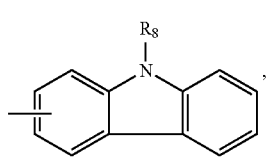

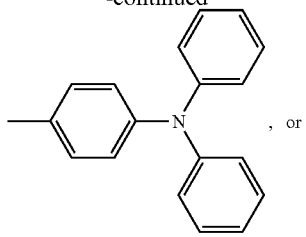

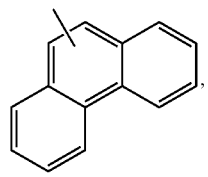

which can be substituted or unsubstituted.

EP-A-1087006 relates to an electroluminescent device comprising in this order (a) an anode, (b) a hole transporting layer, (c) a light-emitting layer, (d) optionally an electron transporting layer and (e) a cathode and a light-emitting substance, wherein the light-emitting substance is a diketopyrrolopyrrole ("DPP") represented by formula I'.

WO03/002672 relates to diketopyrrolopyrroles of formula I' characterized in that $Y^1$ and $Y^2$ are derived from the following 1-naphthyl group:

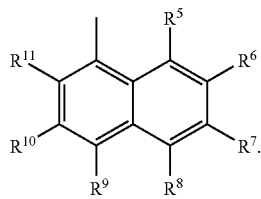

WO03/064558 discloses EL devices comprising a DPP guest chromophore of formula IV and a DPP host chromophore of formula II (see below).

EP-A-1,253,151 discloses EL devices comprising at least one of (a) a DPP derivative and an organic fluorescent material having a fluorescent peak wavelength in the range of 580 to 720 nm and (b) a pyrromethene metal complex (see also JP2001 257077, JP2001 257078, and JP2001 297881 (Toray)).

WO03/048268 relates to compositions for EL elements, comprising a compound having a perylene ring and a compound having a DPP skeleton. The following three heteroarylpyrrolopyrroles are explicitly mentioned:

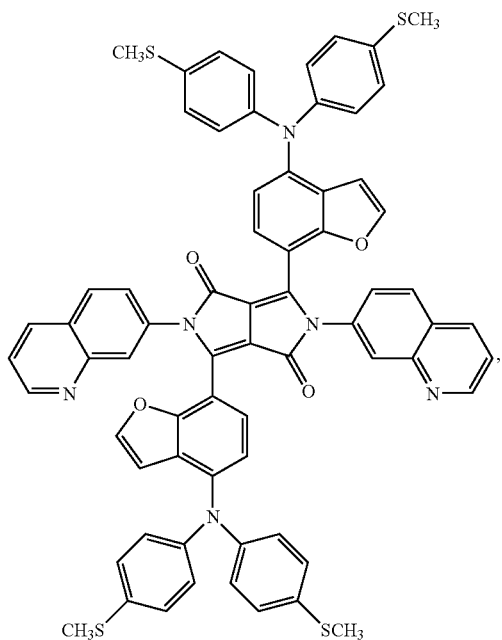

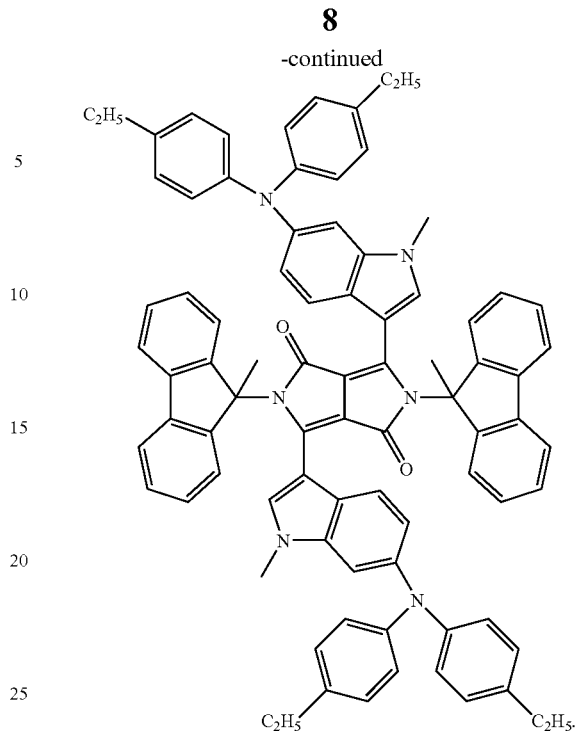

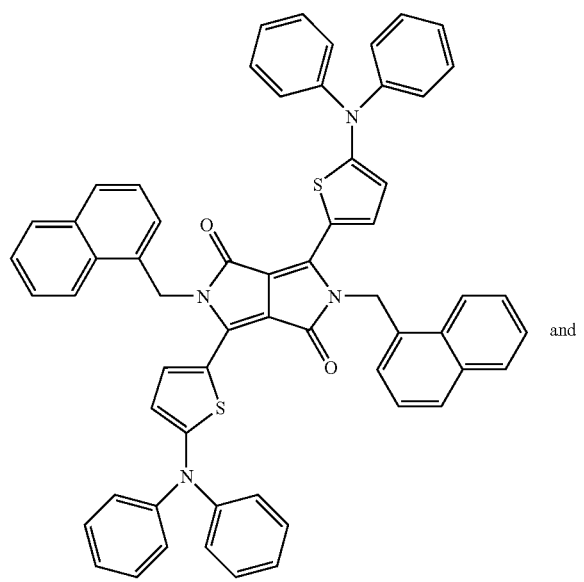 and

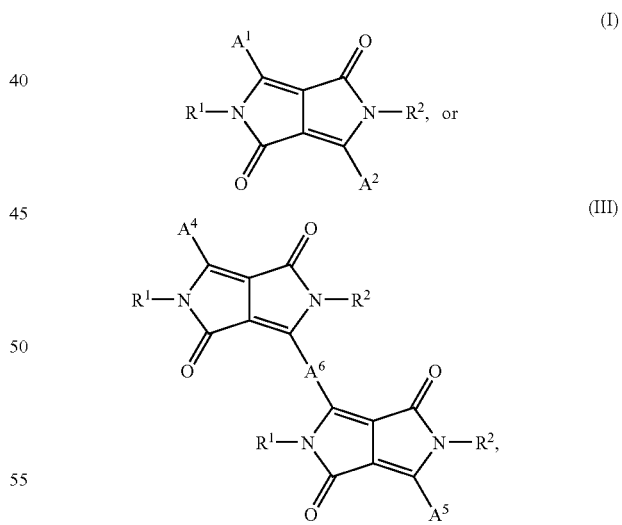

Surprisingly, it was found that luminescent devices, which are high durability besides high in the efficiency of electrical energy utilisation and high in luminance, can be obtained if specific DPP compounds or specific combinations of DPP compounds are used, especially as light emitting substances.

Accordingly, the present invention relates to fluorescent diketopyrrolopyrroles of the formula wherein $R^1$ and $R^2$ may be the same or different and are selected from a $C_1$-$C_{25}$alkyl group, an allyl group, which can be substituted one to three times with $C_1$-$C_3$alkyl, a cycloalkyl group, which can optionally be substituted one to three times with $C_1$-$C_8$alkyl and/or $C_1$-$C_8$alkoxy, a cycloalkyl group, which is condensed one or two times by phenyl which can be substituted one to three times with $C_1$-$C_4$-alkyl, halogen, nitro, or cyano, an alkenyl group, a cycloalkenyl group, an alkynyl group, a heterocyclic group, haloalkyl, haloalkenyl, haloalkynyl, a ketone or aldehyde group, an ester group, a carbamoyl group, a silyl group, a siloxanyl group, aryl group, heteroaryl group or —CR³R⁴—(CH₂)ₘ-A³ wherein R³ and R⁴ independently from each other stand for hydrogen or C₁-C₄alkyl, or phenyl which can be substituted one to three times with C₁-C₃alkyl, A³ stands for aryl, or heteroaryl, in particular phenyl or 1- or 2-naphthyl, which can be substituted one to three times with C₁-C₈alkyl and/or C₁-C₈alkoxy, and m stands for 0, 1, 2, 3 or 4, A¹ stands for

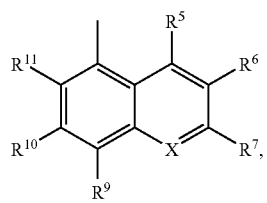

(II)

wherein
X is N, or C—R⁸,
R⁵ to R¹¹ may be the same or different and are selected from hydrogen, C₁-C₂₅alkyl, cycloalkyl, aralkyl, alkenyl, cycloalkenyl, alkynyl, hydroxyl, a mercapto group, alkoxy, alkylthio, an aryl ether group, an aryl thioether group, aryl, heteroaryl, a heterocyclic group, halogen, haloalkyl, haloalkenyl, haloalkynyl, a cyano group, an aldehyde group, a carbonyl group, a carboxyl group, an ester group, a carbamoyl group, a group NR²⁷R²⁸, wherein R²⁷ and R²⁸ independently of each other stand for a hydrogen atom, an alkyl group, an optionally substituted cycloalkyl group, an optionally substituted aryl group, an optionally substituted heteroaryl group, an optionally substituted heterocyclic group, an aralkyl group, or R²⁷ and R²⁸ together with the nitrogen atom to which they are bonded form a five or six membered heterocyclic ring, which can be condensed by one or two optionally substituted phenyl groups, a nitro group, a silyl group, a siloxanyl group, a substituted or unsubstituted vinyl group, or at least two adjacent substituents R⁵ to R¹¹ form an aromatic, heteroaromatic, or aliphatic fused ring system, A² stands for a unsubstituted, or substituted aryl group, or a unsubstituted, or substituted heteroaryl group, with the proviso that A² and A¹ have different meanings within the same molecule, especially A² stands for A¹, with the proviso that A² and A¹ have different meanings within the same molecule, or A² stands for

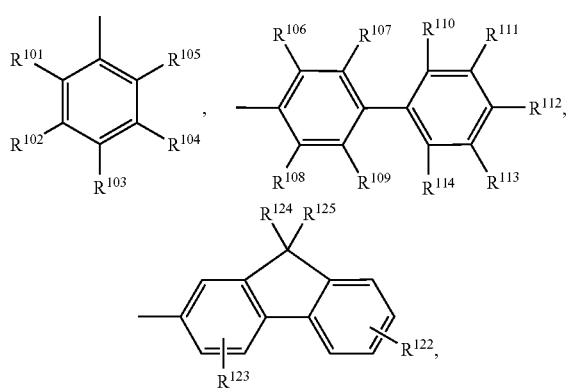

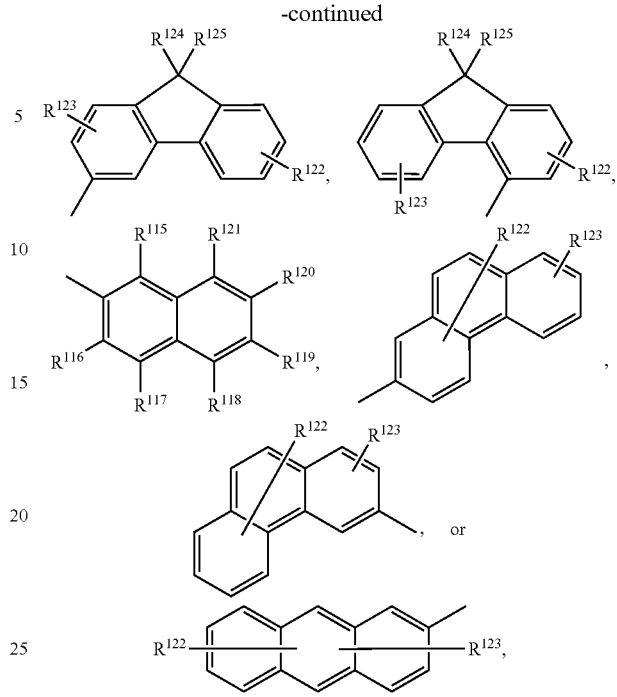

wherein R¹⁰¹ to R¹²³ may be the same or different and are selected from hydrogen, C₁-C₂₅alkyl group, cycloalkyl, aralkyl, alkenyl, cycloalkenyl, alkynyl, hydroxyl, a mercapto group, alkoxy, alkylthio, an aryl ether group, an aryl thioether group, aryl, a heterocyclic group, halogen, haloalkyl, haloalkenyl, haloalkynyl, a cyano group, an aldehyde group, a carbonyl group, a carboxyl group, an ester group, a carbamoyl group, a group NR²⁷R²⁸, wherein R²⁷ and R²⁸ are as defined above, a nitro group, a silyl group, a siloxanyl group, a substituted or unsubstituted vinyl group, or at least two adjacent substituents R¹¹⁵ to R¹²¹ form an aromatic, heteroaromatic or aliphatic fused ring system, R¹²⁴ and R¹²⁵ may be the same or different and are selected from C₁-C₁₈alkyl; C₁-C₁₈alkoxy, C₆-C₁₈aryl; C₇-C₁₈aralkyl; or R¹²⁴ and R¹²⁵ together form a ring especially a five-, six- or seven-membered ring, which can optionally be substituted by C₁-C₈alkyl, or which can optionally be condensed one or two times by phenyl which can be substituted one to three times with C₁-C₈-alkyl, C₁-C₈-alkoxy, halogen and cyano; or A² stands for a heteroaromatic group, especially

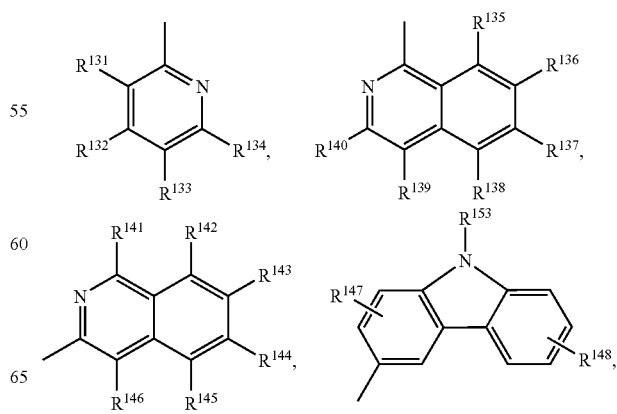

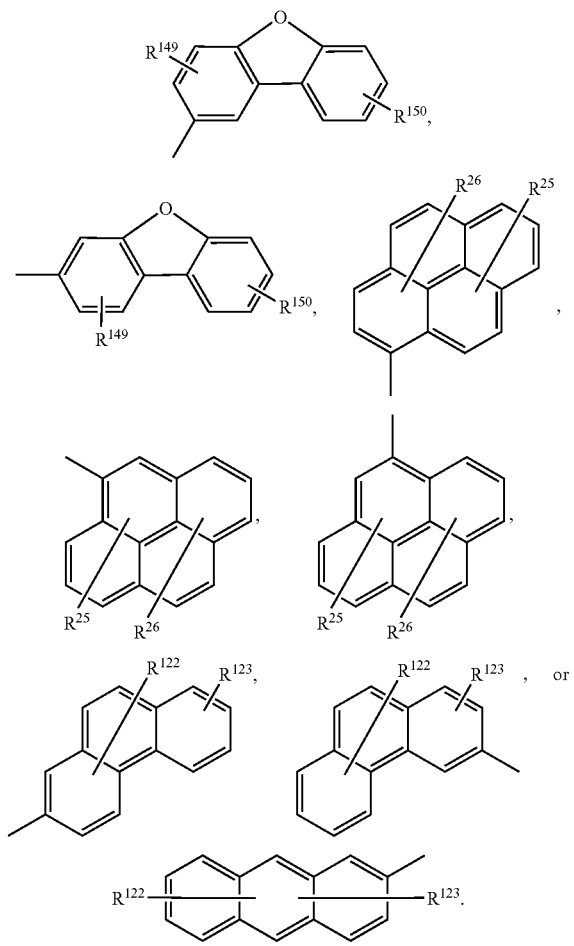

If A¹ stands for a group

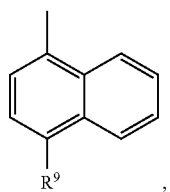

wherein R⁹ is hydrogen, A² preferably stands for a group

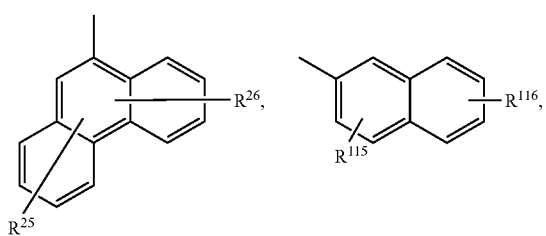

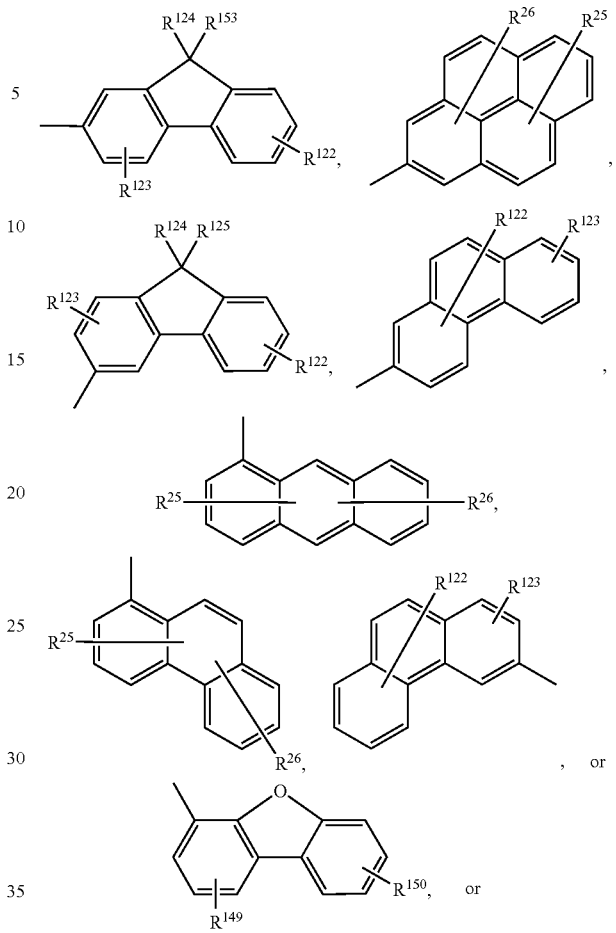

wherein R¹³¹ to R¹⁵² may be the same or different and are selected from hydrogen, $C_1$-$C_{25}$alkyl group, cycloalkyl, aralkyl, alkenyl, cycloalkenyl, alkynyl, hydroxyl, a mercapto group, alkoxy, alkylthio, an aryl ether group, an aryl thioether group, aryl, a heterocyclic group, halogen, haloalkyl, haloalkenyl, haloalkynyl, a cyano group, an aldehyde group, a carbonyl group, a carboxyl group, an ester group, a carbamoyl group, a group $NR^{27}R^{28}$, wherein $R^{27}$ and $R^{28}$ are as defined above, a nitro group, a silyl group, a siloxanyl group, a substituted or unsubstituted vinyl group, $R^{153}$ is a hydrogen atom, a $C_1$-$C_{25}$alkyl group, which might be interrupted by —O—, a cycloalkyl group, an aralkyl group, an aryl group, or a heterocyclic group, $A^4$ and $A^5$ independently of each other have the meaning of A2, and $A^6$ is cycloalkyl, arylene, or heteroarylene, which are optionally substituted one to three times with $C_1$-$C_8$-alkyl, or $C_1$-$C_8$-alkoxy, with the proviso that the following compounds are excluded:

| Compound | A¹ | A² | R¹ = R² |
|---|---|---|---|
| T-1 | 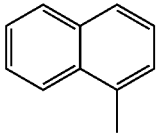 | 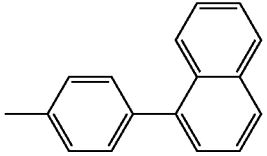 | —CH₃ |
| T-3 | 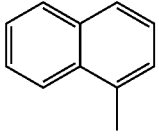 | 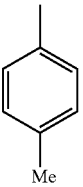 | 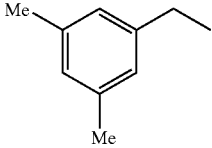 |
| T-4 | 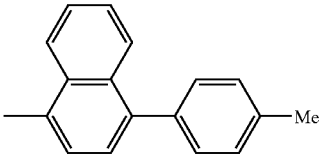 | 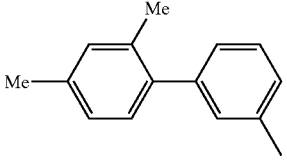 | 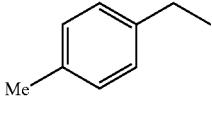 |
| T-6 | 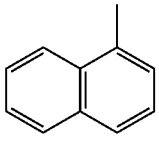 | 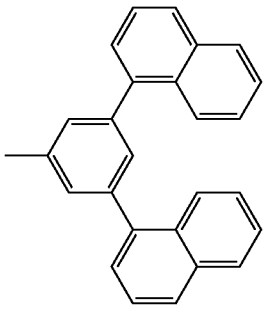 | —CH₃ |
| T-7 | 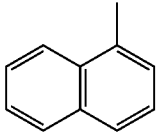 | 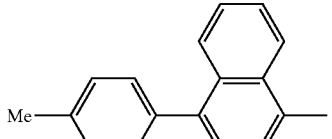 | —CH₃ |
| T-8 | 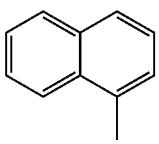 | 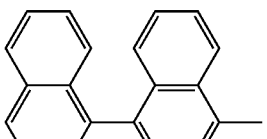 | 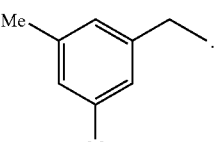 |

$R^1$ and $R^2$ can be different, but preferably have the same meaning and are preferably a $C_{1-18}$ alkyl group.

In a preferred embodiment of the present invention at least one of $A^1$ and $A^2$, respectively stands for a fused aromatic ring system containing at least 13 carbon atoms, which can be substituted and wherein part of the carbon atoms can be replaced by heteroatoms, preferably nitrogen or oxygen, such as

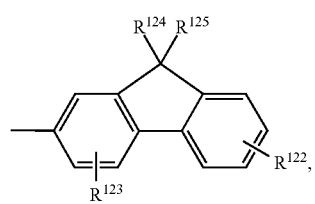

-continued

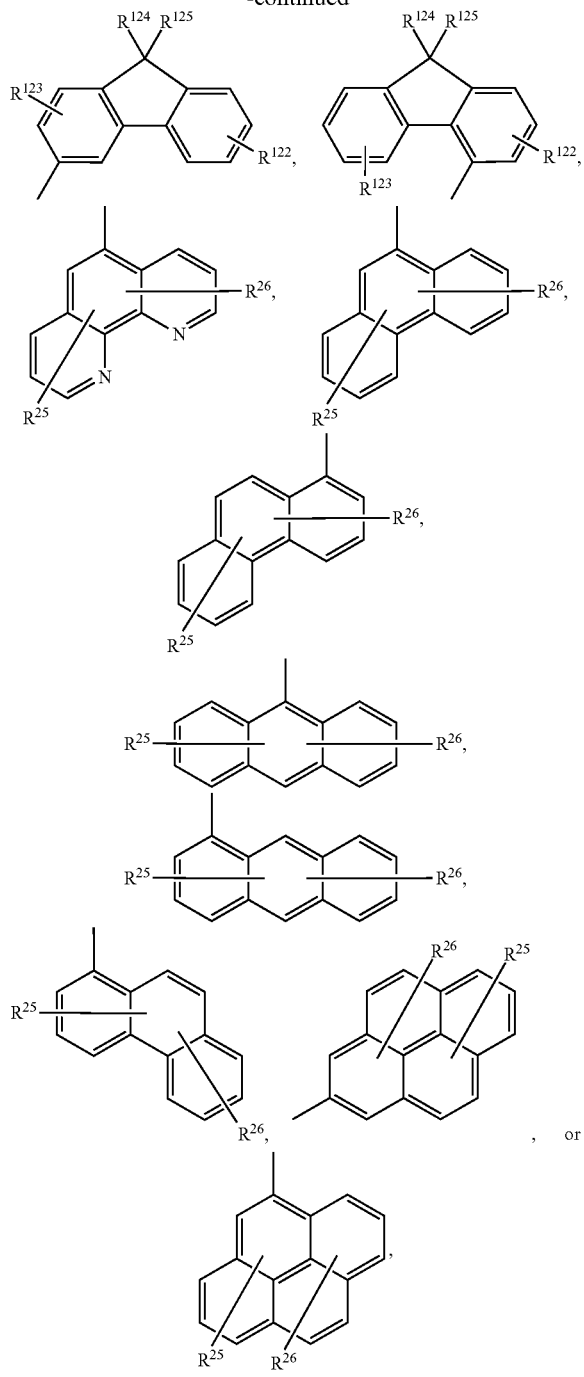

wherein R²⁵' is a $C_6$-$C_{12}$aryl group, especially phenyl, or naphthyl, which may be substituted by one, or more $C_1$-$C_8$alkyl, or $C_1$-$C_8$alkoxy groups, R³⁰⁰ is $C_1$-$C_8$alkyl, a $C_6$-$C_{24}$aromatic, or $C_2$-$C_{17}$heteroaromatic group, which may be substituted by one, or more $C_1$-$C_8$alkyl, or $C_1$-$C_8$alkoxy groups, $R^{21}$, $R^{22}$, $R^{23}$, $R^{25}$ and $R^{26}$ are independently of each other hydrogen, $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group, a silyl group or a siloxanyl group, $R^{27}$ and $R^{28}$ are independently of each other

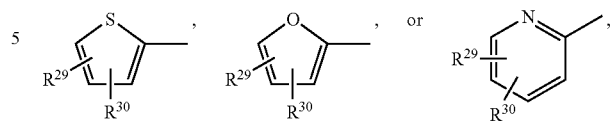

especially

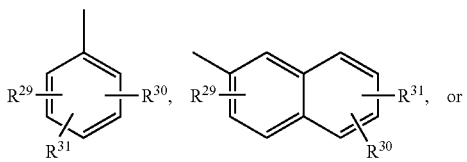

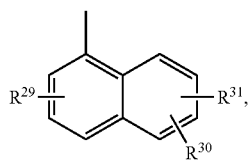

wherein $R^{29}$, $R^{30}$ and $R^{31}$ are independently of each other hydrogen, $C_1$-$C_8$alkyl, $C_1$-$C_8$alkoxy or a group —$NR^{32}R^{33}$, wherein $R^{32}$ and $R^{33}$ are independently of each other

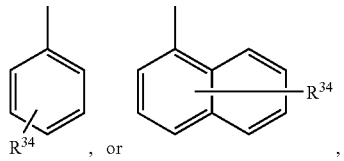

wherein $R^{34}$ is hydrogen, $C_1$-$C_8$alkyl or $C_1$-$C_8$alkoxy, or $R^{27}$ and $R^{28}$ together with the nitrogen atom to which they are bonded form a five or six membered heterocyclic ring, such as

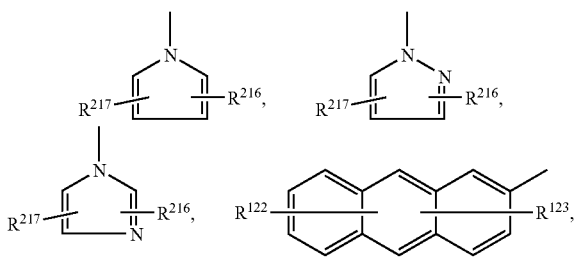

or a heteroaromatic group, especially

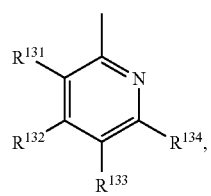

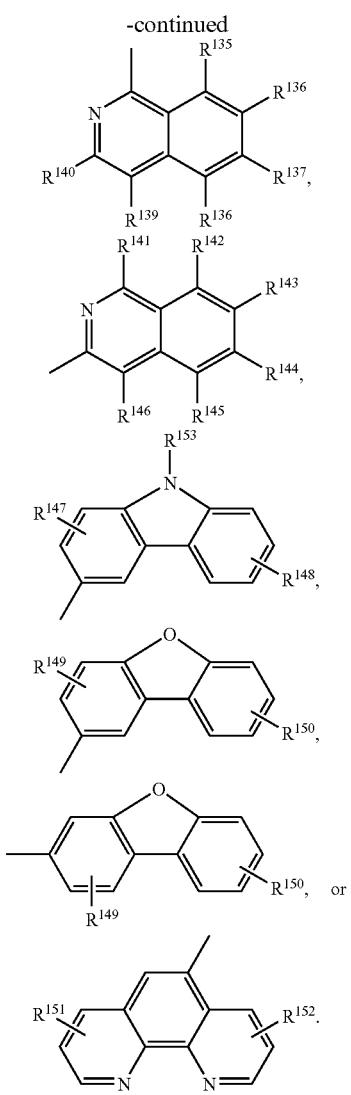

In another preferred embodiment of the present invention A¹ stands for a group of formula

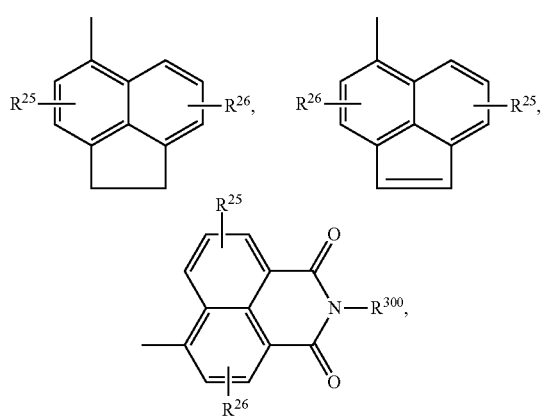

wherein $R^{25}$ and $R^{26}$ are as defined above and $R^{300}$ is $C_1$-$C_8$alkyl, a $C_6$-$C_{24}$aromatic, or $C_2$-$C_{17}$heteroaromatic group, which may be substituted by one, or more $C_1$-$C_8$alkyl, or $C_1$-$C_8$alkoxy groups; especially $C_1$-$C_8$alkyl, or phenyl, which can be substituted by one, or more $C_1$-$C_8$alkyl, or $C_1$-$C_8$alkoxy groups.

In an especially preferred embodiment of the present invention A¹ stands for a group of formula

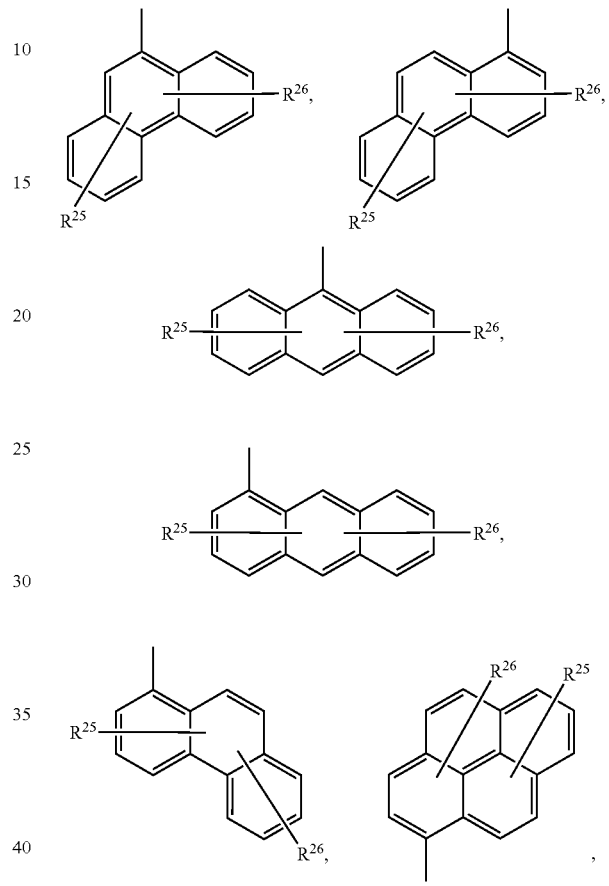

In said embodiment A² is not particularly limited, except that it is different from A¹ and is preferably

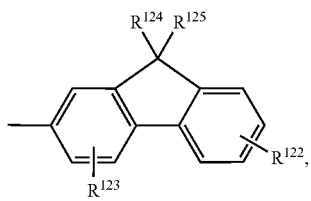

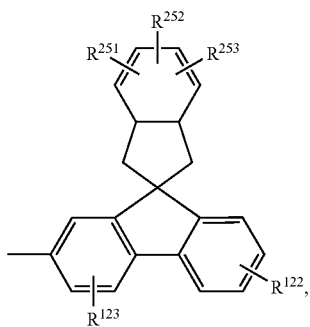
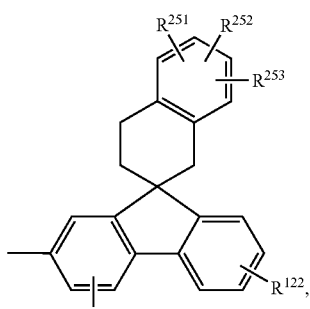
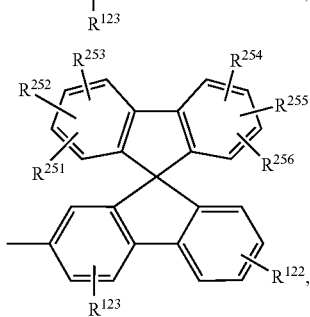
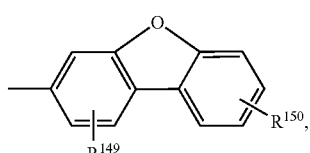
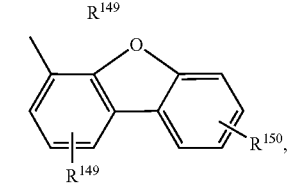
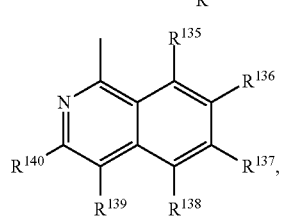
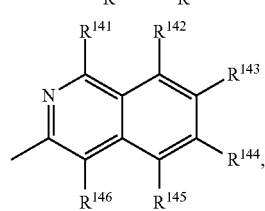

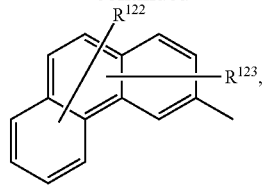
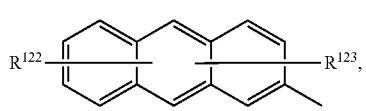
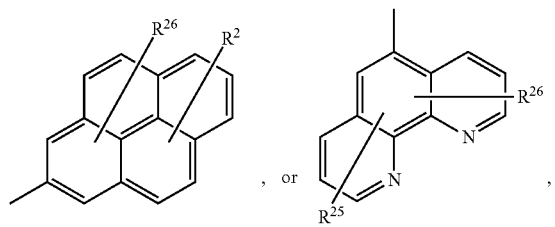

wherein $R^{251}$, $R^{252}$, $R^{253}$, $R^{254}$, $R^{255}$ and $R^{256}$ are independently of each other $C_1$-$C_8$-alkyl, $C_1$-$C_8$-alkoxy, halogen and cyano, in particular hydrogen.

$R^1$ and $R^2$ independently from each other stand, preferably, for $C_1$-$C_8$alkyl, $C_5$-$C_{12}$-cycloalkyl, which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, or —$CR^3R^4$—$(CH_2)_m$-$A^3$, wherein $R^3$ and $R^4$ stand for hydrogen, or $C_1$-$C_4$alkyl, $A^3$ stands for phenyl or 1- or 2-naphthyl, which can be substituted one to three times with $C_1$-$C_8$alkyl and/or $C_1$-$C_8$alkoxy, and m stands for 0 or 1, especially allyl, $C_1$-$C_8$alkyl, such as methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl, tri($C_1$-$C_8$alkyl)silyl, such as trimethylsilyl, —$CH_2$-$A^{3'}$, —$CHCH_3$-$A^3$ or —$CH_2$—$CH_2$-$A^3$, wherein $A^3$ stands for phenyl, which can be substituted one, two, or three times with $C_1$-$C_8$alkyl.

Most preferred $R^1$ and $R^2$ are the same and stand for $C_1$-$C_8$alkyl, such as methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl.

If $A^1$ stands for

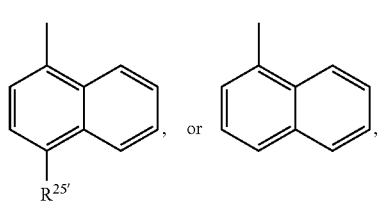

a group

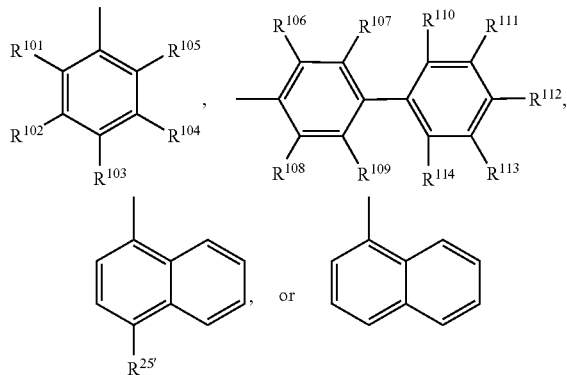

is less preferred for $A^2$.

$A^1$ stands preferably for

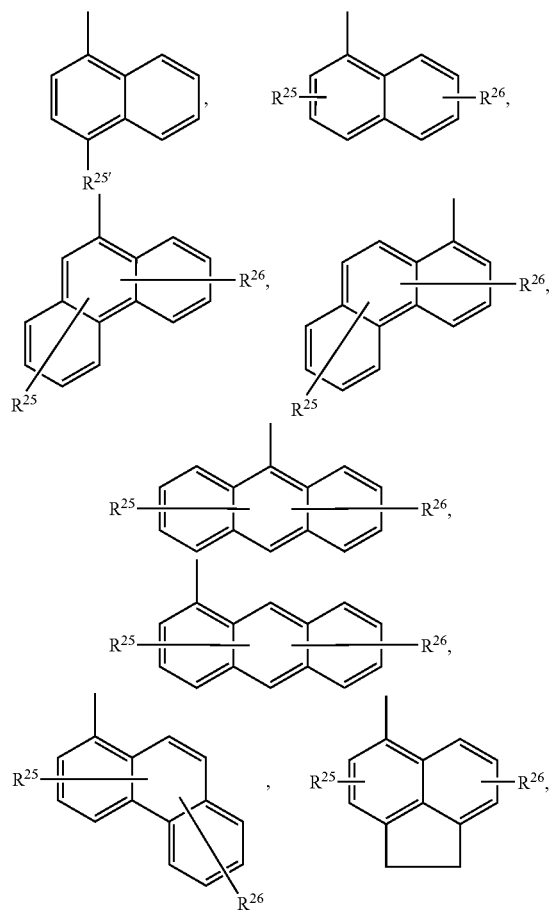

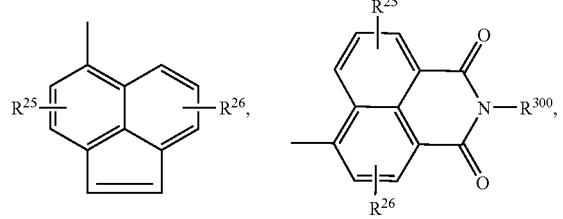

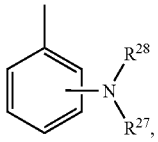
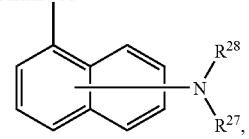

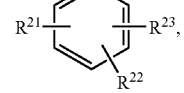

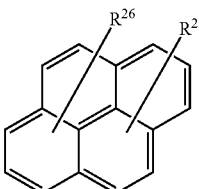
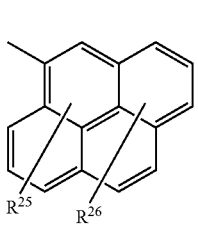

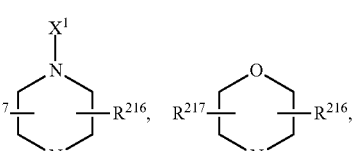

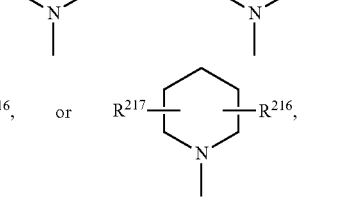

which can be condensed by one or two optionally substituted phenyl groups, such as

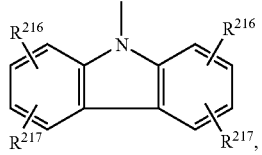

wherein $R^{216}$ and $R^{217}$ independently from each other stands for hydrogen, $C_1$-$C_8$-alkyl, $C_1$-$C_8$-alkoxy, or phenyl, $R^{29'}$ and $R^{30'}$ independently from each other stands for hydrogen, $C_1$-$C_8$-alkyl or $C_1$-$C_8$-alkoxy, and
$X^1$ stands for hydrogen, or $C_1$-$C_8$-alkyl; and $A^2$ stands for $A^1$, with the proviso that $A^2$ and $A^1$ have different meanings within the same molecule, or
$A^2$ stands for

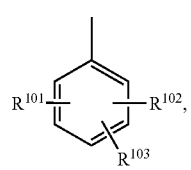
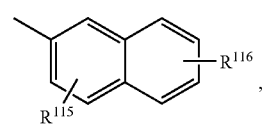

-continued

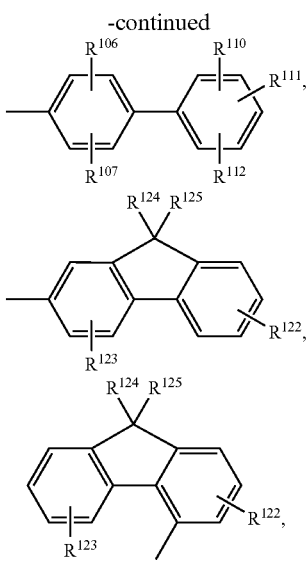

especially

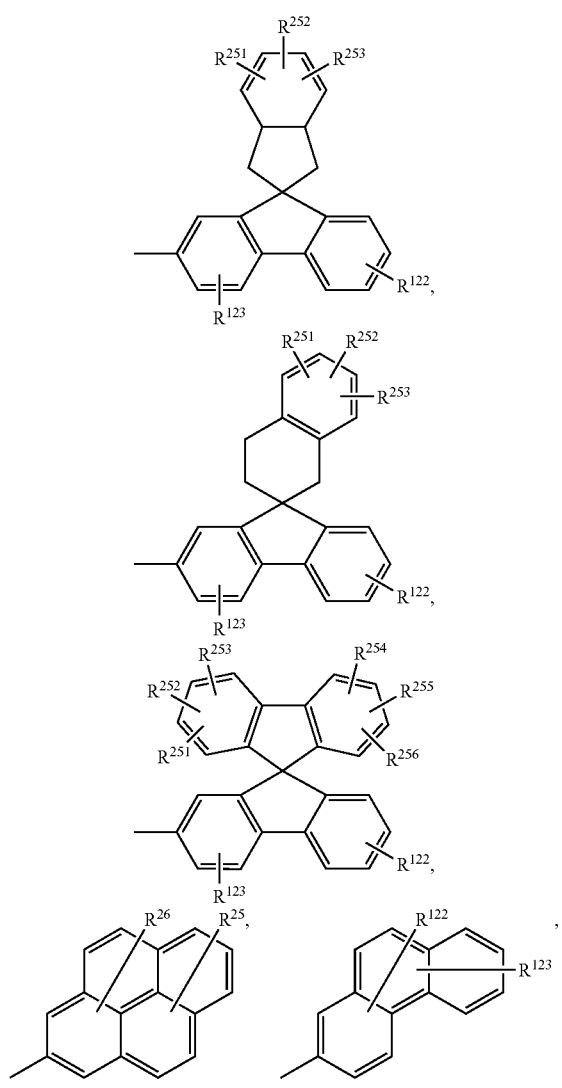

-continued

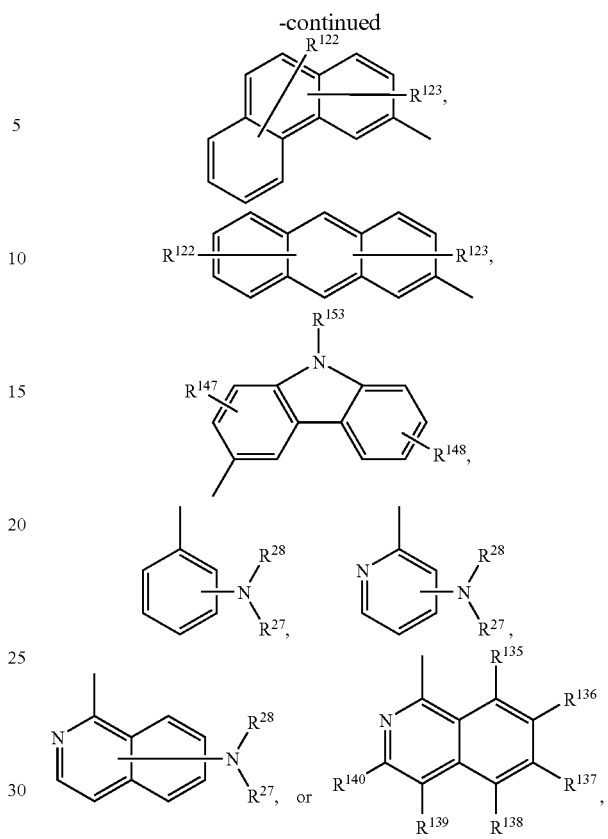

wherein
$R^{27}$ and $R^{28}$ are as defined above,
$R^{25}$ and $R^{26}$ are as defined above and are preferably independently of each other hydrogen, $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group, a silyl group or a siloxanyl group, and
$R^{101}$, $R^{102}$, $R^{103}$, $R^{106}$, $R^{107}$, $R^{110}$, $R^{111}$, $R^{112}$, $R^{115}$, $R^{116}$, $R^{122}$, $R^{123}$, $R^{135}$, $R^{136}$, $R^{137}$, $R^{138}$, $R^{139}$, $R^{140}$, $R^{147}$ and $R^{148}$
are independently of each other hydrogen, $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group, a silyl group or a siloxanyl group;
$R^{124}$ and $R^{125}$ may be the same or different and are selected from $C_1$-$C_{18}$alkyl; or $R^{124}$ and $R^{125}$ together form a ring, especially a five-, six- or seven-membered ring, which can optionally be substituted by $C_1$-$C_8$alkyl, or which can optionally be condensed one or two times by phenyl which can be substituted one to three times with $C_1$-$C_8$-alkyl, $C_1$-$C_8$-alkoxy, halogen and cyano;
$R^{153}$ is a $C_1$-$C_{25}$alkyl group, and
$R^{251}$, $R^{252}$, $R^{253}$, $R^{254}$, $R^{255}$ and $R^{256}$ are independently of each other $C_1$-$C_8$-alkyl, $C_1$-$C_8$-alkoxy, halogen and cyano, in particular hydrogen.

If $R^{124}$ and $R^{125}$ together form a ring, they form preferably a cyclopentane, or cyclohexane ring, which can optionally be substituted by one to three times with $C_1$-$C_8$alkyl, or which can optionally be condensed one or two times by phenyl which can be substituted one to three times with $C_1$-$C_8$-alkyl, $C_1$-$C_8$-alkoxy, halogen and cyano. Examples of condensed cyclopentyl and cyclohexyl groups are:

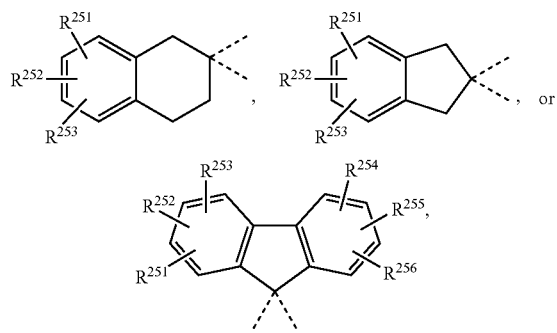

wherein $R^{251}$, $R^{252}$, $R^{253}$, $R^{254}$, $R^{255}$ and $R^{256}$ are independently of each other $C_1$-$C_8$-alkyl, $C_1$-$C_8$-alkoxy, halogen and cyano, in particular hydrogen.

In a preferred embodiment $A^2$ stands for

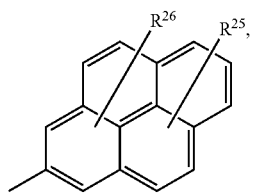

wherein $R^{25}$ and $R^{26}$ are independently of each other hydrogen, $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group, a silyl group or a siloxanyl group.

In a particularly preferred embodiment $A^1$ stands for

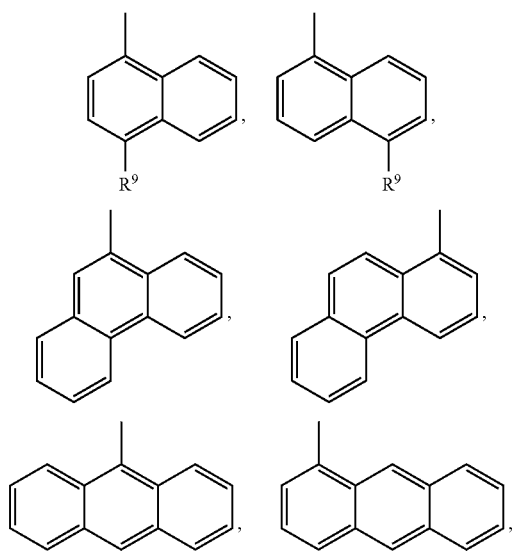

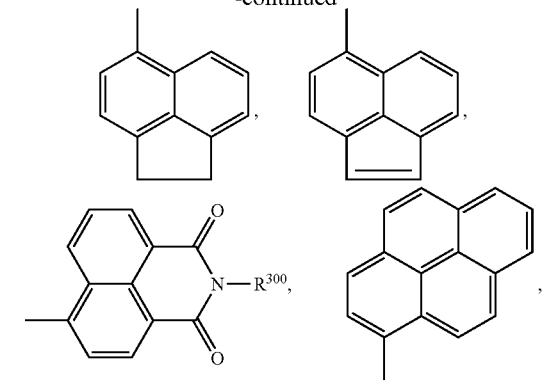

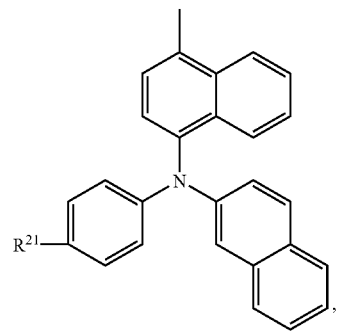

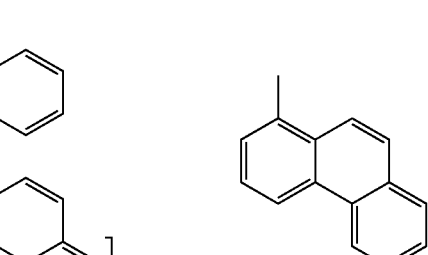

wherein $R^{300}$ is $C_1$-$C_8$alkyl, phenyl, which can be substituted by one, or more $C_1$-$C_8$alkyl, or $C_1$-$C_8$alkoxy groups, $R^9$ is hydrogen, phenyl, or 1-naphthyl, which can be substituted by one, or more $C_1$-$C_8$alkyl, or $C_1$-$C_8$alkoxy groups; $C_1$-$C_8$alkyl, or $C_1$-$C_8$alkoxy, and
$R^{21}$ is hydrogen, $C_1$-$C_8$alkyl or $C_1$-$C_8$alkoxy.

In another preferred embodiment the present invention relates to diketopyrrolopyrroles of formula I, wherein
$A^1$ is a group of formula

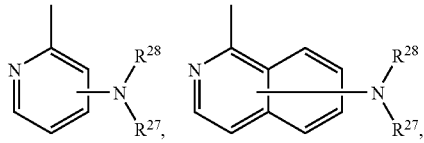

$A^2$ is $A^1$ or is a group of formula

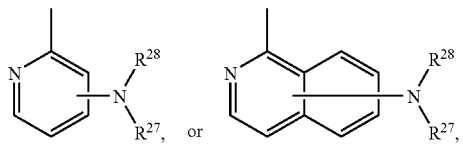

wherein $R^{27}$ and $R^{28}$ are as defined above.

In another preferred embodiment the present invention relates to diketopyrrolopyrroles of formula I, wherein
$A^1$ is a group of formula

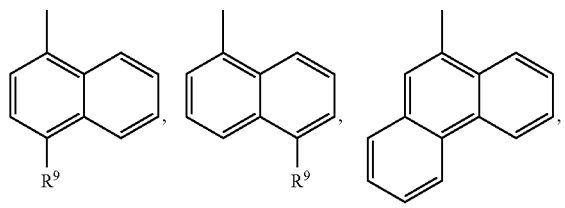

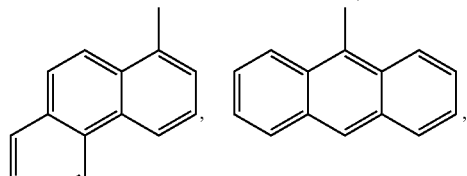

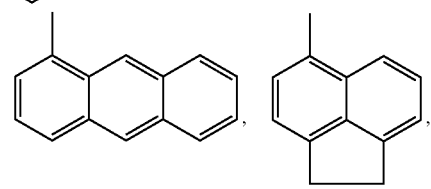

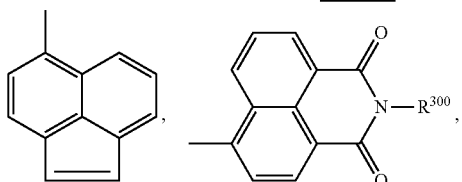

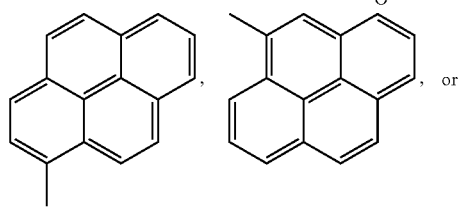

-continued

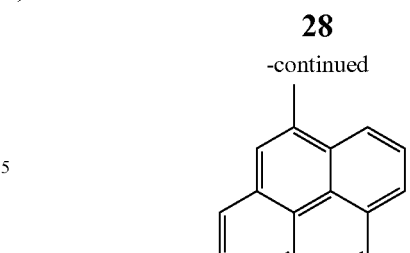

and $A^2$ is a group of formula

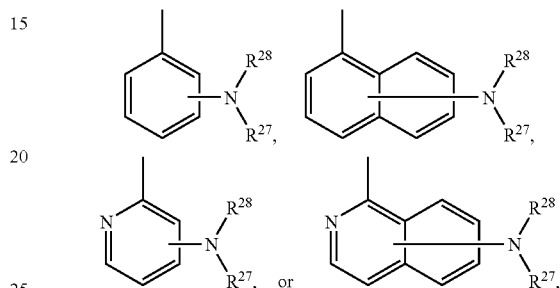

wherein $R^{300}$, $R^9$, $R^{27}$ and $R^{28}$ are as defined above.

In said embodiments $R^{27}$ and $R^{28}$ are preferably independently of each other

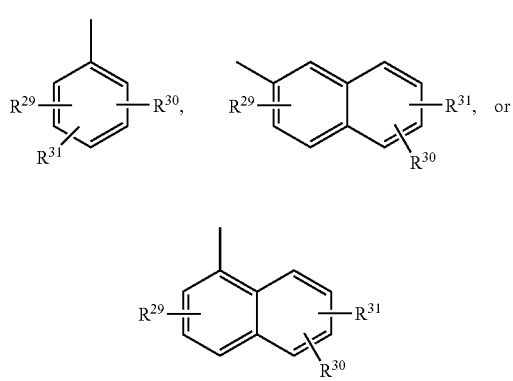

, wherein $R^{29}$, $R^{30}$ and $R^{31}$ are independently of each other hydrogen, $C_1$-$C_8$alkyl, or $C_1$-$C_8$alkoxy.

In host/guest compositions for EL devices diketopyrrolopyrroles of formula I comprising a group —$NR^{27}R^{28}$ are usually used as guest, wherein diketopyrrolopyrroles of formula I which do not comprise a group —$NR^{27}R^{28}$ are usually used as host.

$R^1$ and $R^2$ are preferably independently of each other allyl, $C_1$-$C_8$alkyl, such as methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl, tri($C_1$-$C_8$alkyl)silyl, such as trimethylsilyl, phenyl or 1- or 2-naphthyl which can be substituted one to three times with $C_1$-$C_8$alkyl and/or $C_1$-$C_8$alkoxy, —$CH_2$-$A^3$, —$CHCH_3$-$A^3$ or —$CH_2$—$CH_2$-$A^3$, wherein $A^3$ stands for phenyl, which can be substituted one or two times with $C_1$-$C_8$alkyl. The following diketopyrrolopyrroles are preferred:

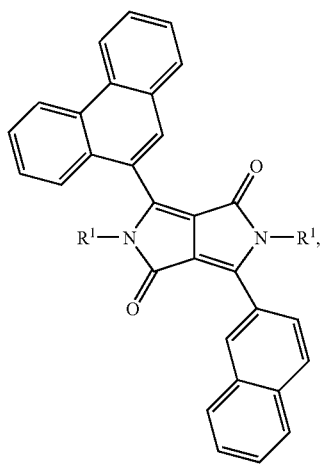
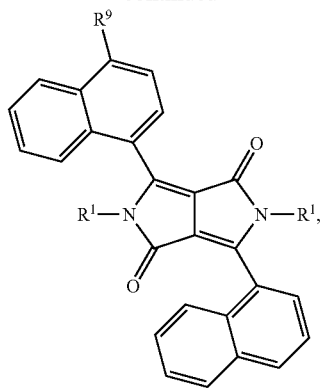
$R^9$ is $CH_3$, or $OCH_3$
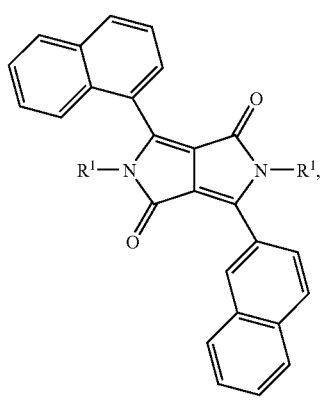
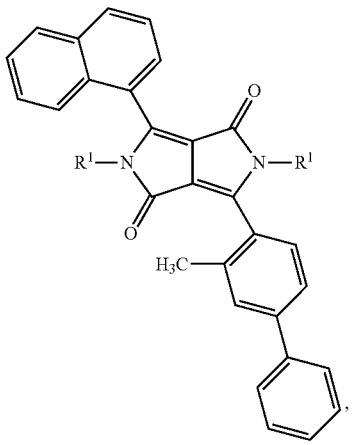
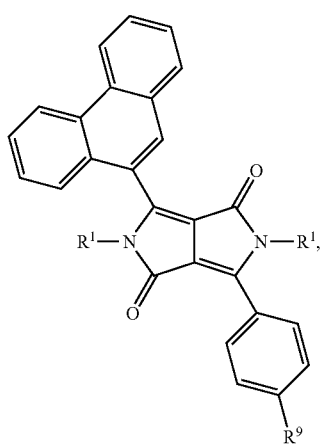
$R^9$ is H, or $CH_3$
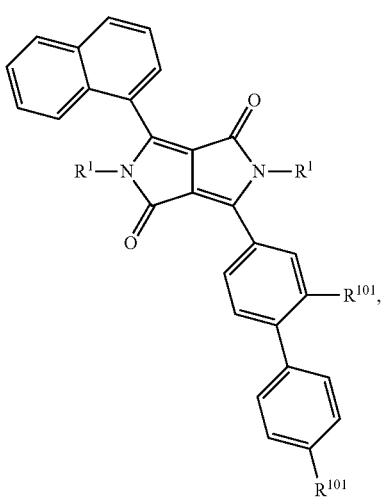
$R^{101}$ is H, or $CH_3$

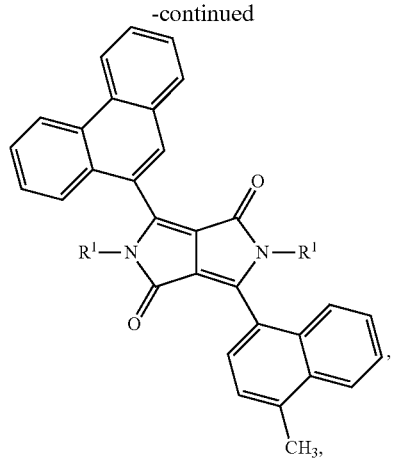
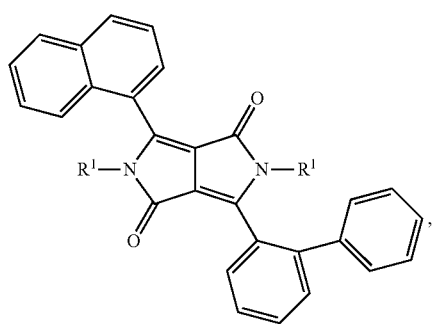
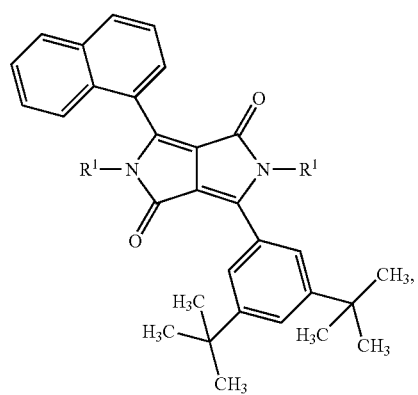
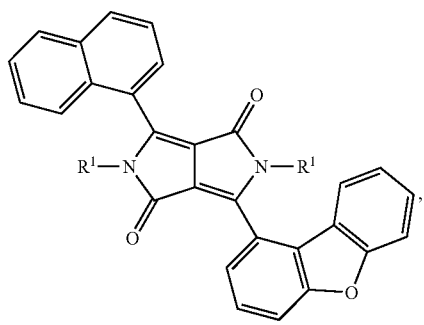
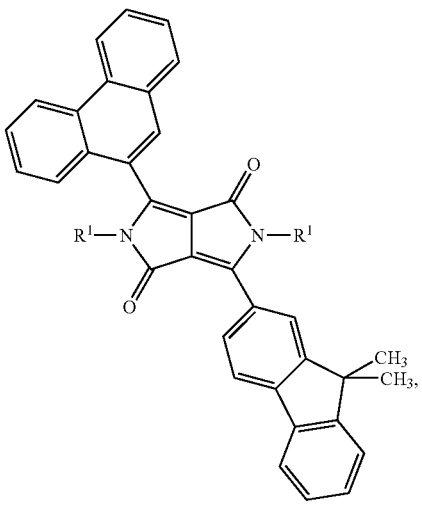
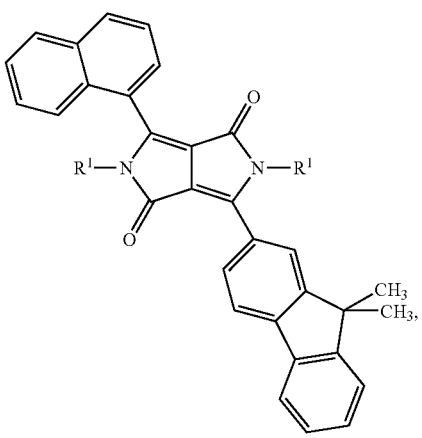
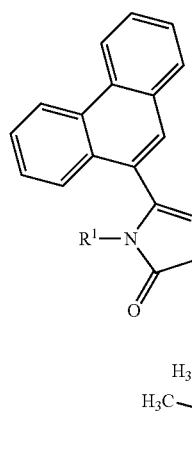

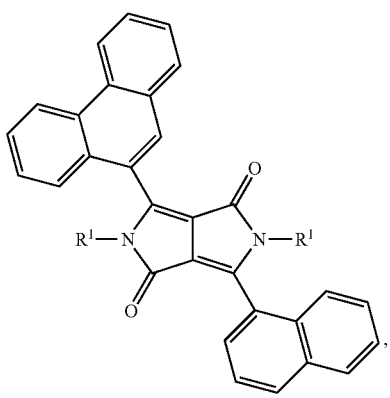
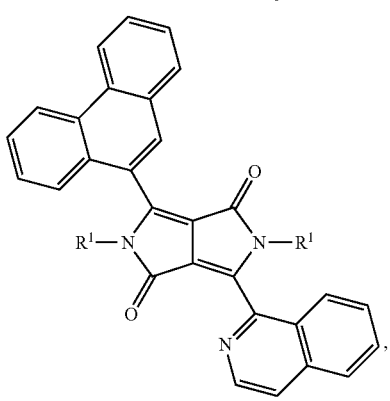
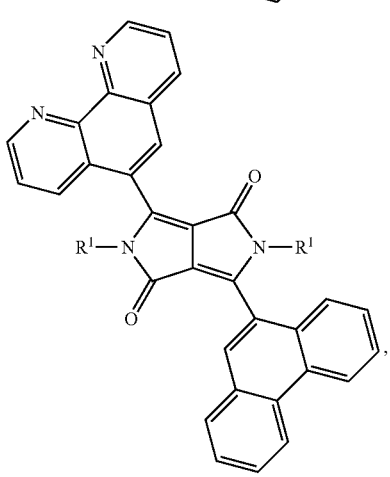
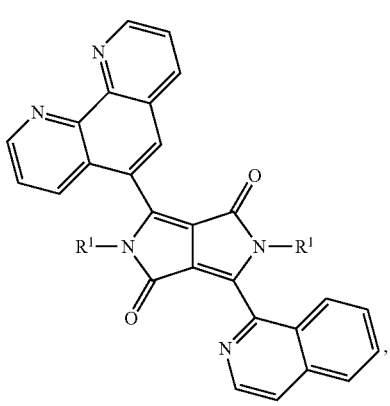
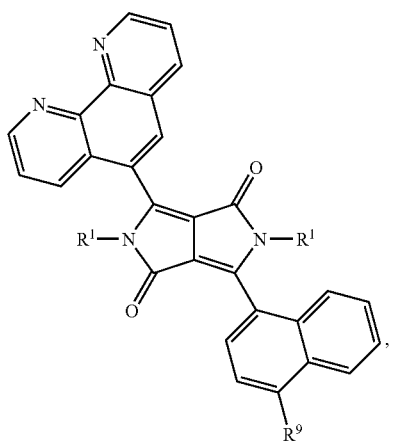
R⁹ is H, or CH₃
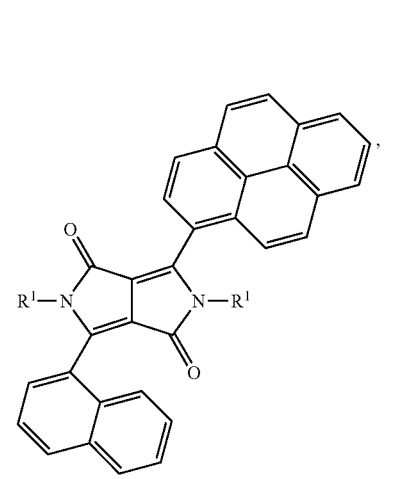
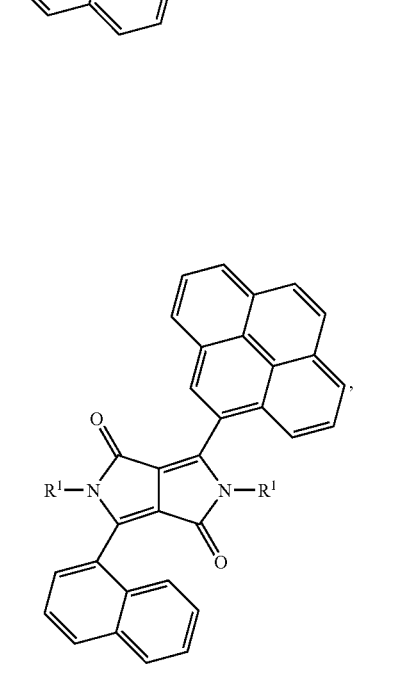

35
-continued
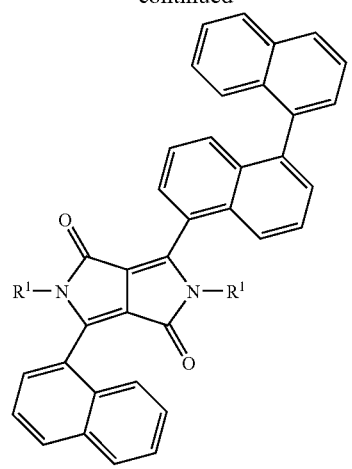
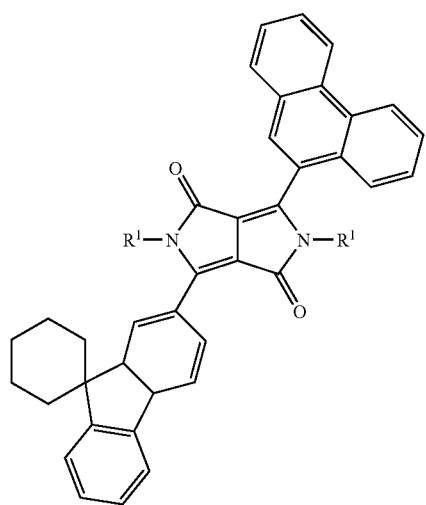
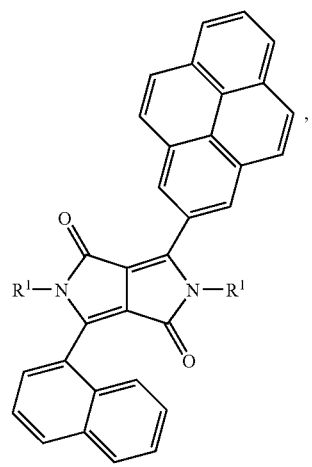
36
-continued
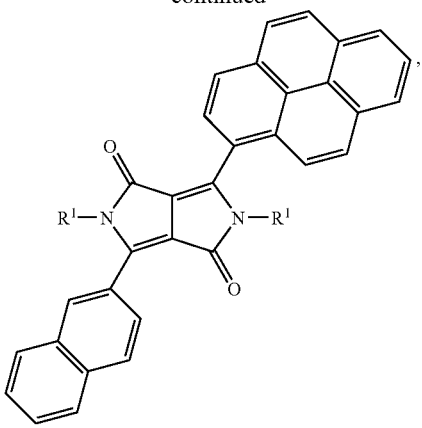
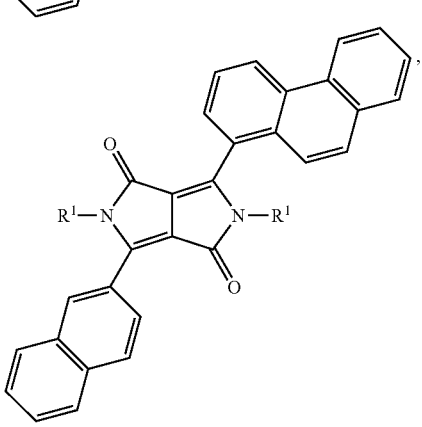
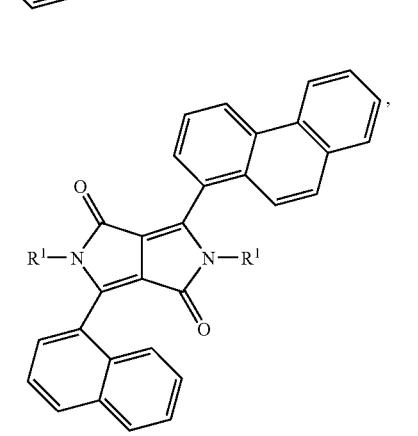

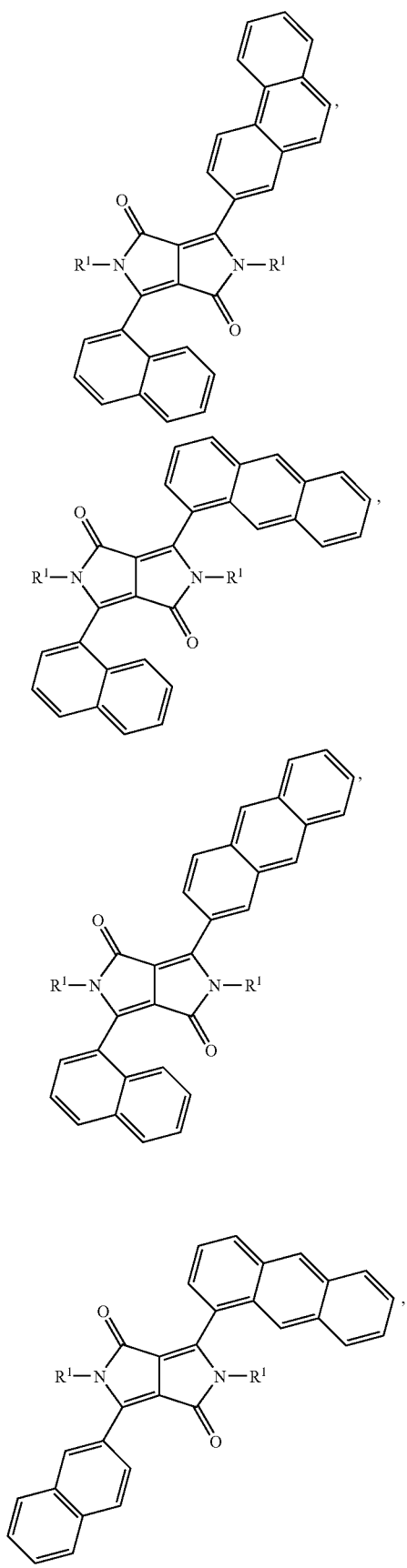
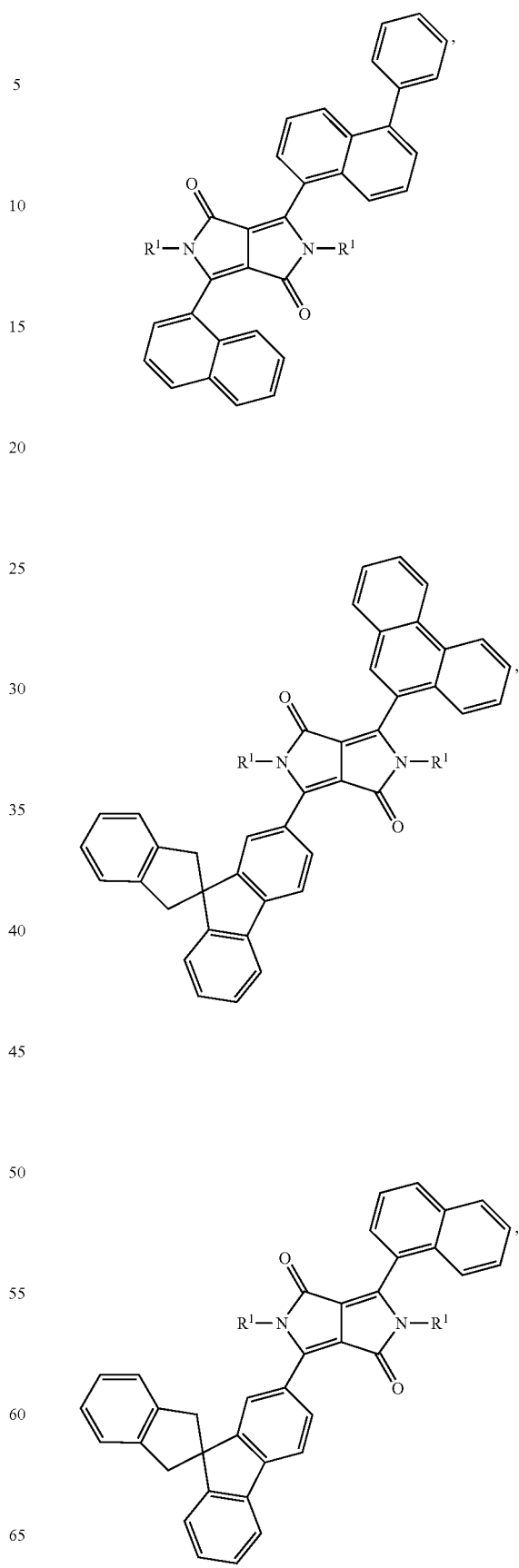

39
-continued
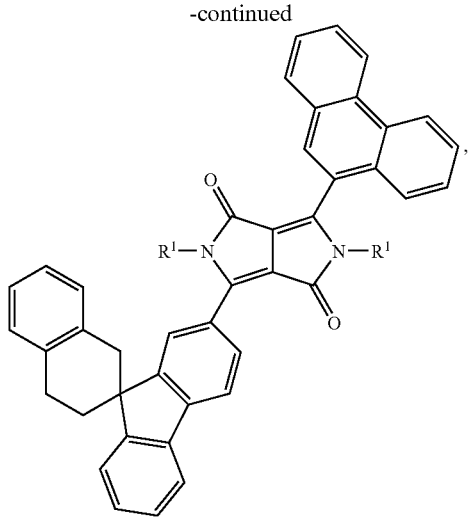
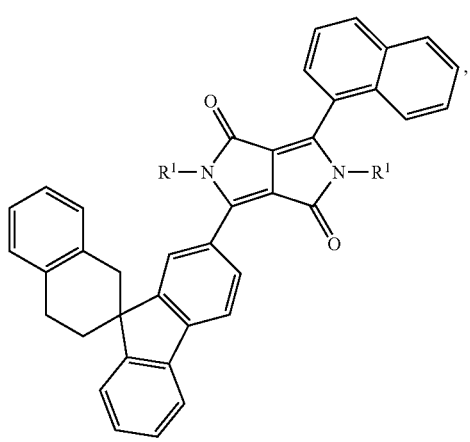
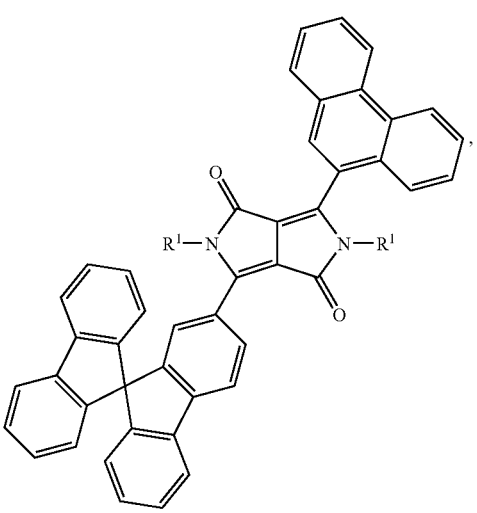
40
-continued
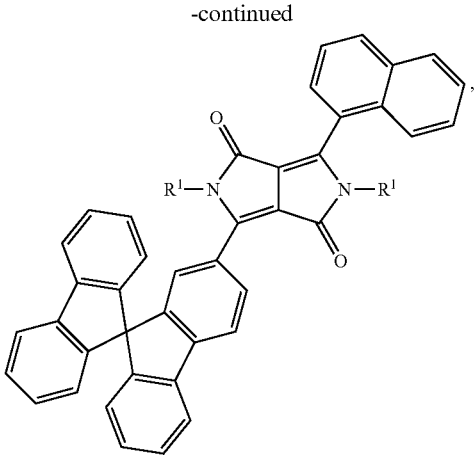
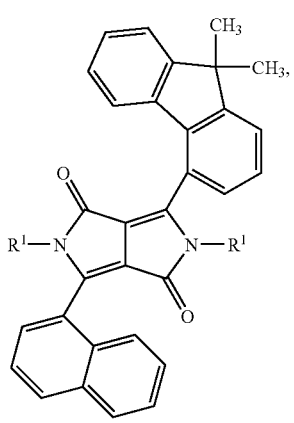
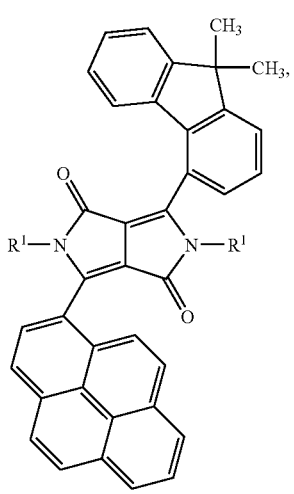

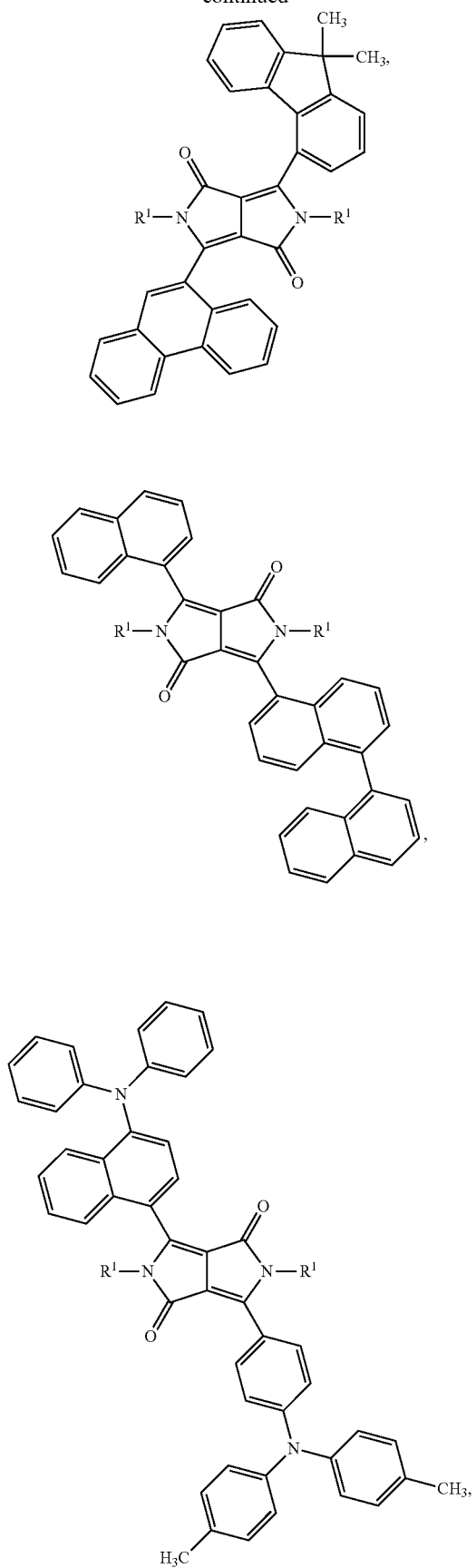

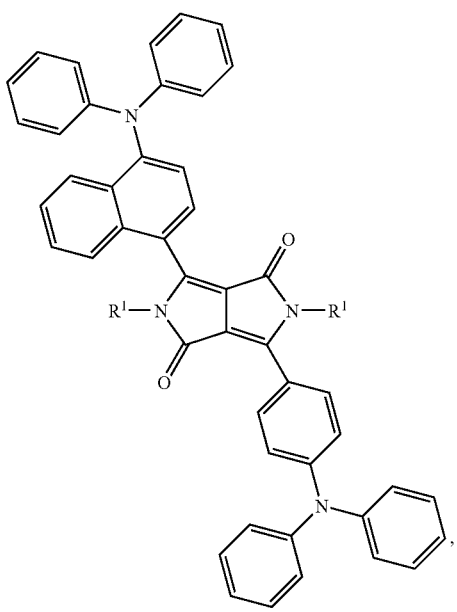

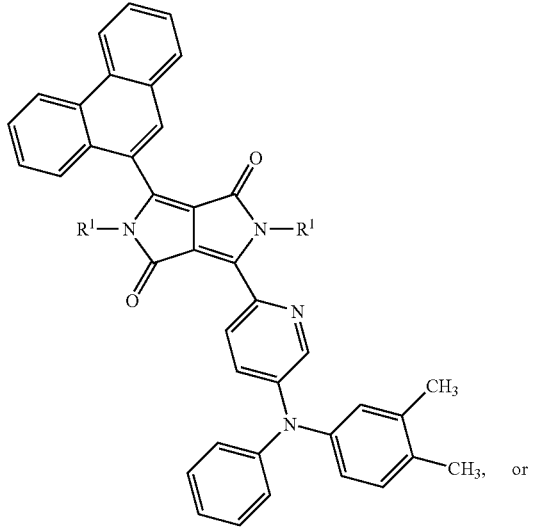

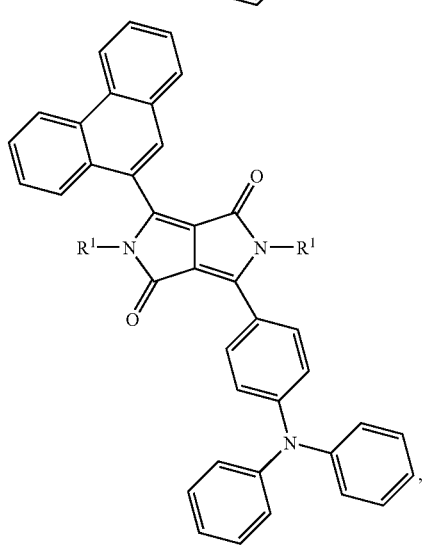

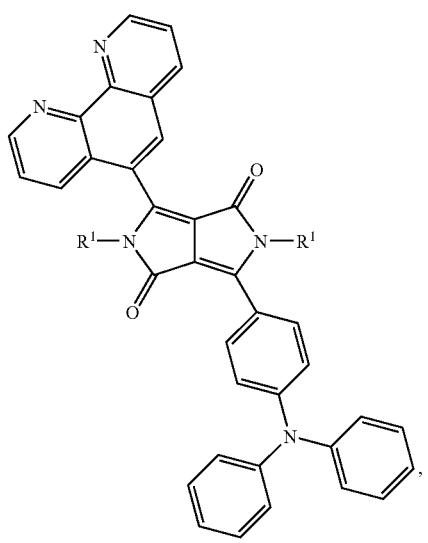

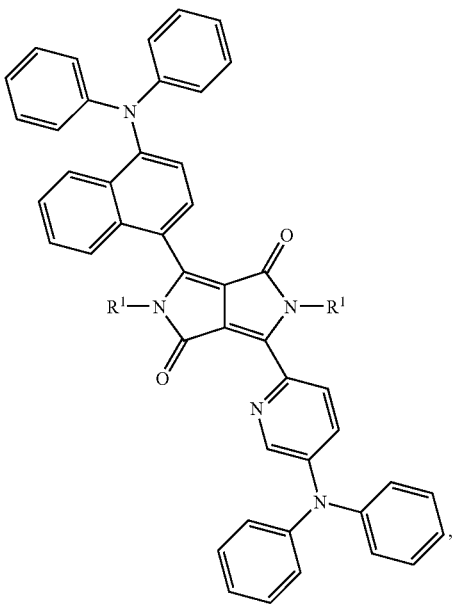

wherein $R^1$ is allyl, $C_1$-$C_8$alkyl, such as methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl, tri($C_1$-$C_8$alkyl)silyl, such as trimethylsilyl, —$CH_2$-$A^3$, —$CHCH_3$-$A^3$ or —$CH_2$—$CH_2$-$A^3$, wherein $A^3$ stands for phenyl, which can be substituted one, two, or three times with $C_1$-$C_8$alkyl.

The following diketopyrrolopyrroles are especially preferred:
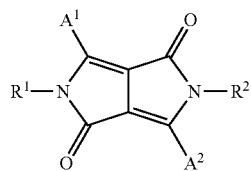
| Compound (Host) | A¹ | A² | R¹ = R² |
|---|---|---|---|
| A-1 | 9-phenanthryl | 2-naphthyl | —CH₃ |
| A-2 | 1-naphthyl | 2-naphthyl | —CH₃ |
| A-3 | 9-phenanthryl | phenyl | —CH₃ |
| A-4 | 1-naphthyl | 4-methyl-1-naphthyl | —CH₃ |
| A-5 | 1-naphthyl | 3-methyl-4-biphenylyl | —CH₃ |
| A-6 | 1-naphthyl | 4-biphenylyl | —CH₃ |
| A-7 | 9-phenanthryl | 3-(10,10-dimethyl-9,10-dihydroanthracen-2-yl) | —CH₃ |

-continued
| | | | |
|---|---|---|---|
| A-8 | 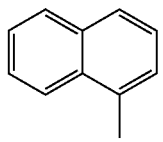 | 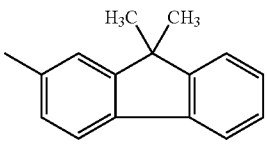 | —CH₃ |
| A-9 | 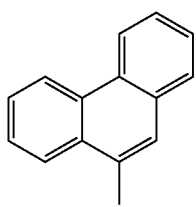 | 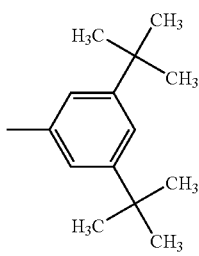 | —CH₃ |
| A-10 | 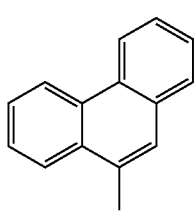 | 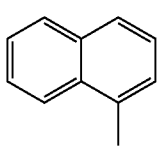 | —CH₃ |
| A-11 | 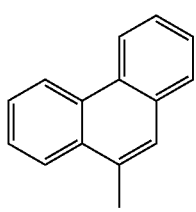 | 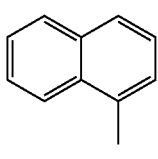 | —C₂H₅ |
| A-12 | 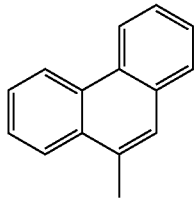 | 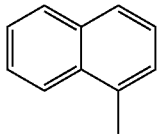 | -n-C₃H₇ |
| A-13 | 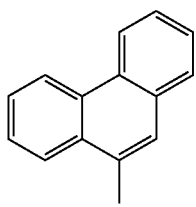 | 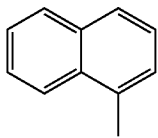 | -n-C₄H₉ |
| A-14 | 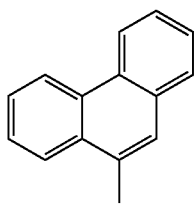 | 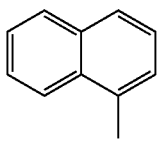 | -n-C₅H₁₁ |

-continued
| | | | |
|---|---|---|---|
| A-15 | 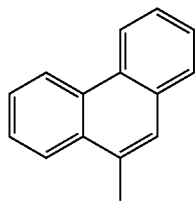 | 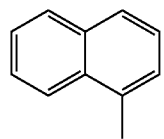 | -n-C$_6$H$_{13}$ |
| A-16 | 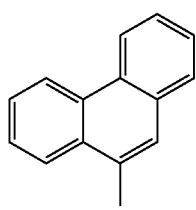 | 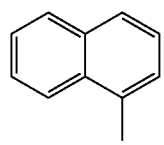 | 2-ethylhexyl |
| A-17 | 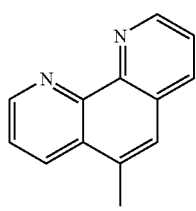 | 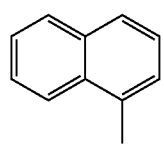 | —CH$_3$ |
| A-18 | 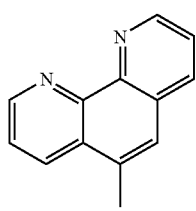 | 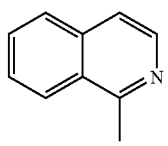 | —CH$_3$ |
| A-19 | 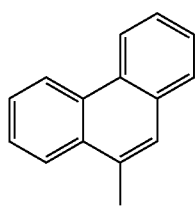 | 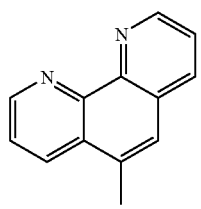 | —CH$_3$ |
| A-20 | 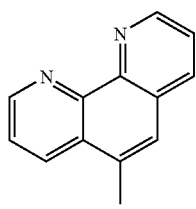 | 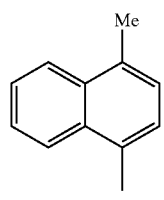 | —CH$_3$ |
| A-21 | 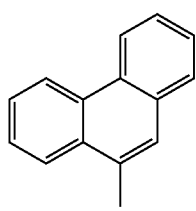 | 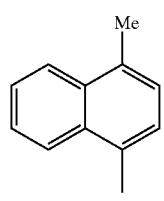 | —CH$_3$ |

| | | | |
|---|---|---|---|
| A-22 | 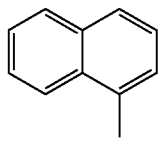 | 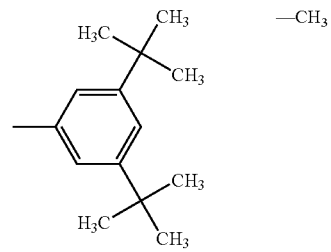 | —CH₃ |
| A-23 | 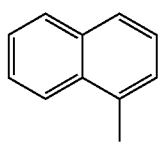 | 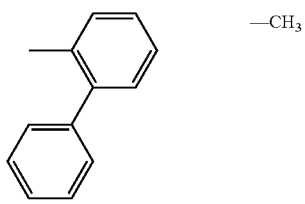 | —CH₃ |
| A-24 | 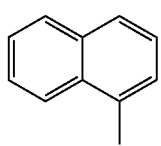 | 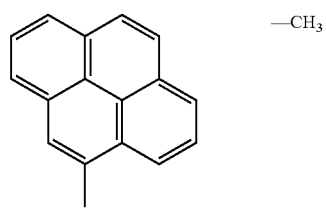 | —CH₃ |
| A-25 | 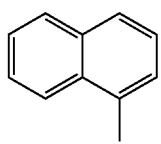 | 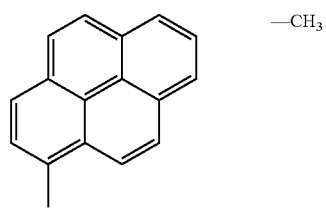 | —CH₃ |
| A-26 | 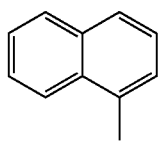 | 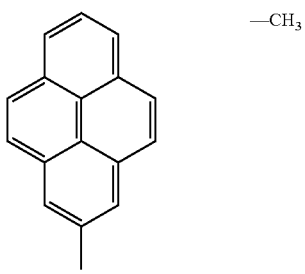 | —CH₃ |
| A-27 | 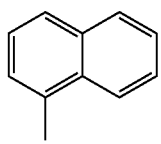 | 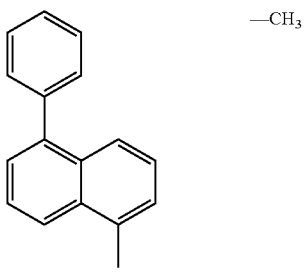 | —CH₃ |

-continued
| | | | |
|---|---|---|---|
| A-28 | 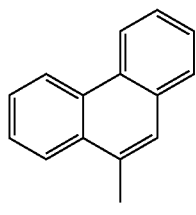 | 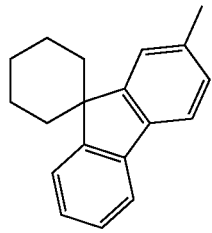 | —CH₃ |
| A-29 | 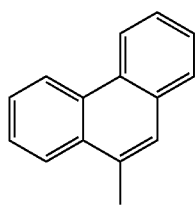 | 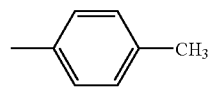 | —CH₃ |
| A-30 | 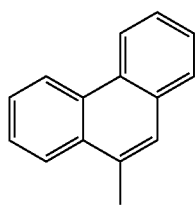 | 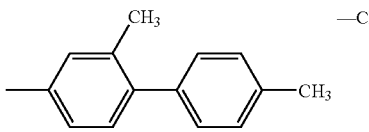 | —CH₃ |
| A-31 | 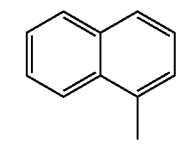 | 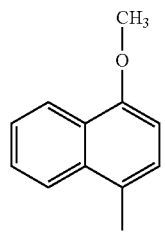 | —CH₃ |
| A-32 | 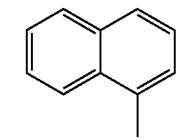 | 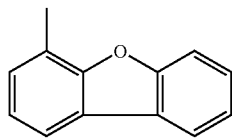 | —CH₃ |
| A-33 | 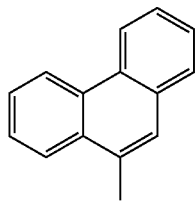 | 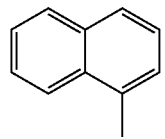 | 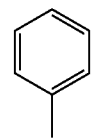 |
| A-34 | 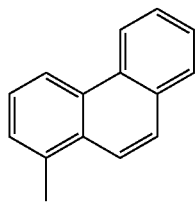 | 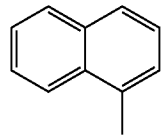 | 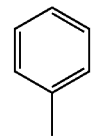 |

| | | | |
|---|---|---|---|
| A-35 | 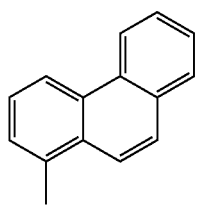 | 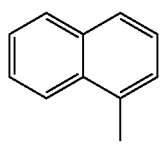 | $R^1 =$ —⟨phenyl⟩; $R^2 = CH_3$ |
| A-36 | 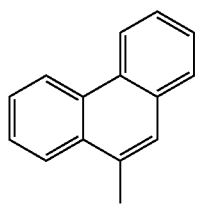 | 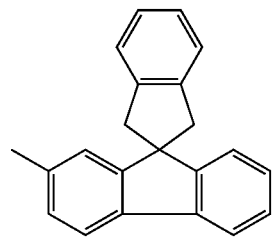 | —$CH_3$ |
| A-37 | 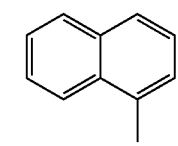 | 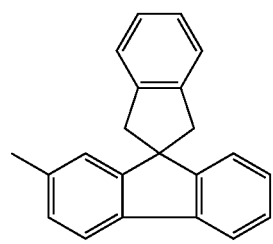 | —$CH_3$ |
| A-38 | 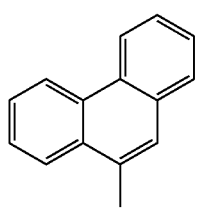 | 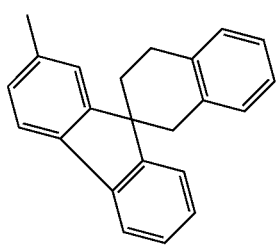 | —$CH_3$ |
| A-39 | 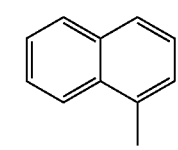 | 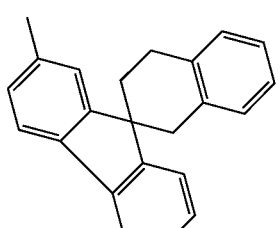 | —$CH_3$ |
| A-40 | 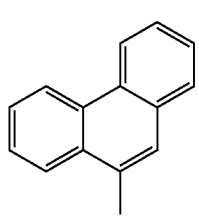 | 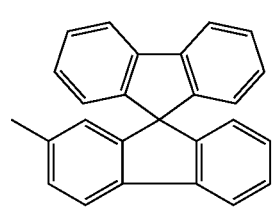 | —$CH_3$ |
| A-41 | 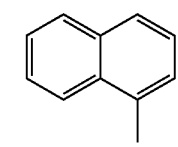 | 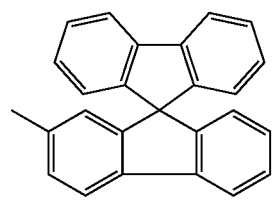 | —$CH_3$ |

| | | | |
|---|---|---|---|
| A-42 | (phenanthrene, substituted) | (isoquinoline) | —CH₃ |
| A-43 | (naphthyl) | (1,1'-binaphthyl) | —CH₃ |
| A-44 | (phenanthrene) | (naphthyl) | —CH₃ |
| A-45 | (phenanthrene) | (naphthyl) | —CH₃ |
| A-46 | (naphthyl) | (phenanthrene) | —CH₃ |
| A-47 | (naphthyl) | (phenanthrene) | —CH₃ |
| A-48 | (anthracene) | (naphthyl) | —CH₃ |
| A-49 | (naphthyl) | (anthracene) | —CH₃ |

-continued
| | | | |
|---|---|---|---|
| A-50 | 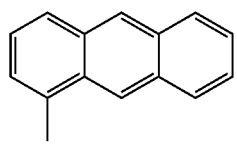 | 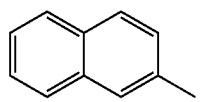 | —CH₃ |
| A-52 | 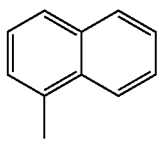 | 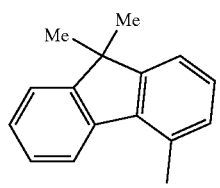 | —CH₃ |
| A-53 | 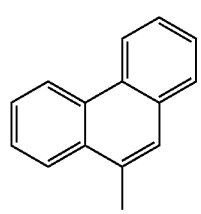 | 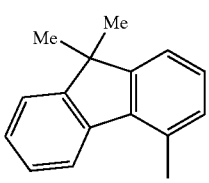 | —CH₃ |
| A-54 | 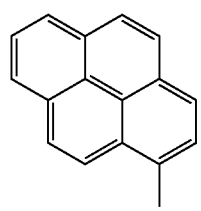 | 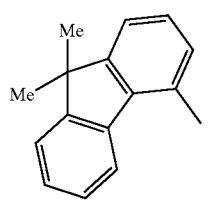 | —CH₃ |
| A-55 | 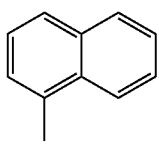 | 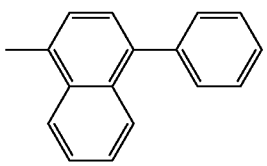 | —CH₃ |
| A-56 | 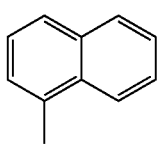 | 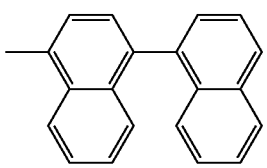 | —CH₃ |
| A-57 | 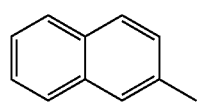 | 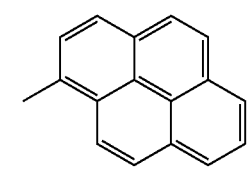 | —CH₃ |
| A-58 | 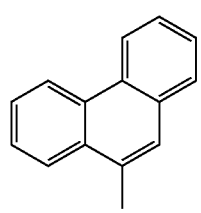 | 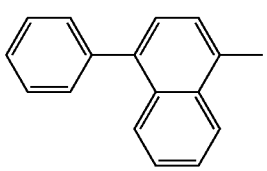 | —CH₃ |

-continued

| Cpd. (Guest) | A¹ | A² | R¹ = R² |
|---|---|---|---|
| B-1 | | | —CH₃ |
| B-2 | | | —CH₃ |
| B-3 | | | —CH₃ |
| B-4 | | | —CH₃ |
| B-5 | | | —CH₃ |

-continued
| B-6 | 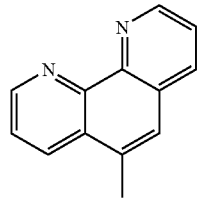 | 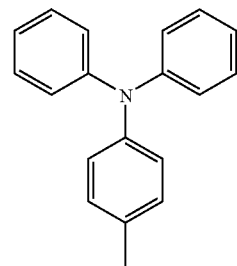 | —CH₃ |
| B-7 | 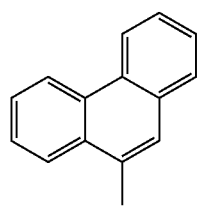 | 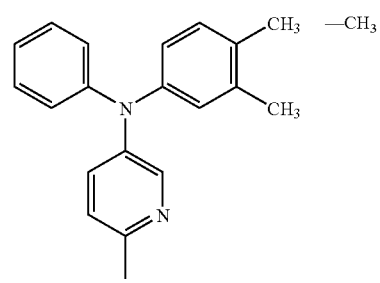 | —CH₃ |
| B-8 | 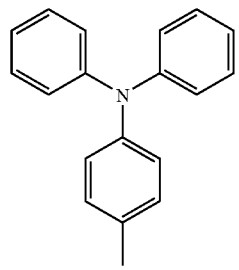 | 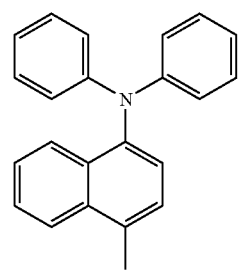 | -n-C₆H₁₂ |
| B-9 | 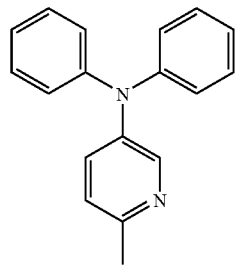 | 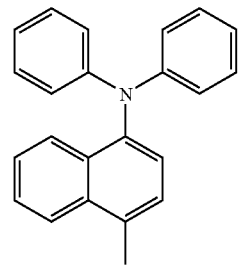 | —C₂H₅ |
| B-10 | 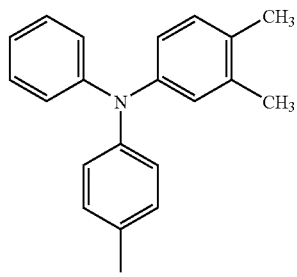 | 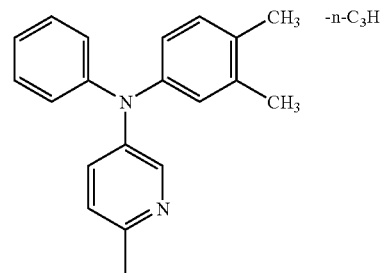 | -n-C₃H₇ |

B-11 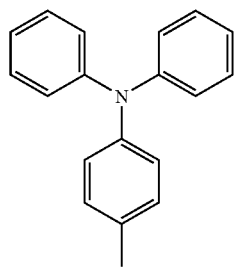 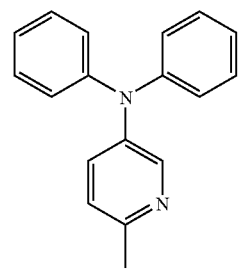 -n-C₄H₉

The inventive DPP compounds of formula I can be synthesized according to or in analogy to methods well known in the art, such as described, for example, in U.S. Pat. No. 4,579,949, EP-A 353,184, EP-A-133,156, EP-A-1,087,005, EP-A-1,087,006, WO03/002672, WO03/022848, WO03/064558, WO04/090046, WO05/005571 and WO05/005430.

Compounds of formula I are, for example, available by treating in a first step the DPP derivative of formula

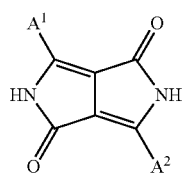
(X)

with a base, then, in a second step, treating the reaction mixture obtained in the first step with a usual alkylating agent or two usual alkylating agents, wherein in the first step the base is a hydride, such as sodium hydride, lithium hydride, or potassium hydride, an alkali metal alkoxide, such as sodium or potassium tert.-butoxide, sodium tert.-amylate, or a carbonate, such as sodium or potassium carbonate and the alkylating agent halogen compound of the formula $(R^1)_{1\ or\ 2}X^{10}$ and/or $(R^2)_{1\ or\ 2}X^{10}$, wherein $X^{10}$ is halogen such as chlorine, bromine or iodine, preferably chlorine, bromine or iodine, particularly preferred $R^1X^{10}$ and $R^2X^{10}$, wherein $X^{10}$ is bromine or iodine (for details see EP-A-1,087,005).

Compounds of formula

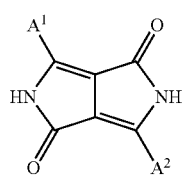
(X)

can be prepared by a process described in WO05/005430, comprising reacting a compound of formula (XI) with a nitrile $A^2$-CN,

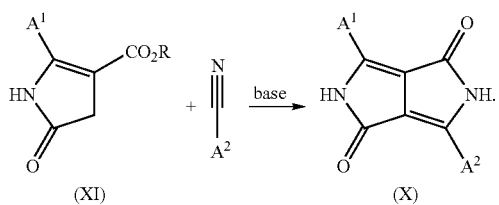

wherein $A^1$ and $A^2$ have the meanings as given above and R is $C_1$-$C_{18}$alkyl, in particular $C_1$-$C_4$alkyl, aryl, in particular phenyl, or aralkyl, in particular benzyl, which can be substituted one to three times with $C_1$-$C_8$alkyl, $C_1$-$C_8$alkoxy, or halogen.

In a further embodiment the present invention relates to compounds of formula

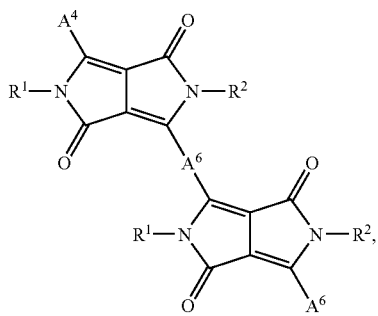
(III)

wherein $R^1$ and $R^2$ are as defined above, $A^4$ and $A^5$ independently of each other have the meaning of $A^2$, and $A^6$ is cycloalkyl, arylene, or heteroarylene, which are optionally substituted one to three times with $C_1$-$C_8$-alkyl, or $C_1$-$C_8$-alkoxy.

$A^4$ and $A^5$ can be different or can be the same and are a group of formula II, or have the meaning of $A^2$. The following groups are most preferred for $A^4$ and $A^5$:

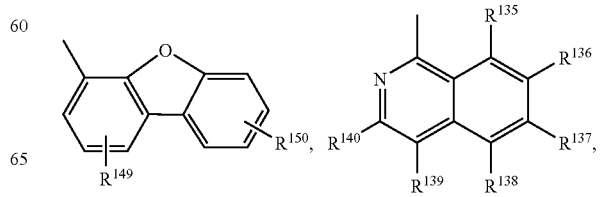

-continued
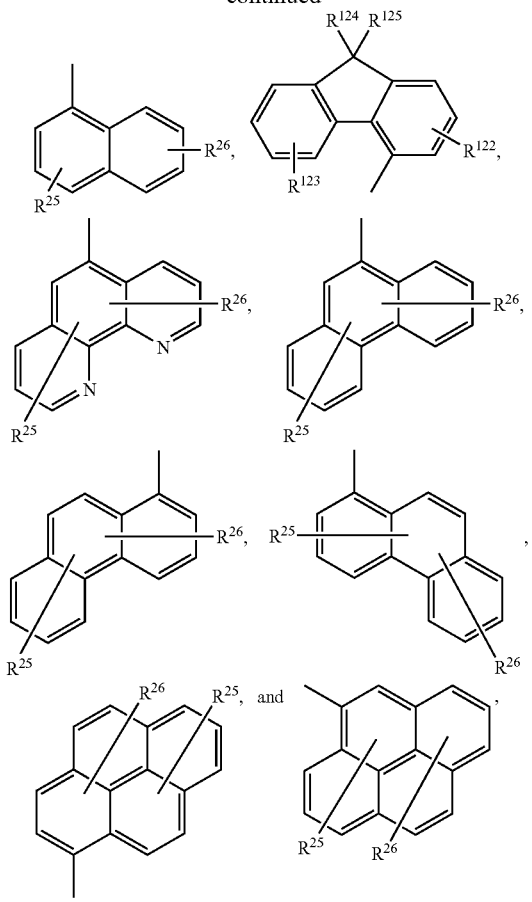
wherein $R^{25}$, $R^{26}$, $R^{122}$ to $R^{125}$, $R^{135}$ to $R^{140}$, $R^{149}$, and $R^{150}$ are as defined above.
$R^1$ and $R^2$ can be different, but have preferably the same meaning.
Examples of $A^6$ are
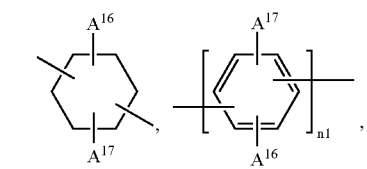
especially
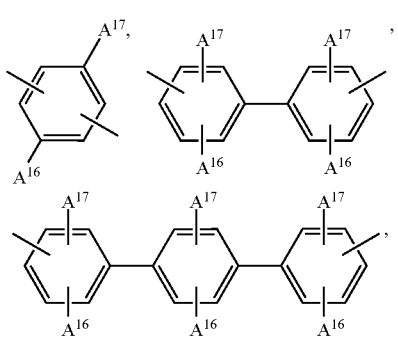
-continued
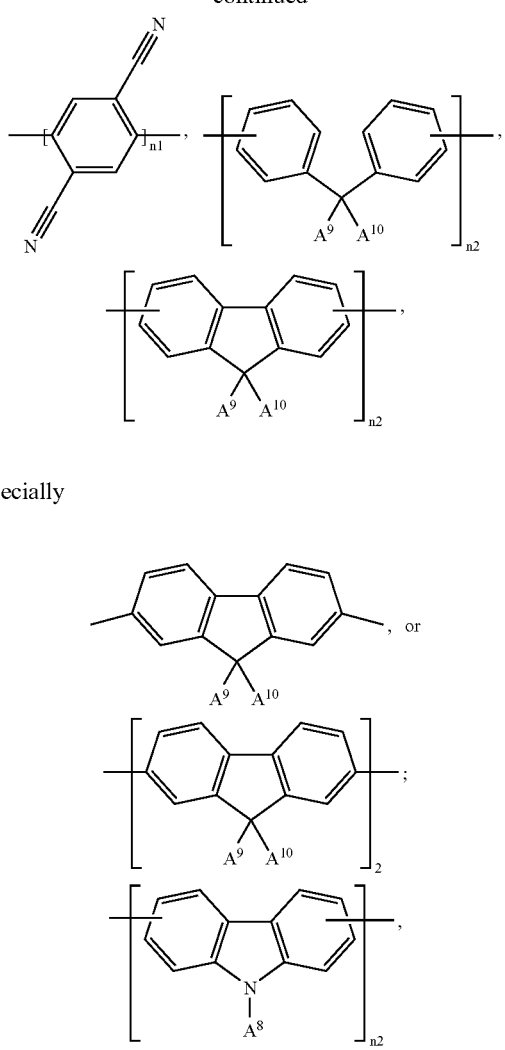
especially
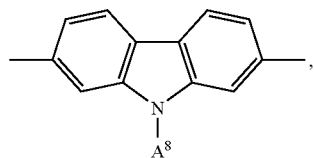
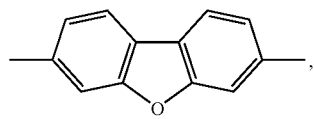
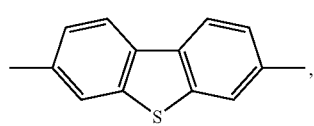

-continued
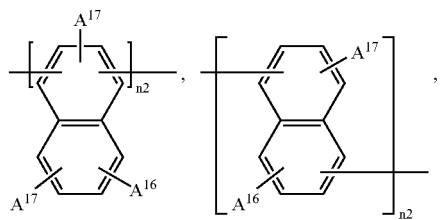
especially
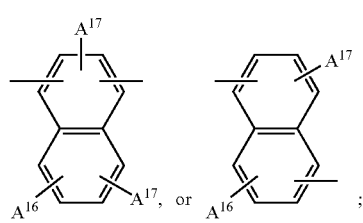
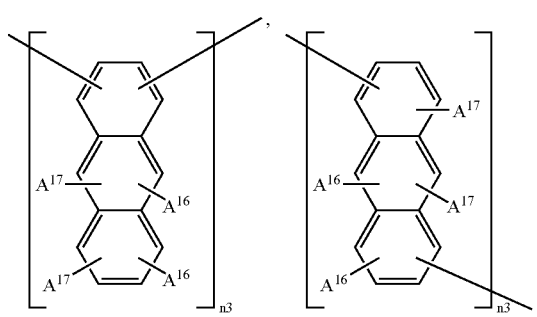
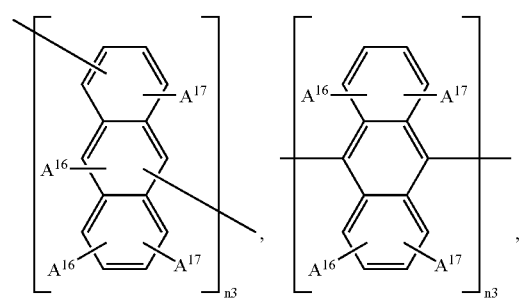
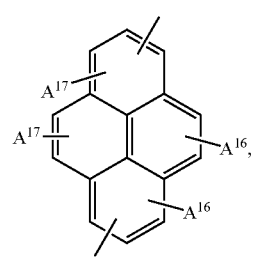
especially
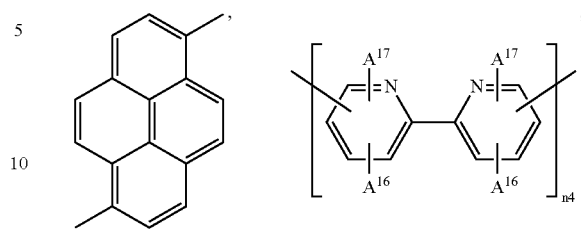
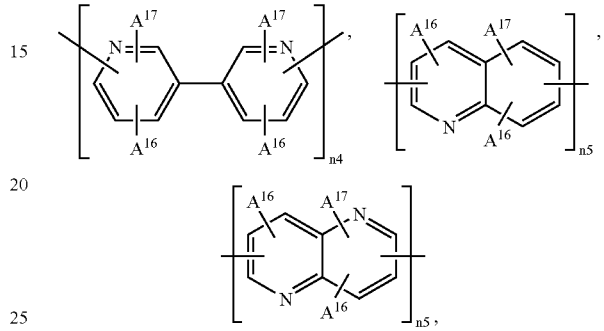
especially
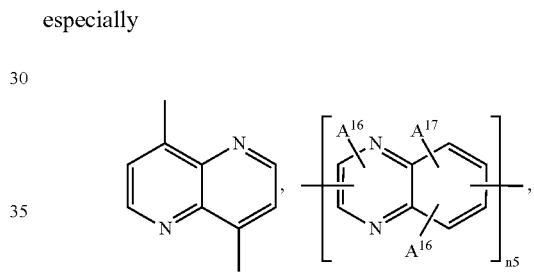
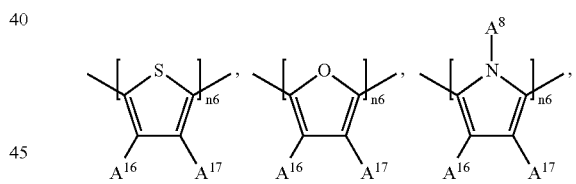
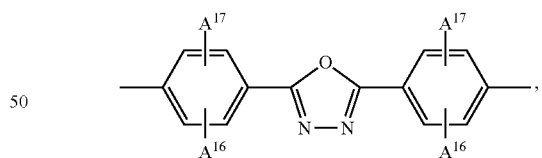
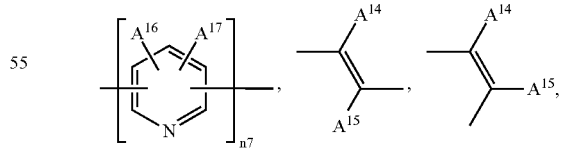
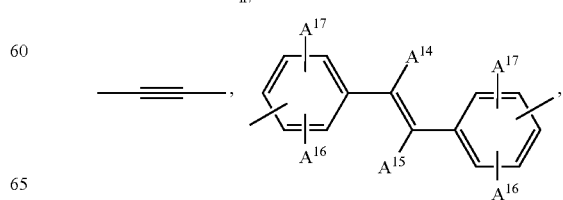

-continued

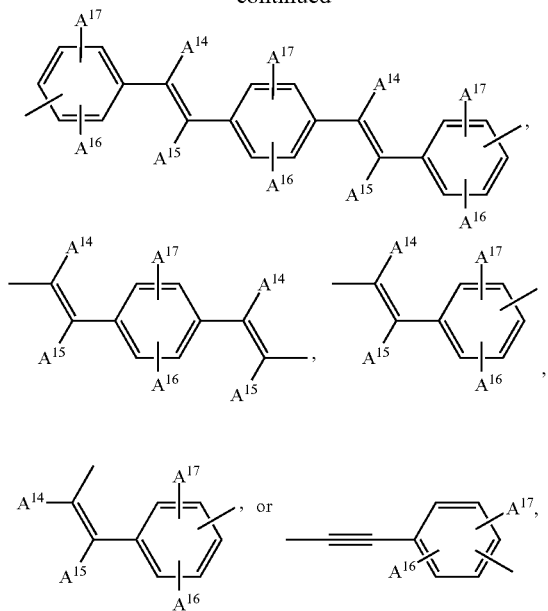

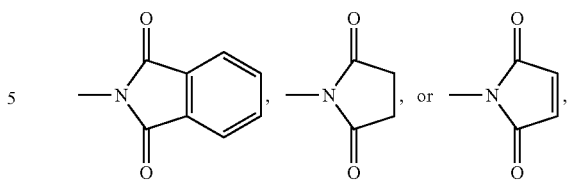

wherein
n1, n2, n3, n4, n5, n6 and n7 are integers of 1 to 10, in particular 1 to 3, $A^{16}$ and $A^{17}$ are independently of each other H, $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G', $C_2$-$C_{20}$heteroaryl, $C_2$-$C_{20}$heteroaryl which is substituted by G', $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', $C_7$-$C_{25}$aralkyl, or —CO-$A^{28}$, $A^8$ is $C_1$-$C_{18}$alkyl, $C_1$-$C_{18}$alkyl which is substituted by E' and/or interrupted by D', $C_6$-$C_{24}$ aryl, or $C_7$-$C_{25}$aralkyl, $A^9$ and $A^{10}$ are independently of each other $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G', $C_2$-$C_{20}$heteroaryl, $C_2$-$C_{20}$heteroaryl which is substituted by G', $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, or $A^9$ and $A^{10}$ form a ring, especially a five- or six-membered ring, which can optionally be substituted by one or more $C_1$-$C_{18}$ alkyl groups;

$A^{14}$ and $A^{15}$ are independently of each other H, $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G', $C_2$-$C_{20}$heteroaryl, or $C_2$-$C_{20}$heteroaryl which is substituted by G', D' is —CO—; —COO—; —S—; —SO—; —$SO_2$—; —O—; —$NA^{25}$-; —$SiA^{30}A^{31}$-; —$POA^{32}$-; —$CA^{23}$=$CA^{24}$-; or —C≡C—; and E' is —$OA^{29}$; —$SA^{29}$; —$NA^{25}A^{26}$; —$COA^{28}$; —$COOA^{27}$; —$CONA^{25}A^{26}$; —CN; —$OCOOA^{27}$; or halogen; G' is E', or $C_1$-$C_{18}$alkyl; wherein $A^{23}$, $A^{24}$, $A^{25}$ and $A^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $A^{25}$ and $A^{26}$ together form a five or six membered ring, in particular $A^{27}$ and $A^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl, or $C_1$-$C_{18}$alkyl which is interrupted by —O—, $A^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $A^{30}$ and $A^{31}$ are independently of each other $C_1$-$C_{18}$alkyl, $C_6$-$C_{18}$aryl, or $C_6$-$C_{18}$aryl, which is substituted by $C_1$-$C_{18}$alkyl, and $A^{32}$ is $C_1$-$C_{18}$alkyl, $C_6$-$C_{18}$aryl, or $C_6$-$C_{18}$aryl, which is substituted by $C_1$-$C_{18}$alkyl.

$A^6$ is preferably a group of formula

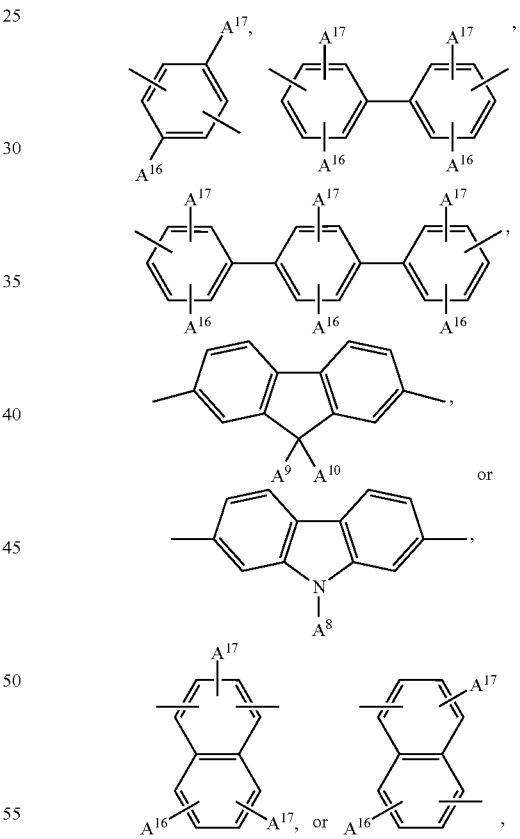

wherein
$A^8$ is $C_1$-$C_{18}$alkyl,
$A^9$ and $A^{10}$ are independently of each other $C_1$-$C_{18}$alkyl, or $A^9$ and $A^{10}$ form a ring, especially a five- or six-membered ring, which can optionally be substituted by $C_1$-$C_8$alkyl, or $C_1$-$C_8$alkoxy, and
$A^{16}$ and $A^{17}$ are independently of each other H, $C_1$-$C_8$alkyl, or $C_1$-$C_8$alkoxy.

For reasons of the spectral position of the (photo)luminescence the following groups are preferred for $A^6$:

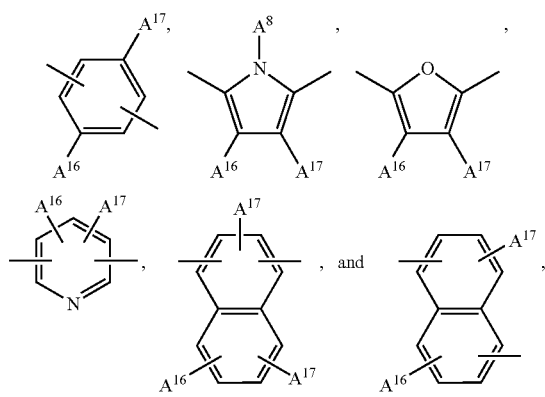
wherein $A^8$, $A^{16}$ and $A^{17}$ are as defined above.
Most preferably $A^6$ is a group of formula
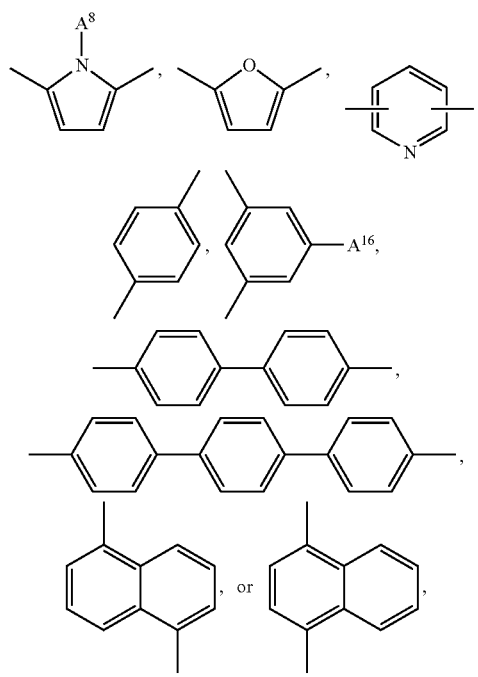
wherein $A^8$ is $C_1$-$C_8$alkyl, and $A^{16}$ is hydrogen, or $C_1$-$C_8$alkyl.
Examples of compounds of formula III are:
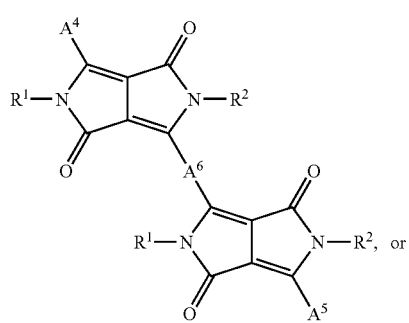
(IIIa)
-continued
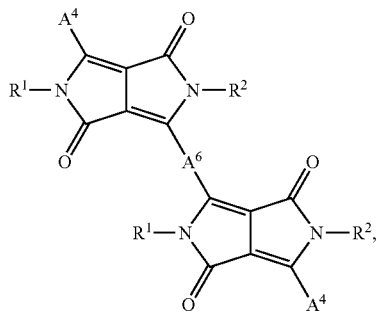
(IIIb)
wherein $A^6$ is a group of formula
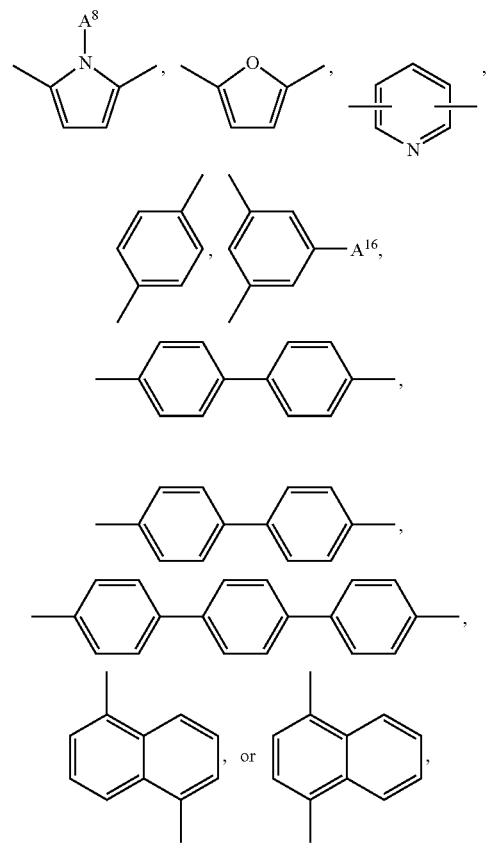
wherein $A^8$ is $C_1$-$C_8$alkyl, and $A^{16}$ is hydrogen, or $C_1$-$C_8$alkyl.
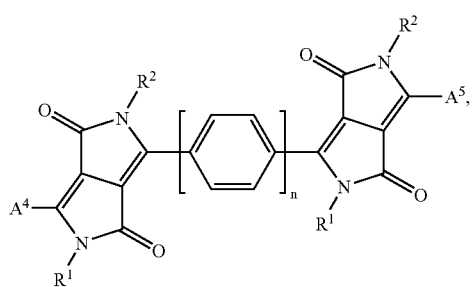

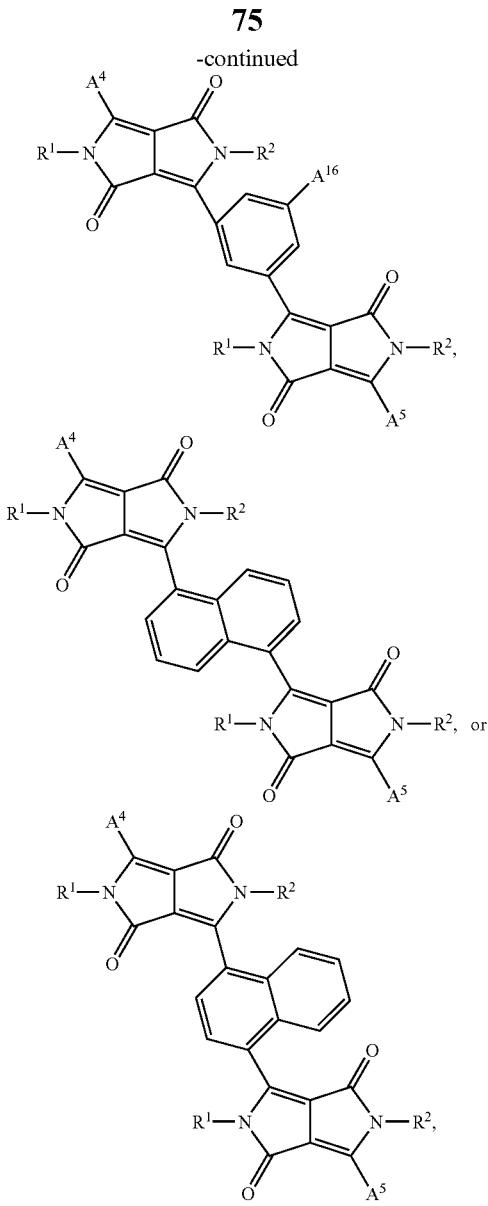

wherein $A^{16}$, $R^1$, $R^2$, $A^4$ and $A^5$ are as defined above and n is an integer 1, 2, or 3.

Examples of preferred compounds of formula III are:

| Cpd. | $A^4 = A^5$ | $A^6$ | $R^1 = R^2$ |
|---|---|---|---|
| D-1 | 1-naphthyl | 1,4-phenylene | $CH_3$ |
| D-2 | 1-isoquinolinyl | 1,4-naphthylene | $CH_3$ |
| D-3 | 1-naphthyl | 1,5-naphthylene | $CH_3$ |
| D-4 | 1-isoquinolinyl | 2,6-dimethylphenyl | $CH_3$ |
| D-5 | 1-naphthyl | 3,5-dimethyl-4-tert-butylphenyl | $CH_3$ |
| D-6 | 1-naphthyl | (1,4-phenylene)$_2$ | $CH_3$ |
| D-7 | 1-naphthyl | (1,4-phenylene)$_3$ | $CH_3$ |

Compounds of formula III can be prepared, for example, via the following reaction sequence:

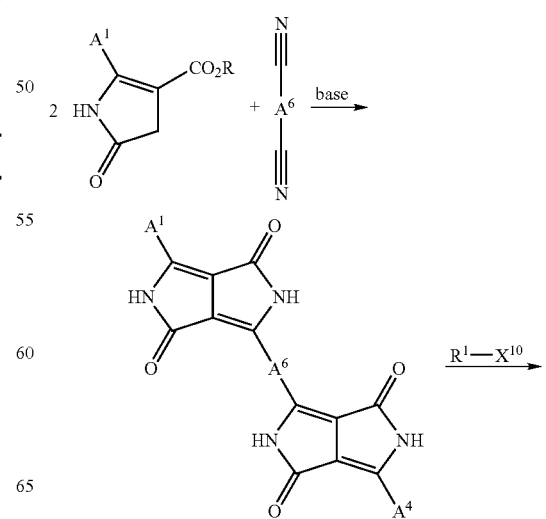

-continued

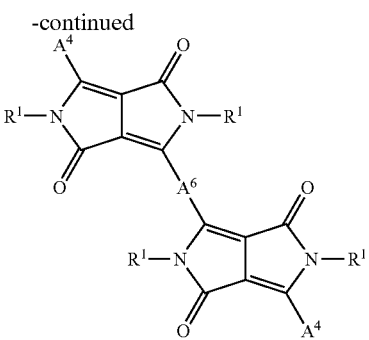

wherein R, $R^1$, $A^4$ and $A^6$ are as defined above and $X^{10}$ is halogen such as chlorine, bromine or iodine, preferably bromine or iodine.

To prepare compounds corresponding to formula II, a halogenide, such as a bromide or chloride, especially a bromide corresponding to formula

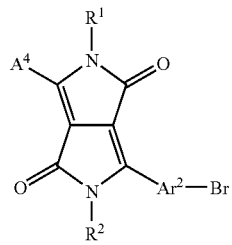

is reacted with an equimolar amount of a diboronic acid or diboronate corresponding to formula

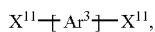

wherein $X^{11}$ is independently in each occurrence —B(OH)$_2$, —B(OY$^1$)$_2$ or

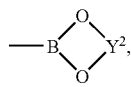

wherein $Y^1$ is independently in each occurrence a $C_1$-$C_{10}$alkyl group and $Y^2$ is independently in each occurrence a $C_2$-$C_{10}$alkylene group, such as —CY$^3$Y$^4$—CY$^5$Y$^6$—, or —CY$^7$Y$^8$—CY$^{10}$—CY$^{11}$Y$^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —C(CH$_3$)$_2$C(CH$_3$)$_2$—,
or —C(CH$_3$)$_2$CH$_2$C(CH$_3$)$_2$—, under the catalytic action of Pd and triphenylphosphine, wherein Ar$^2$ and Ar$^3$ together form the group A$^6$. The reaction is typically conducted at about 70° C. to 180° C. in an aromatic hydrocarbon solvent such as toluene. Other solvents such as dimethylformamide and tetrahydrofuran can also be used alone, or in mixtures with an aromatic hydrocarbon. An aqueous base, preferably sodium carbonate or bicarbonate, is used as the HBr scavenger. Depending on the reactivities of the reactants, the reaction may take 2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. By using the Suzuki coupling compounds of formula III can be prepared, wherein $A^4$ and $A^5$ have different meanings, as well as compounds, wherein
$A^6$ is a group of the formula —Ar$^2$—(Ar$^3$)$_{n11}$—Ar$^{2'}$—
n11 is an integer 1 to 10, especially 1, 2, or 3,
Ar$^2$, Ar$^{2'}$ and Ar$^3$ are independently of each other a group of formula

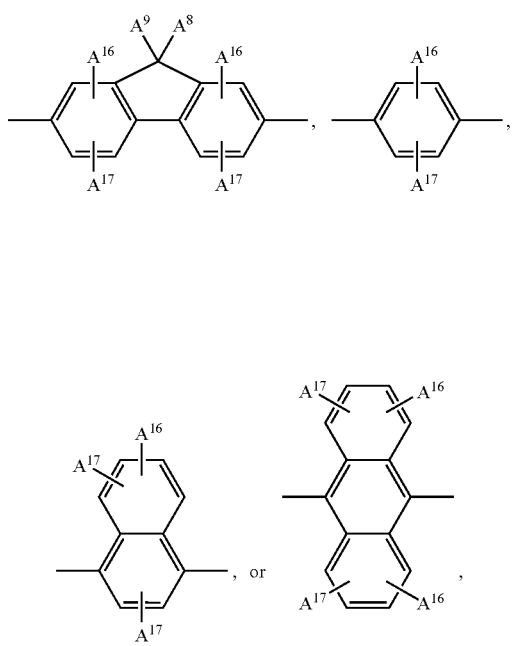

wherein $A^8$, $A^9$, $A^{16}$ and $A^{17}$ are as defined above.

In a further embodiment the present invention relates to compositions comprising a guest chromophore and a host chromophore, wherein the absorption spectrum of the guest chromophore overlaps with the fluorescence emission spectrum of the host chromophore, wherein the host chromophore is a diketopyrrolopyrrole having a photoluminescence emission peak at 500 to 720 nm, preferably 520 to 630 nm, most preferred 540 to 600 nm, wherein the host and/or the guest chromophore is a diketopyrrolopyrrole of formula I.

Accordingly, the compositions comprise a diketopyrrolopyrrole host chromophore of formula I, or III or a diketopyrrolopyrrole guest chromophore of formula I, or III; or a diketopyrrolopyrrole host chromophore of formula I, or III and a diketopyrrolopyrrole guest chromophore of formula I, or III.

Instead of a diketopyrrolopyrrole guest chromophore of formula I, or III a diketopyrrolopyrrole guest chromophore described, for example, in EP-A-1087006, WO03/002672, WO03/064558, or WO04/090046 can be used.

Preferred diketopyrrolopyrrole guest chromophores, which can be used instead of the diketopyrrolopyrrole guest chromophores of formula I, or III are the ones described in WO03/064558:

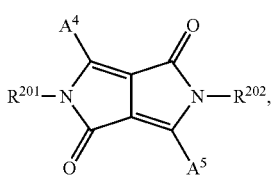

(II)

wherein
$A^4$ and $A^5$ independently from each other stand for

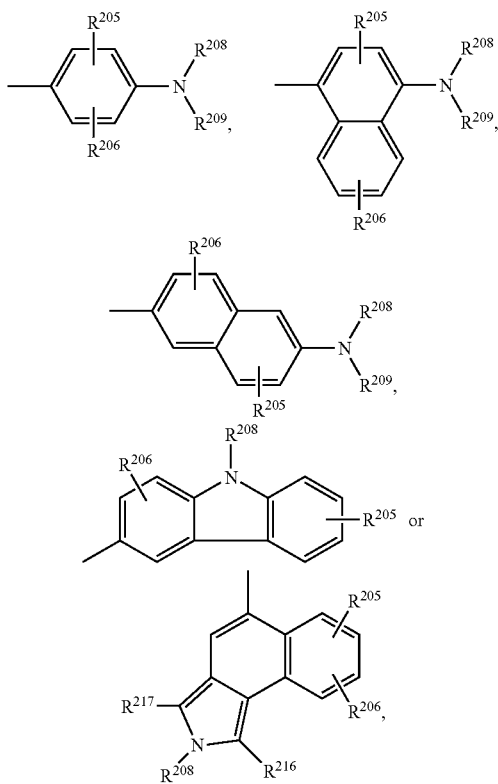

wherein
$R^{200}$ and $R^{201}$ independently from each other stand for $C_1$-$C_{25}$-alkyl, preferably $C_1$-$C_8$alkyl, $C_5$-$C_{12}$cycloalkyl or $C_5$-$C_{12}$-cycloalkyl which can be condensed one or two times by phenyl which can be substituted one to three times with $C_1$-$C_4$-alkyl, halogen and cyano, in particular cyclohexyl, which can be substituted one to three times with $C_1$-$C_8$alkyl and/or $C_1$-$C_8$alkoxy, in particular 2,6-di-isopropylcyclohexyl, or

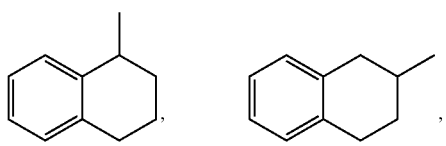

silyl, in particular trimethylsilyl, $A^{6'}$ or —$CR^{211}R^{212}$—$(CH_2)_m$-$A^{6'}$, wherein $R^{211}$ and $R^{212}$ independently from each other stand for hydrogen or $C_1$-$C_4$alkyl, or phenyl which can be substituted one to three times with $C_1$-$C_3$alkyl, $A^{6'}$ stands for phenyl or 1- or 2-naphthyl which can be substituted one to three times with $C_1$-$C_8$alkyl, $C_1$-$C_8$alkoxy, halogen, cyano, phenyl, which can be substituted with $C_1$-$C_8$alkyl or $C_1$-$C_8$alkoxy one to three times, or —$NR^{213}R^{214}$, wherein $R^{213}$ and $R^{214}$ represent $C_1$-$C_{25}$-alkyl, $C_5$-$C_{12}$-cycloalkyl or $C_6$-$C_{24}$-aryl, in particular phenyl or 1- or 2-naphthyl, which can be substituted one to three times with $C_1$-$C_8$alkyl, $C_1$-$C_8$alkoxy, halogen or cyano or phenyl, which can be substituted with $C_1$-$C_8$alkyl, or $C_1$-$C_8$alkoxy one to three times, in particular 3,5-dimethylphenyl, 3,5-di-tert.-butylphenyl, 3-methylphenyl and 2,6-di-isopropylphenyl, and m stands for 0, 1, 2, 3 or 4, in particular 0 or 1;

$R^{205}$, $R^{206}$ and $R^{207}$ independently from each other stands for hydrogen, $C_1$-$C_{25}$-alkyl, $C_1$-$C_{25}$-alkoxy, —$OCR^{211}R^{212}$—$(CH_2)_m$-$A^6$, cyano, halogen, —$OR^{210}$, —$S(O)_pR^{213}$, or phenyl, which can be substituted one to three times with $C_1$-$C_8$alkyl or $C_1$-$C_8$alkoxy, wherein $R^{210}$ stands for $C_6$-$C_{24}$-aryl, or a saturated or unsaturated heterocyclic radical comprising five to seven ring atoms, wherein the ring consists of carbon atoms and one to three hetero atoms selected from the group consisting of nitrogen, oxygen and sulfur, $R^{213}$ stands for $C_1$-$C_{25}$-alkyl, $C_5$-$C_{12}$-cycloalkyl, —$CR^{211}R^{212}$—$(CH_2)_m$-Ph, $R^{215}$ stands for $C_6$-$C_{24}$-aryl, p stands for 0, 1, 2 or 3 and n stands for 0, 1, 2, 3 or 4, wherein $R^{208}$ and $R^{209}$ independently from each other stand for hydrogen, $C_1$-$C_{25}$-alkyl, $C_5$-$C_{12}$-cycloalkyl, —$CR^{211}R^{212}$—$(CH_2)_m$-$A^{6'}$, $C_6$-$C_{24}$-aryl, such as phenyl, 1-naphthyl, 2-naphthyl, 4-biphenyl, phenanthryl, terphenyl, pyrenyl, 2- or 9-fluorenyl or anthracenyl, preferably $C_6$-$C_{12}$aryl such as phenyl, 1-naphthyl, 2-naphthyl, 4-biphenyl, which may be unsubstituted or substituted, or a saturated or unsaturated heterocyclic radical comprising five to seven ring atoms, wherein the ring consists of carbon atoms and one to three hetero atoms selected from the group consisting of nitrogen, oxygen and sulfur, and $R^{216}$ and $R^{217}$ independently from each other stand for hydrogen and $C_6$-$C_{24}$-aryl, in particular phenyl.

In particular groups of the following formula are preferred

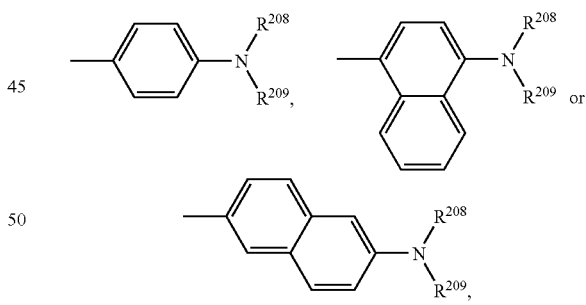

wherein $R^{208}$ and $R^{209}$ are independently of each other a group of the formula

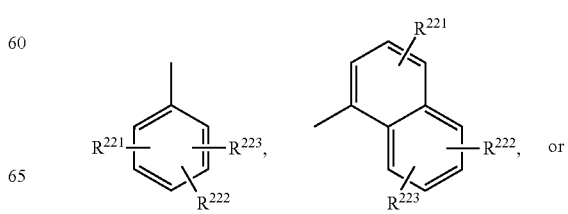

-continued

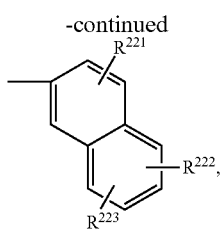

wherein $R^{221}$, $R^{222}$ and $R^{223}$ are independently of each other hydrogen, $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group, a silyl group or a siloxanyl group. Preferably $R^{221}$, $R^{222}$ and $R^{223}$ are independently of each other hydrogen, $C_1$-$C_8$alkyl, $C_1$-$C_8$alkoxy or $C_1$-$C_8$alkylthio.

Preferably $R^{201}$ and $R^{202}$ are independently of each other $C_1$-$C_8$alkyl,

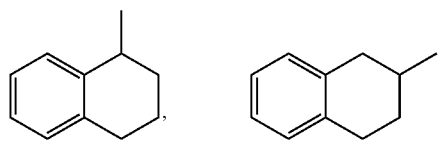

or —$CR^{211}R^{212}$— $A^{6'}$, wherein $R^{211}$ is hydrogen, $R^{212}$ is hydrogen, in particular methyl or phenyl and $A^{6'}$ is

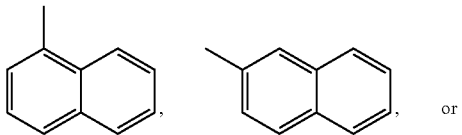

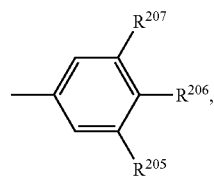

wherein $R^{205}$, $R^{206}$ and $R^{207}$ are independently of each other hydrogen, $C_1$-$C_4$-alkyl, or halogen, in particular Br.

Particularly preferred DPP compounds of the formula II are the following compounds:

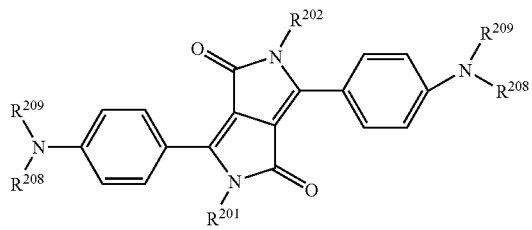

| Compound | $R^{202} = R^{201}$ | $R^{208}$ | $R^{209}$ |
|---|---|---|---|
| G-35 | —CH₂—C₆H₄—CH₃ | —C₆H₄—CH₃ | —C₆H₄—CH₃ |
| G-36 | —(CH₂)₃CH₃ | 2-naphthyl | 2-naphthyl |
| G-37 | —CH₂—C₆H₅ | 2-naphthyl | —C₆H₅ |
| G-38 | —CH₂—(3,5-di-tert-butylphenyl) | —C₆H₅ | —C₆H₅ |

-continued

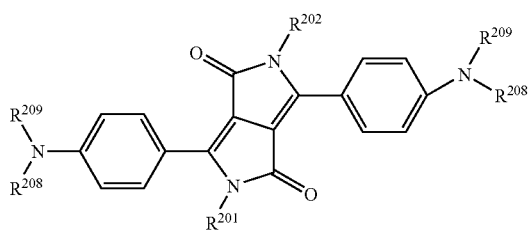

| Compound | R²⁰² = R²⁰¹ | R²⁰⁸ | R²⁰⁹ |
|---|---|---|---|
| G-39 | 3-methylbenzyl (–CH₂–C₆H₄–CH₃) | " | " |
| G-40 | " | 4-methoxyphenyl | 4-methoxyphenyl |
| G-41 | –CH₂–C₆H₄–CN | 4-methylphenyl | 4-methylphenyl |
| G-42 | –CH₂–C₆H₃(CN)₂ (3,4-dicyanobenzyl) | 4-methylphenyl | 4-methylphenyl |
| G-43 | benzyl (–CH₂–C₆H₅) | 2-naphthyl | 2-naphthyl |
| G-44 | Me | 4-methylphenyl | 4-methylphenyl |
| G-45 | Me | 2-naphthyl | 2-naphthyl |
| G-46 | Me | 2-naphthyl | phenyl |
| G-47 | Me | 3,4-dimethylphenyl | phenyl |
| G-48 | Me | 4-methoxyphenyl | 4-methoxyphenyl |

Particularly preferred inventive compositions are given below:

| Composition | Host | Guest |
|---|---|---|
| C-1 | | |
| C-2 | | |

-continued
| Composition | Host | Guest |
|---|---|---|
| C-3 | 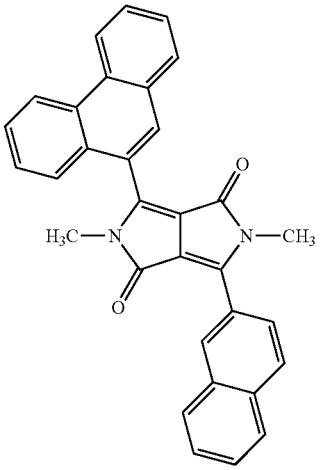 | 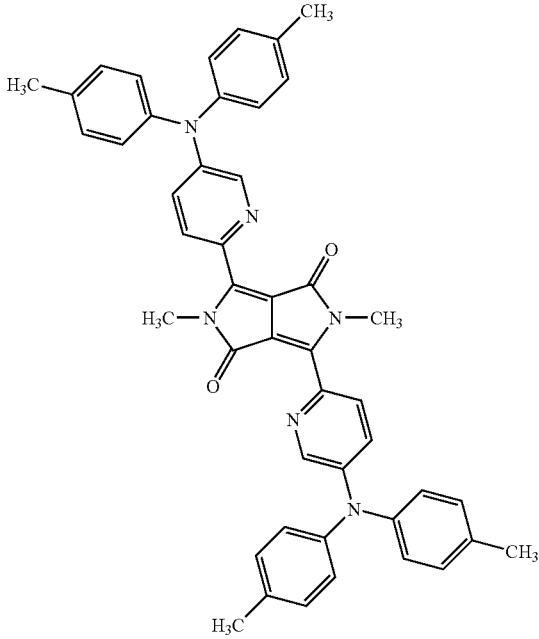 |
| C-4 | 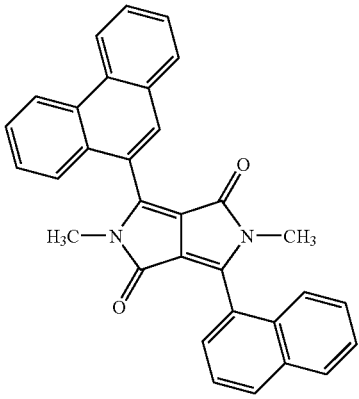 | 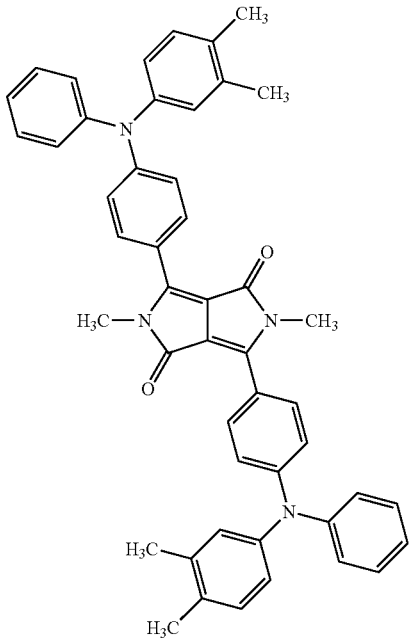 |

-continued
| Composition | Host | Guest |
|---|---|---|
| C-5 | 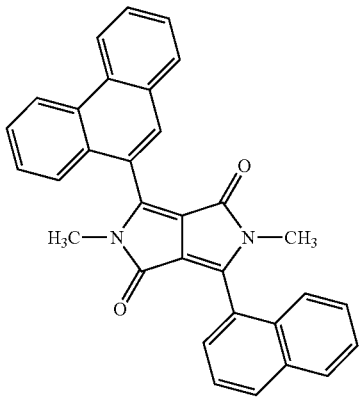 | 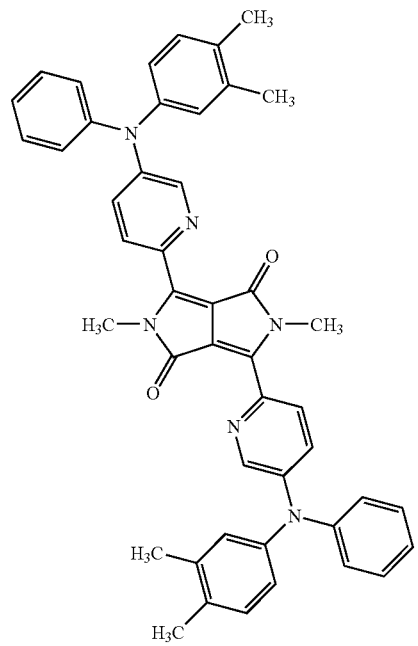 |
| C-6 | 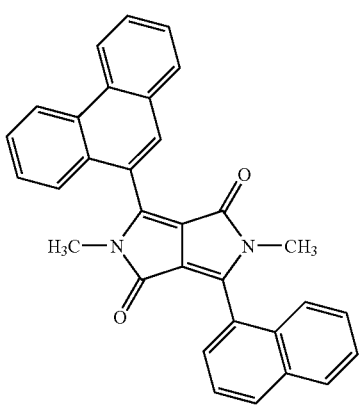 | 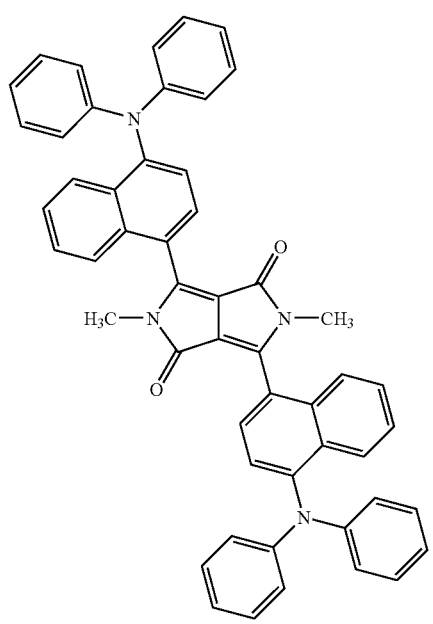 |

| Composition | Host | Guest |
|---|---|---|
| C-7 | 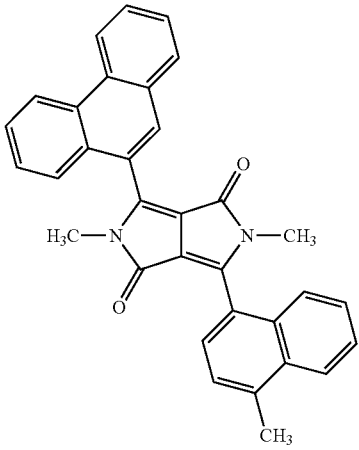 | 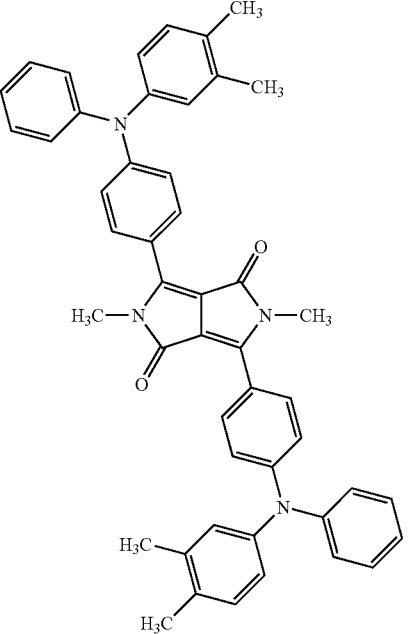 |
| C-8 | 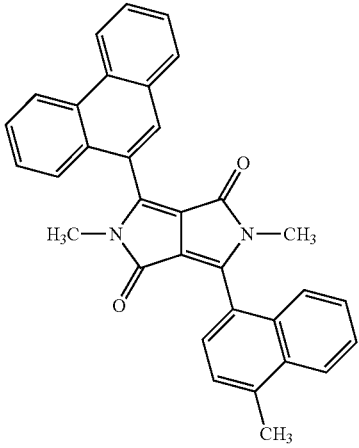 | 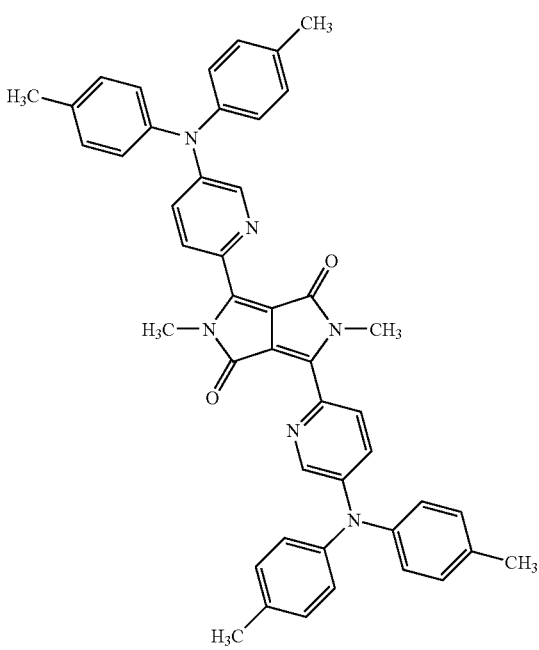 |

-continued
| Composition | Host | Guest |
| --- | --- | --- |
| C-9 | 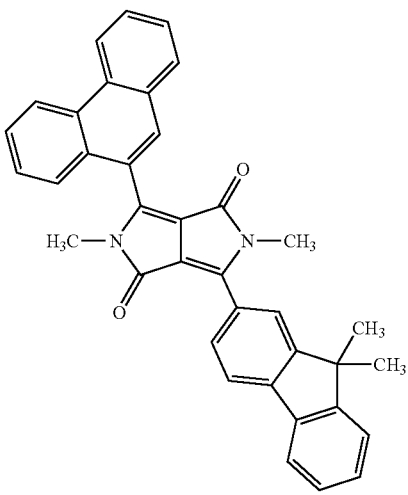 | 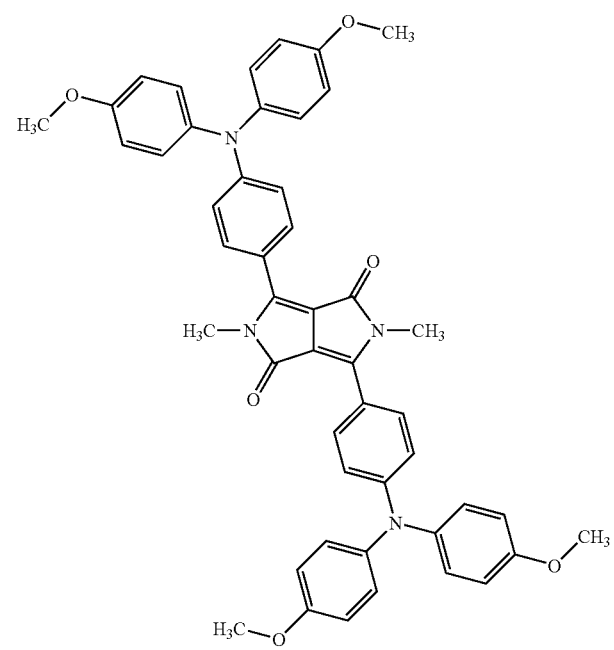 |
| C-10 | 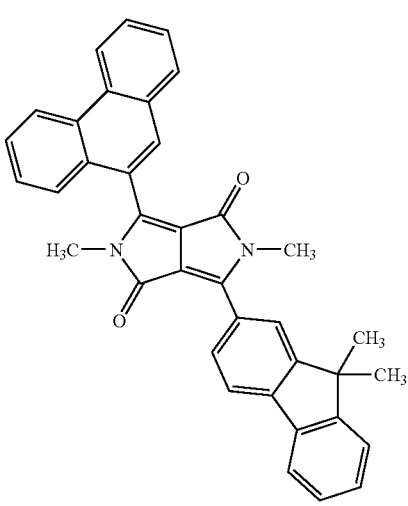 | 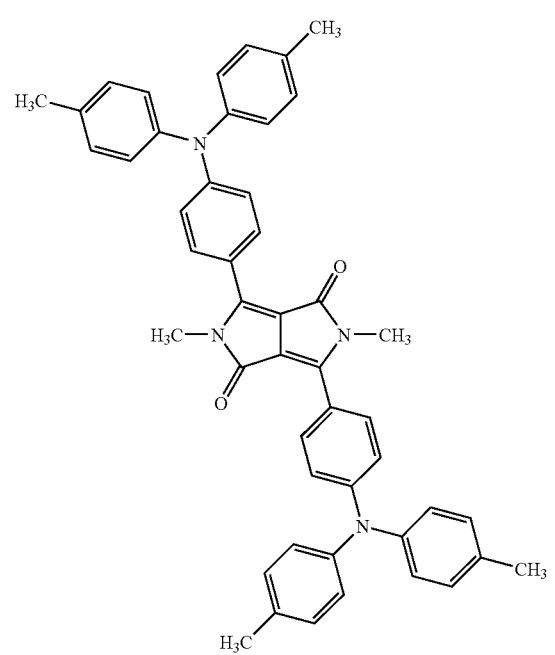 |

| Composition | Host | Guest |
|---|---|---|
| C-11 | | |
| C-12 | | |

Furthermore compounds of formula

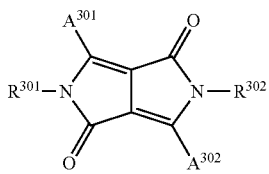

(III)

described in WO04/090046 are preferred as guest compounds, wherein $R^{301}$ and $R^{302}$ independently of each other stand for $C_1$-$C_8$alkyl, $C_5$-$C_{12}$-cycloalkyl, which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, $A^{6''}$, or —$CR^{331}R^{332}$—$(CH_2)_m$-$A^{6''}$ wherein $R^{331}$ and $R^{332}$ stand for hydrogen, $A^{6''}$ stands for phenyl or 1- or 2-naphthyl, which can be substituted one to three times with $C_1$-$C_8$alkyl and/or $C_1$-$C_8$alkoxy, and m stands for 0 or 1, $A^{301}$ and $A^{302}$ independently from each other are selected from

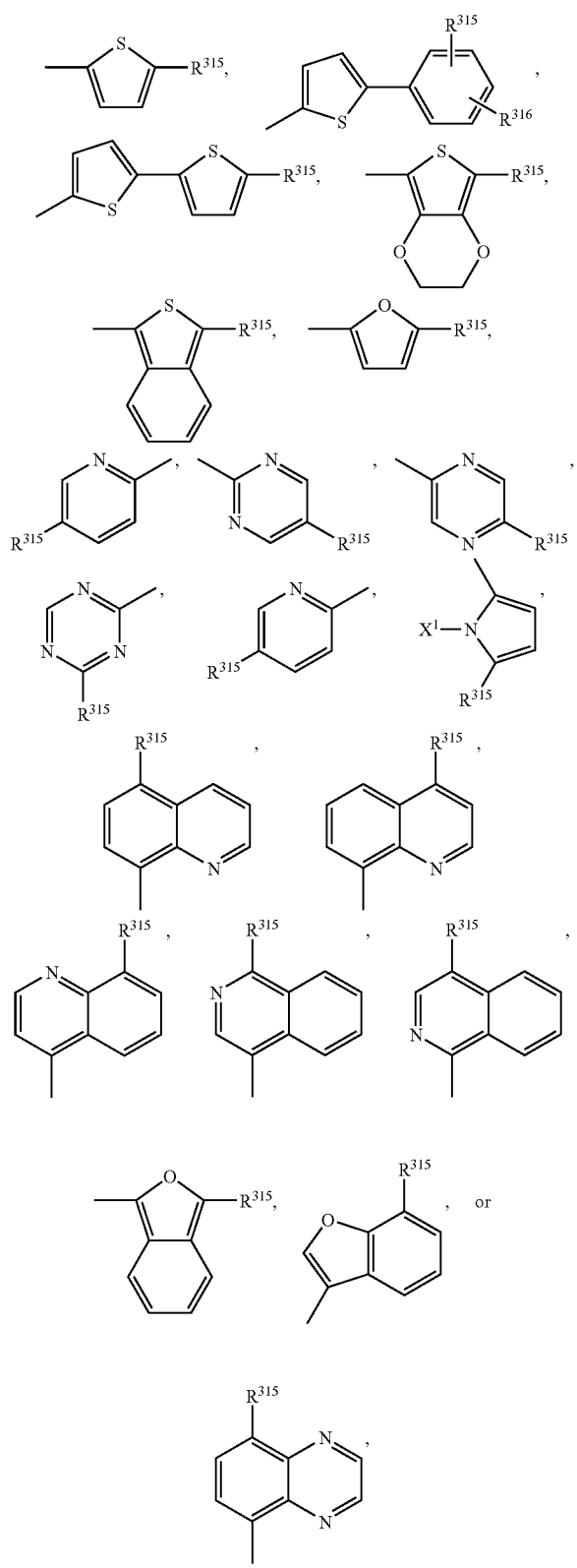

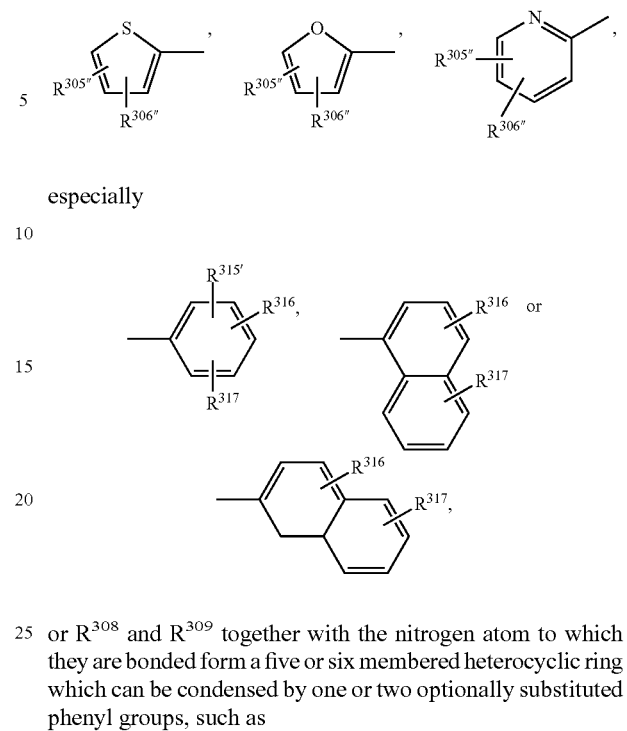

especially or $R^{308}$ and $R^{309}$ together with the nitrogen atom to which they are bonded form a five or six membered heterocyclic ring which can be condensed by one or two optionally substituted phenyl groups, such as wherein $R^{315'}$, $R^{316}$ and $R^{317}$ independently from each other stands for hydrogen, $C_1$-$C_8$-alkyl or $C_1$-$C_8$-alkoxy, $R^{305''}$ and $R^{306''}$ independently from each other stands for hydrogen, $C_1$-$C_8$-alkyl or $C_1$-$C_8$-alkoxy, and $X^1$ stands for hydrogen, or $C_1$-$C_8$-alkyl.

Particularly preferred guest chromophores of DPP compounds represented by the formula II and III are the following compounds:

| Compound (of formula II) | $A^4 = A^5$ | $R^{202} = R^{201}$ |
|---|---|---|
| G-1 | Me | —$CH_3$ |
| G-2 | " | n-$C_4H_9$ |
| G-3 | " | n-$C_{12}H_{25}$ | wherein $R^{315}$ is a group —$NR^{308}R^{309}$, wherein $R^{308}$ and $R^{309}$ independently from each other stand for $C_1$-$C_8$-alkyl, $A^{301}$, such as -continued
| | | |
|---|---|---|
| G-4 | 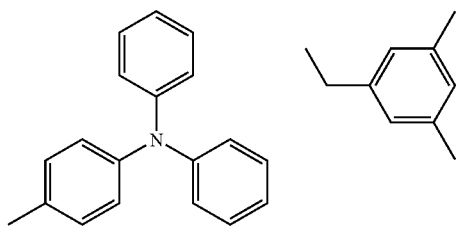 | 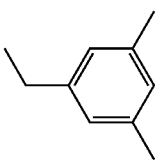 |
| G-5 | 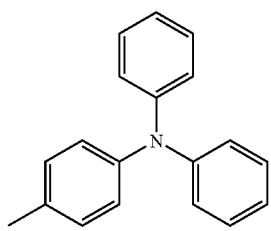 | n-C$_4$H$_5$ |
| G-6 | 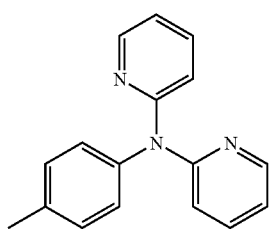 | C$_2$H$_5$ |
| G-7 | 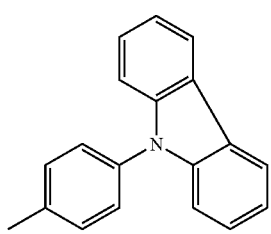 | n-C$_6$H$_{13}$ |
| G-8 | 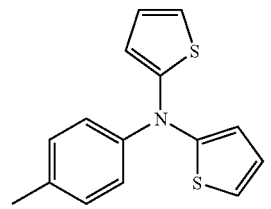 | n-C$_6$H$_{13}$ |
| G-9 | 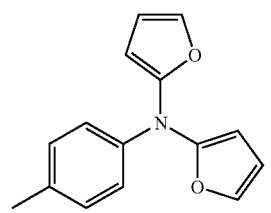 | n-C$_6$H$_{13}$ |
-continued
| Compound (of formula III) | A$^{301}$ = A$^{302}$ | R$^{301}$ = R$^{302}$ |
|---|---|---|
| G-10 | 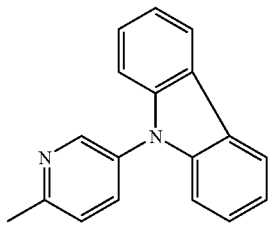 | n-C$_4$H$_9$ |
| G-11 | 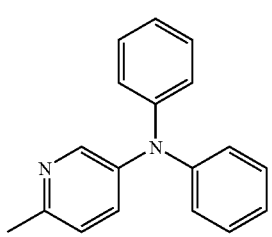 | n-C$_{12}$H$_{25}$ |
| G-12 | " | n-C$_4$H$_9$ |
| G-13 | 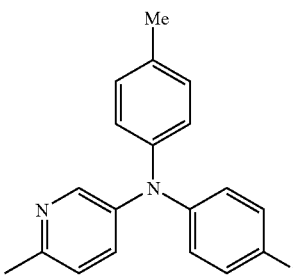 | CH$_3$ |
| G-14 | 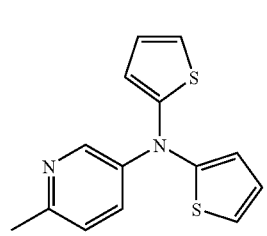 | CH$_3$ |
| G-15 | " | n-C$_4$H$_9$ |
| G-16 | 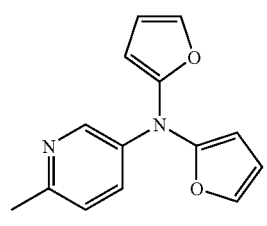 | n-C$_4$H$_9$ |

| | 101 -continued | | | 102 -continued | |
|---|---|---|---|---|---|
| G-17 | 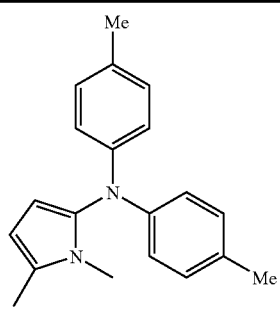 | n-C$_4$H$_9$ | G-24 | 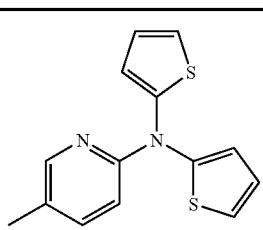 | n-C$_4$H$_9$ |
| G-18 | 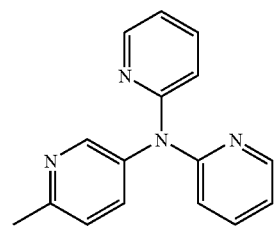 | n-C$_4$H$_9$ | G-25 | 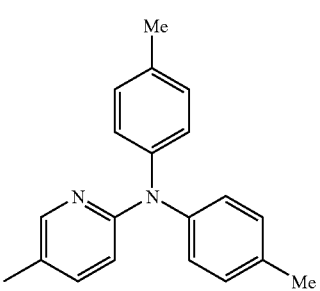 | n-C$_4$H$_9$ |
| G-19 | 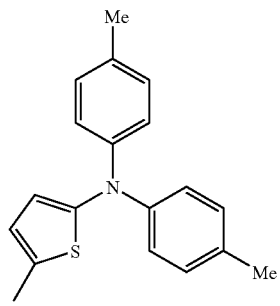 | CH$_3$ | G-26 | " | —CH(CH$_3$)$_2$ |
| | | | G-27 | 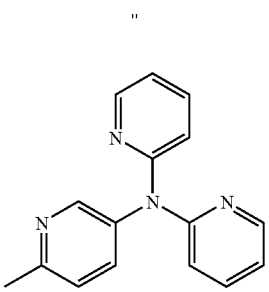 | CH$_3$ |
| G-20 | 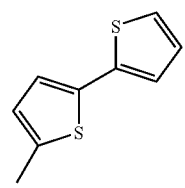 | n-C$_4$H$_9$ | G-28 | 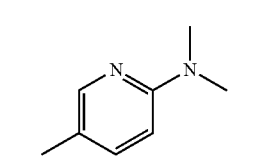 | CH$_3$ |
| G-21 | 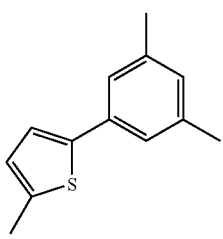 | n-C$_4$H$_9$ | G-29 | 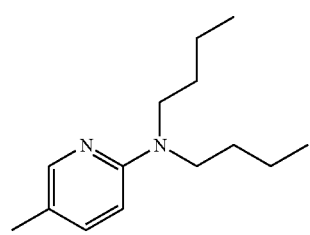 | C$_2$H$_5$ |
| G-22 | 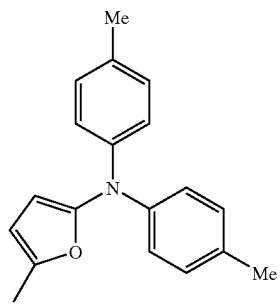 | n-C$_4$H$_9$ | G-30 | 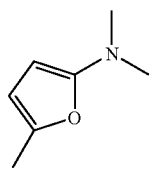 | n-C$_4$H$_9$ |
| G-23 | " | CH$_3$ | G-31 | 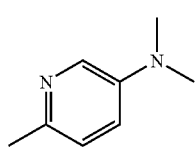 | n-C$_4$H$_9$ |

| | | |
|---|---|---|
| G-32 | 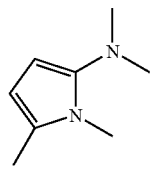 | n-C$_4$H$_9$ |
| G-33 | 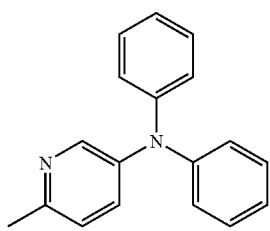 | n-C$_6$H$_{13}$ |
| G-34 | 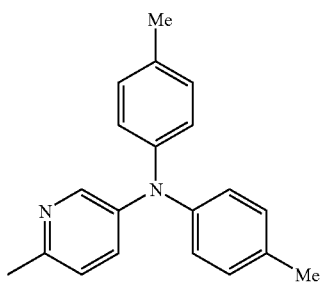 | n-C$_4$H$_9$ |

Instead of the above mentioned Lam guest compounds the Lam guest compounds described in WO03/048268 can be used, such as, for example:

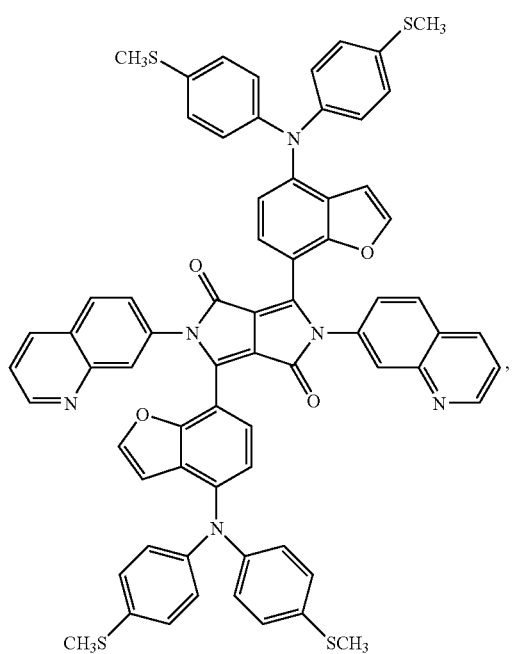

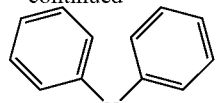

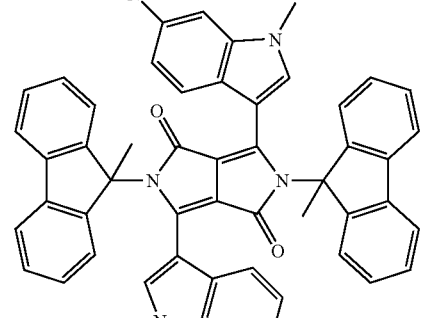

Instead of a diketopyrrolopyrrole host chromophore of formula I a diketopyrrolopyrrole host chromophore described, for example, in EP-A-1087006, WO03/002672, WO03/064558, or WO04/090046 can be used.

In addition, the compounds of formula I, or III can be used with other known fluorescent compounds as host or guest compounds, for example, fused derivatives of aromatic hydrocarbons such as rubrene and perylene; fused heterocyclics such as pyridinothiadiasole, pyrazolopyridine and naphtalimide derivatives; rare earth complex as Eu, Ir, or Pt complex; zincporphyrin, rhodamine, deazaflvain derivatives, coumarine derivatives, phenoxazones, quinacridones, dicyanoethenylarenes, Alq$_3$ and the derivatives thereof.

Particularly preferred inventive host/guest compositions can comprise compounds besides inventive DPP host compounds of formula I, or III quinacridone guest compounds described, for example, in PCT/EP2005/052841:

| Com-position | Host | Guest |
|---|---|---|
| C-13 | 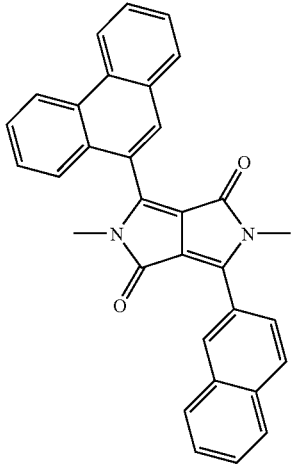 | 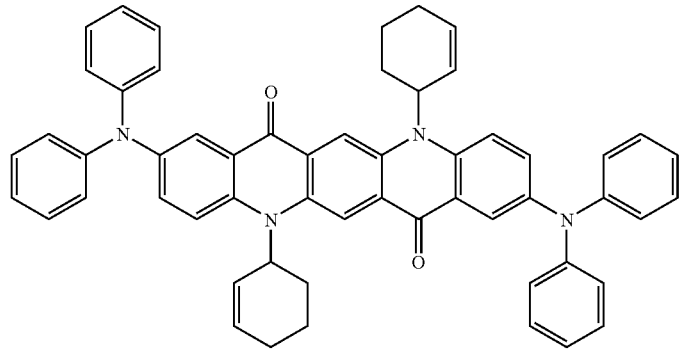 |
| C-14 | 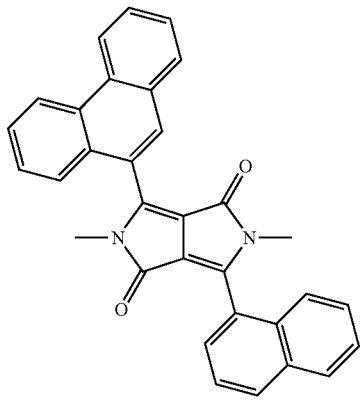 | 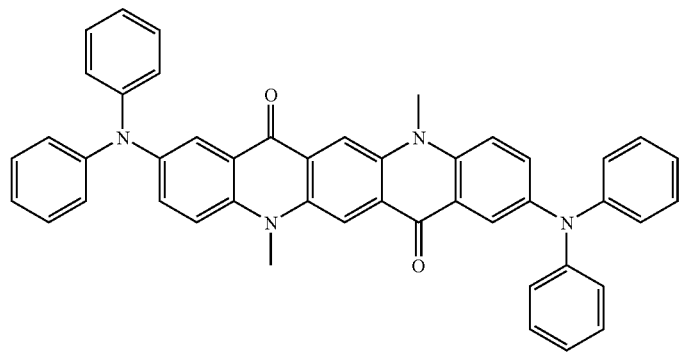 |
| C-15 | 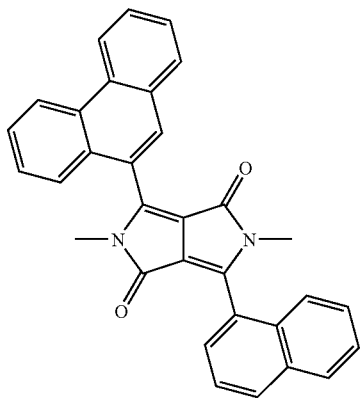 | 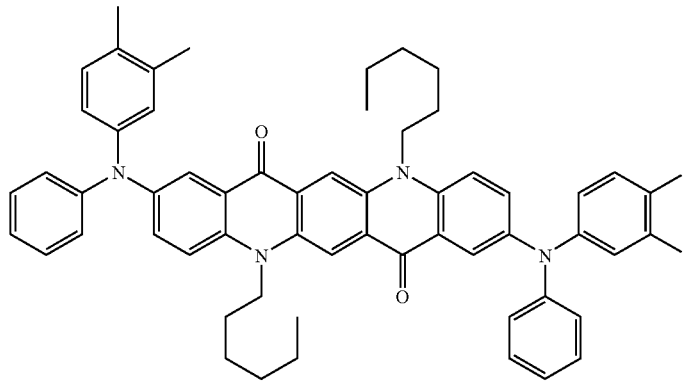 |

| Com-position | Host | Guest |
|---|---|---|
| C-16 | | |
| C-17 | | |
| C-18 | | |

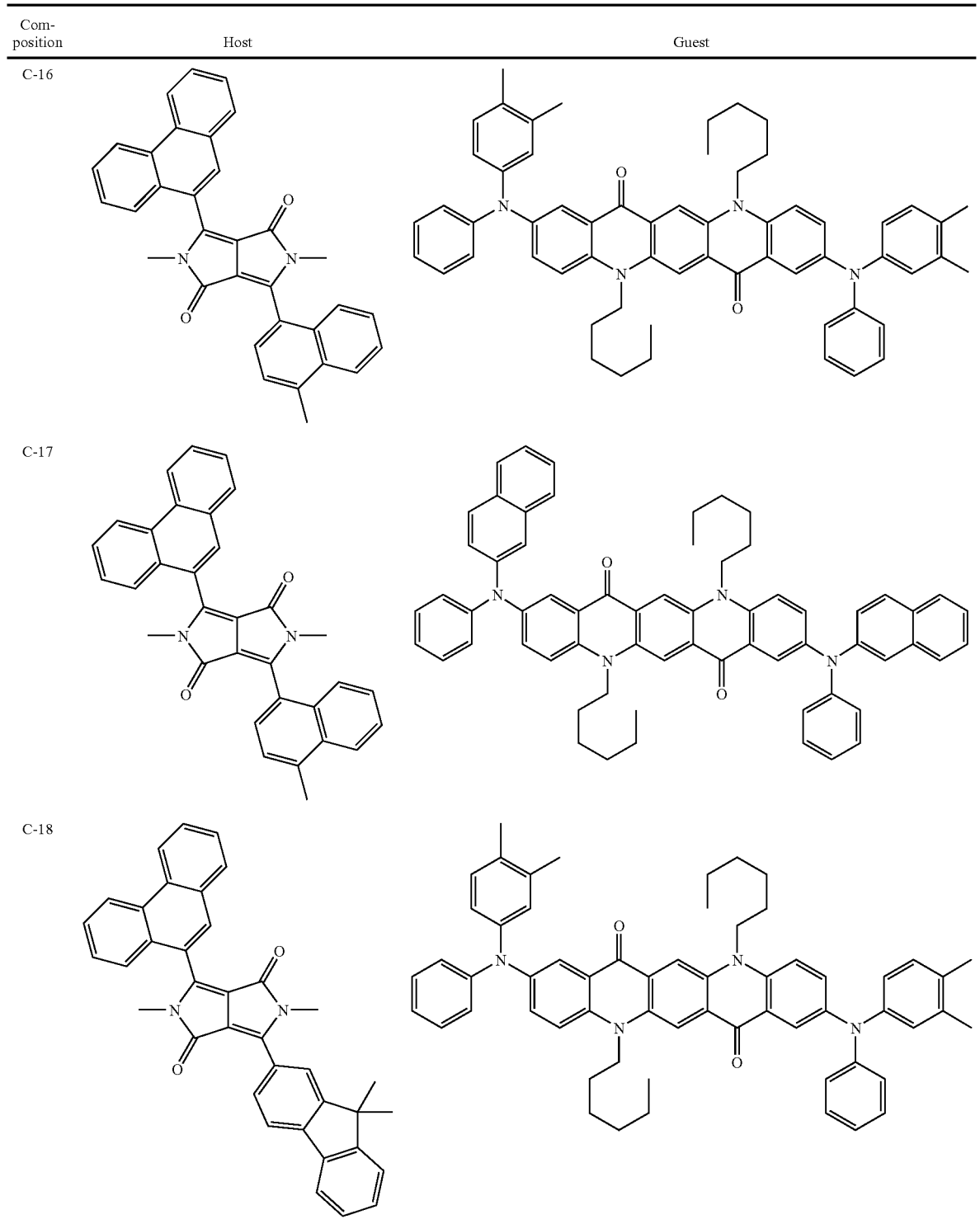

The wording "at least two adjacent substituents form an aromatic or aliphatic fused ring system" means two adjacent substituents can form an aromatic ring, such as a phenyl or naphthyl ring, an aliphatic ring, such as a cyclohexyl ring, or a heterocyclic ring, such as a pyridine or pyrrole ring, wherein two or more of such rings can form a fused ring system with the group to which they are bonded.

The term "halogen" means fluorine, chlorine, bromine and iodine.

$C_1$-$C_{25}$alkyl is typically linear or branched—where possible—methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl, n-nonyl, decyl, undecyl, dodecyl, tetradecyl, pentadecyl, hexadecyl, heptadecyl, octadecyl, eicosyl, heneicosyl, docosyl, tetracosyl or pentacosyl, preferably $C_1$-$C_8$alkyl such as methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl, more preferably $C_1$-$C_4$alkyl such as typically methyl, ethyl, n-propyl, isopropyl, n-butyl, sec.-butyl, isobutyl, tert.-butyl.

The terms "haloalkyl, haloalkenyl and haloalkynyl" mean groups given by partially or wholly substituting the above-mentioned alkyl group, alkenyl group and alkynyl group with halogen, such as trifluoromethyl etc. The "aldehyde group, ketone group, ester group, carbamoyl group and amino group" include those substituted by an alkyl group, a cycloalkyl group, an aryl group, an aralkyl group or a heterocyclic group, wherein the alkyl group, the cycloalkyl group, the aryl group, the aralkyl group and the heterocyclic group may be unsubstituted or substituted. The term "silyl group" means a group of formula —$SiR^{62}R^{63}R^{64}$, wherein $R^{62}$, $R^{63}$ and $R^{64}$ are independently of each other a $C_1$-$C_8$alkyl group, in particular a $C_1$-$C_4$ alkyl group, a $C_6$-$C_{24}$aryl group or a $C_7$-$C_{12}$aralkyl group, such as a trimethylsilyl group. The term "siloxanyl group" means a group of formula —O—$SiR^{62}R^{63}R^{64}$, wherein $R^{62}R^{63}$ and $R^{64}$ are as defined above, such as a trimethylsiloxanyl group.

Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of ether linkage is replaced by a sulfur atom.

The term "aryl group" is typically $C_6$-$C_{24}$aryl, such as phenyl, indenyl, azulenyl, naphthyl, biphenyl, as-indacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of $C_6$-$C_{12}$aryl are phenyl, 1-naphthyl, 2-naphthyl, 3- or 4-biphenyl, 2- or 9-fluorenyl or 9-phenanthryl, which may be unsubstituted or substituted.

The term "aralkyl group" is typically $C_7$-$C_{24}$aralkyl, such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, p-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, p-phenyl-ethyl, α,α-dimethylbenzyl, ω-phenyl-butyl, or ω,ωdimethyl-ω-phenyl-butyl, in which both the aliphatic hydrocarbon group and aromatic hydrocarbon group may be unsubstituted or substituted.

The term "aryl ether group" is typically a $C_{6\text{-}24}$aryloxy group, that is to say O—$C_{6\text{-}24}$aryl, such as, for example, phenoxy or 4-methoxyphenyl. The term "aryl thioether group" is typically a $C_{6\text{-}24}$arylthio group, that is to say S—$C_{6\text{-}24}$aryl, such as, for example, phenylthio or 4-methoxyphenylthio. The term "carbamoyl group" is typically a $C_{1\text{-}18}$-carbamoyl radical, preferably $C_{1\text{-}8}$-carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

The term "cycloalkyl group" is typically $C_5$-$C_{12}$cycloalkyl, such as cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The term "cycloalkenyl group" means an unsaturated alicyclic hydrocarbon group containing one or more double bonds, such as cyclopentenyl, cyclopentadienyl, cyclohexenyl and the like, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

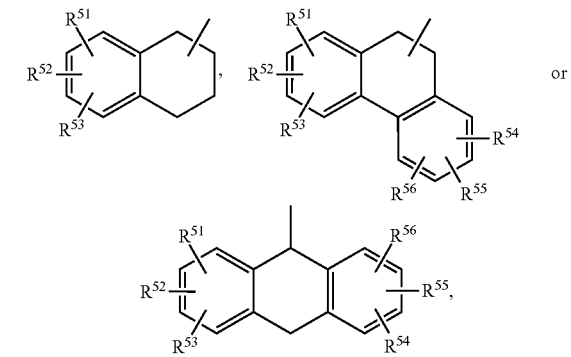

in particular

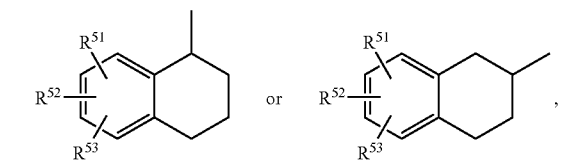

wherein $R^{5'}$, $R^{52}$, $R^{53}$, $R^{54}$, $R^{55}$ and $R^{56}$ are independently of each other $C_1$-$C_8$-alkyl, $C_1$-$C_8$-alkoxy, halogen and cyano, in particular hydrogen.

The wording "a group comprising a five-membered heterocyclic ring, containing one to three heteroatoms selected from the group of nitrogen, oxygen and sulfur" means a single five-membered heterocyclic ring, such as thienyl, furyl, furfuryl, 2H-pyranyl, pyrrolyl, imidazolyl, or pyrazolyl, or a five-membered heterocyclic ring which is part of a fused ring system, which is formed by the five-membered heterocyclic ring with aryl, heteroaryl and/or cycloalkyl groups, which can optionally be substituted. Examples of such groups are contained in the list of groups for $A^1$ and $A^2$ as well as in the definition of heteroaryl or heterocyclic groups.

The wording "a group comprising a six-membered heterocyclic ring, containing one to three heteroatoms selected from the group of nitrogen, oxygen and sulfur" means a single six-membered heterocyclic ring, such as pyridyl, triazinyl, pyrimidinyl, pyrazinyl, pyridazinyl, or a six-membered heterocyclic ring which is part of a fused ring system, which is formed by the six-membered heterocyclic ring with aryl, heteroaryl and/or cycloalkyl groups, which can optionally be substituted. Examples of such groups are contained in the list of groups for $A^1$ and $A^2$ as well as in the definition of heteroaryl or heterocyclic group.

The term "heteroaryl or heterocyclic group" is a ring with five to seven ring atoms, wherein nitrogen, oxygen or sulfur are the possible hetero atoms, and is typically an unsaturated heterocyclic radical with five to 18 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, perimidinyl, phenanthrolinyl, phenazinyl, isothiazolyl, phenothiazinyl, isoxazolyl, furazanyl or phenoxazinyl, preferably the above-mentioned mono- or bicyclic heterocyclic radicals.

The terms "aryl" and "alkyl" in alkylamino groups, dialkylamino groups, alkylarylamino groups, arylamino groups and diaryl groups are typically $C_1$-$C_{25}$alkyl and $C_6$-$C_{24}$aryl, respectively.

The above-mentioned groups can be substituted by a $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group, a silyl group or a siloxanyl group.

The present invention relates further to an electroluminescent device having the fluorescent diketopyrrolopyrroles of formula I, or III or the compositions according to the present invention between an anode and a cathode and emitting light by the action of electrical energy.

Typical constitutions of latest organic electroluminescent devices are:
(i) an anode/a hole transporting layer/an electron transporting layer/a cathode, in which the compounds or compositions of the present invention are used either as positive-hole transport compound or composition, which is exploited to form the light emitting and hole transporting layers, or as electron transport compounds or compositions, which can be exploited to form the light-emitting and electron transporting layers,
(ii) an anode/a hole transporting layer/a light-emitting layer/an electron transporting layer/a cathode, in which the compounds or compositions form the light-emitting layer regardless of whether they exhibit positive-hole or electron transport properties in this constitution,
(iii) an anode/a hole injection layer/a hole transporting layer/a light-emitting layer/an electron transporting layer/a cathode,
(iv) an anode/a hole transporting layer/a light-emitting layer/a positive hole inhibiting layer/an electron transporting layer/a cathode,
(v) an anode/a hole injection layer/a hole transporting layer/a light-emitting layer/a positive hole inhibiting layer/an electron transporting layer/a cathode,
(vi) an anode/a light-emitting layer/an electron transporting layer/a cathode,
(vii) an anode/a light-emitting layer/a positive hole inhibiting layer/an electron transporting layer/a cathode,
(viii) a mono-layer containing a light emitting material alone or a combination a light emitting material and any of materials of the hole transporting layer, the hole-blocking layer and/or the electron transporting layer, and
(ix) a multi-layered structure described in (ii) to (vii), wherein a light emitting layer is the mono-layer defined in (viii).

The compounds and compositions of the present invention can, in principal be used for any organic layer, such as, for example, hole transporting layer, light emitting layer, or electron transporting layer, but are preferably used as the light emitting material in the light emitting layer.

The weight ratio of the host chromophore to the guest chromophore is in general 50:50 to 99.99:0.01, preferably 90:10 to 99.99:0.01, more preferably 95:5 to 99.9:0.1, most preferred 98:2 to 99.9:0.1.

Thin film type electroluminescent devices usually consist essentially of a pair of electrodes and at least one charge transporting layer in between. Usually two charge transporting layers, a hole transporting layer (next to the anode) and an electron transporting layer (next to the cathode) are present. Either one of them contains—depending on its properties as hole-transporting or electron-transporting material—an inorganic or organic fluorescence substance as light-emitting material. It is also common, that a light-emitting material is used as an additional layer between the hole-transporting and the electron-transporting layer. In the above mentioned device structure, a hole injection layer can be constructed between an anode and a hole transporting layer and/or a positive hole inhibiting layer can be constructed between a light emitting layer and an electron transporting layer to maximise hole and electron population in the light emitting layer, reaching large efficiency in charge recombination and intensive light emission.

The devices can be prepared in several ways. Usually, vacuum evaporation is used for the preparation. Preferably, the organic layers are laminated in the above order on a commercially available indium-tin-oxide ("ITO") glass substrate held at room temperature, which works as the anode in the above constitutions. The membrane thickness is preferably in the range of 1 to 10,000 nm, more preferably 1 to 5,000 nm, more preferably 1 to 1,000 nm, more preferably 1 to 500 nm. The cathode metal, such as a Mg/Ag alloy, a binary Li—Al or LiF—Al system with an thickness in the range of 50-200 nm is laminated on the top of the organic layers. The vacuum during the deposition is preferably less than 0.1333 Pa ($1 \times 10^{-3}$ Torr), more preferably less than $1.333 \times 10^{-3}$ Pa ($1 \times 10^{-5}$ Torr), more preferably less than $1.333 \times 10^{-4}$ Pa ($1 \times 10^{-6}$ Torr).

As anode usual anode materials which possess high work function such as metals like gold, silver, copper, aluminum, indium, iron, zinc, tin, chromium, titanium, vanadium, cobalt, nickel, lead, manganese, tungsten and the like, metallic alloys such as magnesium/copper, magnesium/silver, magnesium/aluminum, aluminum/indium and the like, semiconductors such as Si, Ge, GaAs and the like, metallic oxides such as indium-tin-oxide ("ITO"), ZnO and the like, metallic compounds such as CuI and the like, and furthermore, electroconducting polymers such polyacetylene, polyaniline, polythiophene, polypyrrole, polyparaphenylene and the like, preferably ITO, most preferably ITO on glass as substrate can be used.

Of these electrode materials, metals, metallic alloys, metallic oxides and metallic compounds can be transformed into electrodes, for example, by means of the sputtering method. In the case of using a metal or a metallic alloy as a material for an electrode, the electrode can be formed also by the vacuum deposition method. In the case of using a metal or a metallic alloy as a material forming an electrode, the electrode can be formed, furthermore, by the chemical plating method (see for example, Handbook of Electrochemistry, pp 383-387, Mazuren, 1985). In the case of using an electroconducting polymer, an electrode can be made by forming it into a film by means of anodic oxidation polymerization method onto a substrate which is previously provided with an electroconducting coating. The thickness of an electrode to be formed on a substrate is not limited to a particular value, but, when the substrate is used as a light emitting plane, the thickness of the electrode is preferably within the range of from 1 nm to 300 nm, more preferably, within the range of from 5 to 200 nm so as to ensure transparency.

In a preferred embodiment ITO is used on a substrate having an ITO film thickness in the range of from 10 nm (100 Å) to 1µ (10000 Å), preferably from 20 nm (200 Å) to 500 nm (5000 Å). Generally, the sheet resistance of the ITO film is chosen in the range of not more than 100 $\Omega/cm^2$, preferably not more than 50 $\Omega/cm^2$.

Such anodes are commercially available from Japanese manufacturers, such as Geomatech Co. Ltd., Sanyo Vacuum Co. Ltd., Nippon Sheet Glass Co. Ltd.

As substrate either an electronconducting or electrically insulating material can be used. In case of using an electroconducting substrate, a light emitting layer or a positive hole transporting layer is directly formed thereupon, while in case of using an electrically insulating substrate, an electrode is firstly formed thereupon and then a light emitting layer or a positive hole transporting layer is superposed.

The substrate may be either transparent, semi-transparent or opaque. However, in case of using a substrate as an indicating plane, the substrate must be transparent or semi-transparent.

Transparent electrically insulating substrates are, for example, inorganic compounds such as glass, quartz and the like, organic polymeric compounds such as polyethylene, polypropylene, polymethylmethacrylate, polyacrylonitrile, polyester, polycarbonate, polyvinylchloride, polyvinylalcohol, polyvinylacetate and the like. Each of these substrates can be transformed into a transparent electroconducting substrate by providing it with an electrode according to one of the methods described above.

Examples of semi-transparent electrically insulating substrates are inorganic compounds such as alumina, YSZ (yttrium stabilized zirconia) and the like, organic polymeric compounds such as polyethylene, polypropylene, polystyrene, epoxy resins and the like. Each of these substrates can be transformed into a semi-transparent electroconducting substrate by providing it with an electrode according to one of the abovementioned methods.

Examples of opaque electroconducting substrates are metals such as aluminum, indium, iron, nickel, zinc, tin, chromium, titanium, copper, silver, gold, platinum and the like, various electroplated metals, metallic alloys such as bronze, stainless steel and the like, semiconductors such as Si, Ge, GaAs, and the like, electroconducting polymers such as polyaniline, polythiophene, polypyrrole, polyacetylene, polyparaphenylene and the like.

A substrate can be obtained by forming one of the above listed substrate materials to a desired dimension. It is preferred that the substrate has a smooth surface. Even, if it has a rough surface, it will not cause any problem for practical use, provided that it has round unevenness having a curvature of not less than 20 µm. As for the thickness of the substrate, there is no restriction as far as it ensures sufficient mechanical strength.

As cathode usual cathode materials which possess low work function such as alkali metals, earth alkaline metals, group 13 elements, silver, and copper as well as alloys or mixtures thereof such as sodium, lithium, potassium, calcium, lithium fluoride (LiF), sodium-potassium alloy, magnesium, magnesium-silver alloy, magnesium-copper alloy, magnesium-aluminum alloy, magnesium-indium alloy, aluminum, aluminum-aluminum oxide alloy, aluminum-lithium alloy, indium, calcium, and materials exemplified in EP-A 499,011 such as electroconducting polymers e.g. polypyrrole, polythiophene, polyaniline, polyacetylene etc., preferably Mg/Ag alloys, LiF—Al or Li—Al compositions can be used.

In a preferred embodiment a magnesium-silver alloy or a mixture of magnesium and silver, or a lithium-aluminum alloy, lithium fluoride-aluminum alloy or a mixture of lithium and aluminum can be used in a film thickness in the range of from 10 nm (100 Å) to 1 µm (10000 Å), preferably from 20 nm (200 Å) to 500 nm (5000 Å).

Such cathodes can be deposited on the foregoing electron transporting layer by known vacuum deposition techniques described above.

In a preferred embodiment of this invention a light-emitting layer can be used between the hole transporting layer and the electron transporting layer. Usually the light-emitting layer is prepared by forming a thin film on the hole transporting layer.

As methods for forming said thin film, there are, for example, the vacuum deposition method, the spin-coating method, the casting method, the Langmuir-Blodgett ("LB") method and the like. Among these methods, the vacuum deposition method, the spin-coating method and the casting method are particularly preferred in view of ease of operation and cost.

In case of forming a thin film using a composition by means of the vacuum deposition method, the conditions under which the vacuum deposition is carried out are usually strongly dependent on the properties, shape and crystalline state of the compound(s). However, optimum conditions are usually as follows: temperature of the heating boat: 100 to 400° C.; substrate temperature: −100 to 350° C.; pressure: $1.33 \times 10^{-4}$ Pa ($1 \times 10^2$ Torr) to $1.33 \times 10^{-4}$ Pa ($1 \times 10^{-6}$ Torr) and deposition rate: 1 pm to 6 nm/sec.

In an organic EL element, the thickness of the light emitting layer is one of the factors determining its light emission properties. For example, if a light emitting layer is not sufficiently thick, a short circuit can occur quite easily between two electrodes sandwiching said light emitting layer, and therefor, no EL emission is obtained. On the other hand, if the light emitting layer is excessively thick, a large potential drop occurs inside the light emitting layer because of its high electrical resistance, so that the threshold voltage for EL emission increases. Accordingly, the thickness of the organic light emitting layer is limited to the range of from 5 nm to 5 µm, preferably to the range of from 10 nm to 500 nm.

In the case of forming a light emitting layer by using the spin-coating method and the casting method, ink jet printing method, the coating can be carried out using a solution prepared by dissolving the composition in a concentration of from 0.0001 to 90% by weight in an appropriate organic solvent such as benzene, toluene, xylene, tetrahydrofurane, methyltetrahydrofurane, N,N-dimethylformamide, dichloromethane, dimethylsulfoxide and the like. If the concentration exceeds 90% by weight, the solution usually is so viscous that it no longer permits forming a smooth and homogenous film. On the other hand, if the concentration is less than 0.0001% by weight, the efficiency of forming a film is too low to be economical. Accordingly, a preferred concentration of the composition is within the range of from 0.01 to 80% by weight.

In the case of using the above spin-coating or casting method, it is possible to further improve the homogeneity and mechanical strength of the resulting layer by adding a polymer binder to the solution for forming the light emitting layer. In principle, any polymer binder may be used, provided that it is soluble in the solvent in which the composition is dissolved.

Examples of such polymer binders are polycarbonate, polyvinylalcohol, polymethacrylate, polymethylmethacrylate, polyester, polyvinylacetate, epoxy resin and the like. However, if the solid content composed of the polymer binder and the composition exceeds 99% by weight, the fluidity of the solution is usually so low that it is impossible to form a light emitting layer excellent in homogeneity. On the other hand, if the content of the composition is substantially smaller than that of the polymer binder, the electrical resistance of said layer is very large, so that it does not emit light unless a high voltage is applied thereto. Accordingly, the preferred ratio of the polymer binder to the composition is chosen within the range of from 10:1 to 1:50 by weight, and the solid content composed of both components in the solution is preferably within the range of from 0.01 to 80% by weight, and more preferably, within the range of from 0.1 to 60% by weight.

As hole-transporting layers known organic hole transporting compounds such as polyvinyl carbazole

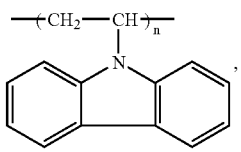

a TPD compound disclosed in J. Amer. Chem. Soc. 90 (1968) 3925:

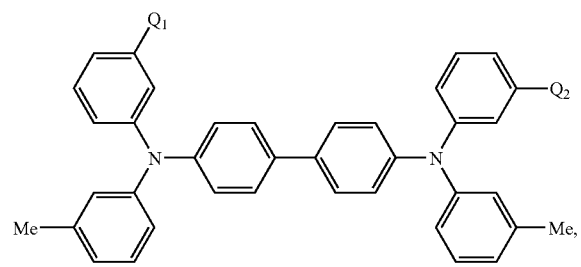

wherein $Q_1$ and $Q_2$ each represent a hydrogen atom or a methyl group;

a compound disclosed in J. Appl. Phys. 65(9) (1989) 3610:

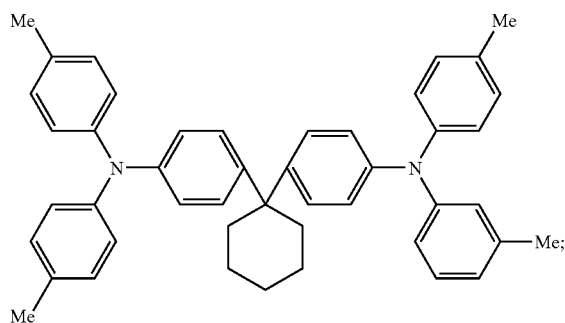

a stilbene based compound

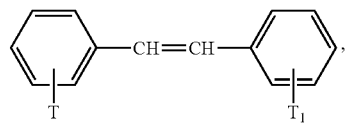

wherein T and $T_1$ stand for an organic radical;
a hydrazone based compound

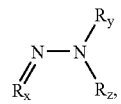

wherein Rx, Ry and Rz stand for an organic radical, and the like can be used.

Compounds to be used as a positive hole transporting material are not restricted to the above listed compounds. Any compound having a property of transporting positive holes can be used as a positive hole transporting material such as triazole derivatives, oxadiazole derivatives, imidazole derivatives, polyarylalkane derivatives, pyrazoline derivative, pyrazolone derivatives, phenylene diamine derivatives, arylamine derivatives, amino substituted chalcone derivatives, oxazole derivatives, stilbenzylanthracene derivatives, fluorenone derivatives, hydrazone derivatives, stilbene derivatives, copolymers of aniline derivatives, PEDOT (poly (3,4-ethylenedioxy-thiophene)) and the derivatives thereof, electroconductive oligomers, particularly thiophene oligomers, porphyrin compounds, aromatic tertiary amine compounds, stilbenzyl amine compounds etc.

Particularly, aromatic tertiary amine compounds such as N,N,N',N'-tetraphenyl-4,4'-diaminobiphenyl, N,N'-diphenyl-N,N'-bis(3-methylphenyl)-4,4'-diaminobiphenyl (TPD), 2,2'-bis(di-p-torylaminophenyl)propane, 1,1'-bis(4-di-torylaminophenyl)-4-phenylcyclohexane, bis(4-dimethylamino-2-methylphenyl)phenylmethane, bis(4-di-p-tolylaminophenyl)phenyl-methane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quaterphenyl, N,N,N-tri(p-tolyl)amine, 4-(di-p-tolylamino)-4'-[4-(di-p-tolylamino)stilyl]stilbene, 4-N,N-diphenylamino-(2-diphenylvinyl)benzene, 3-methoxy-4'-N,N-diphenylaminostilbene, N-phenylcarbazole etc. are used.

Furthermore, 4,4'-bis[N-(1-naphtyl)-N-phenylamino]biphenyl disclosed in U.S. Pat. No. 5,061,569 and the compounds disclosed in EP-A 508,562, in which three triphenylamine units are bound to a nitrogen atom, such as 4,4',4"-tris [N-(3-methylphenyl)-N-phenylamino]triphenylamine, can be used.

A positive hole transporting layer can be formed by preparing an organic film containing at least one positive hole transporting material on the anode. The positive hole transporting layer can be formed by the vacuum deposition method, the spin-coating method, the casting method, ink jet printing method, the LB method and the like. Of these methods, the vacuum deposition method, the spin-coating method and the casting method are particularly preferred in view of ease and cost.

In the case of using the vacuum deposition method, the conditions for deposition may be chosen in the same manner as described for the formation of a light emitting layer (see above). If it is desired to form a positive hole transporting layer comprising more than one positive hole transporting material, the coevaporation method can be employed using the desired compounds.

In the case of forming a positive hole transporting layer by the spin-coating method or the casting method, the layer can be formed under the conditions described for the formation of the light emitting layer (see above).

As in the case of forming the light emitting layer a smoother and more homogeneous positive hole transporting layer can be formed by using a solution containing a binder and at least one positive hole transporting material. The coating using such a solution can be performed in the same manner as described for the light emitting layer. Any polymer binder may be used, provided that it is soluble in the solvent in which the at least one positive hole transporting material is dissolved. Examples of appropriate polymer binders and of appropriate and preferred concentrations are given above when describing the formation of a light emitting layer.

The thickness of the positive hole transporting layer is preferably chosen in the range of from 0.5 to 1000 nm, preferably from 1 to 100 nm, more preferably from 2 to 50 nm.

As hole injection materials known organic hole transporting compounds such as metal-free phthalocyanine ($H_2Pc$), copper-phthalocyanine (Cu-Pc) and their derivatives as described, for example, in JP64-7635 can be used. Furthermore, some of the aromatic amines defined as hole transporting materials above, which have a lower ionisation potential than the hole transporting layer, can be used.

A hole injection layer can be formed by preparing an organic film containing at least one hole injection material between the anode layer and the hole transporting layer. The hole injection layer can be formed by the vacuum deposition method, the spin-coating method, the casting method, the LB method and the like. The thickness of the layer is preferably from 5 nm to 5 μm, and more preferably from 10 nm to 100 nm.

The electron transporting materials should have a high electron injection efficiency (from the cathode) and a high electron mobility. The following materials can be exemplified for electron transporting materials: tris(8-hydroxyquinolinato)-aluminum(III) and its derivatives, bis(10-hydroxybenzo[h]quinolinolato)beryllium(II) and its derivatives, oxadiazole derivatives, such as 2-(4-biphenyl)-5-(4-tert.-butylphenyl)-1,3,4-oxadiazole and its dimer systems, such as 1,3-bis(4-tert.-butylphenyl-1,3,4)oxadiazolyl)biphenylene and 1,3-bis(4-tert.-butylphenyl-1,3,4-oxadiazolyl)phenylene, dioxazole derivatives, triazole derivatives, coumarine derivatives, imidazopyridine derivatives, phenanthroline derivatives or perylene tetracarboxylic acid derivatives disclosed in Appl. Phys. Lett. 48 (2) (1986) 183.

An electron transporting layer can be formed by preparing an organic film containing at least one electron transporting material on the hole transporting layer or on the light-emitting layer. The electron transporting layer can be formed by the vacuum deposition method, the spin-coating method, the casting method, the LB method and the like.

It is preferred that the positive hole inhibiting materials for a positive hole inhibiting layer have high electron injection/transporting efficiency from the electron transporting layer to the light emission layer and also have higher ionisation potential than the light emitting layer to prevent the flowing out of positive holes from the light emitting layer to avoid a drop in luminescence efficiency.

As the positive hole inhibiting material known materials, such as Balq, TAZ and phenanthroline derivatives, e.g. bathocuproine (BCP), can be used:

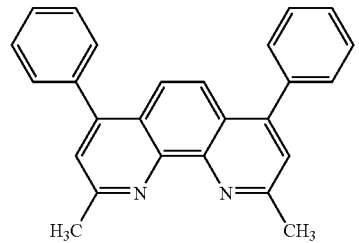

BCP

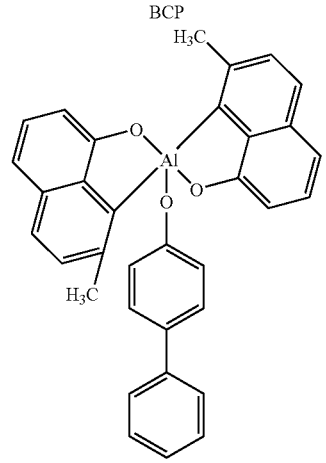

Balq

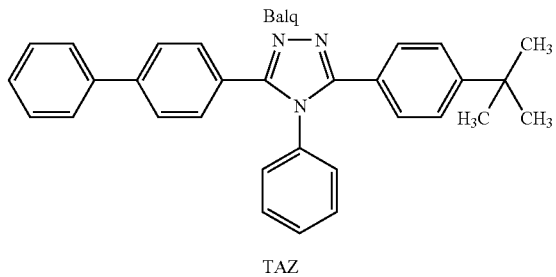

TAZ

The positive hole inhibiting layer can be formed by preparing an organic film containing at least one positive hole inhibiting material between the electron transporting layer and the light-emitting layer. The positive hole inhibiting layer can be formed by the vacuum deposition method, the spin-coating method, the casting method, ink jet printing method, the LB method and the like. The thickness of the layer preferably is chosen within the range of from 5 nm to 2 μm, and more preferably, within the range of from 10 nm to 100 nm.

As in the case of forming a light emitting layer or a positive hole transporting layer, a smoother and more homogeneous electron transporting layer can be formed by using a solution containing a binder and at least one electron transporting material.

The thickness of an electron transporting layer is preferably chosen in the range of from 0.5 to 1000 nm, preferably from 1 to 100 nm, more preferably from 2 to 50 nm.

In general, the host chromophore is a diketopyrrolopyrrole having a photoluminescence emission peak at 500 to 720 nm, preferably 520 to 630 nm, most preferred 540 to 600 nm.

The light-emitting compositions have a fluorescence emission maximum in the range of from 500 to 780, preferably from 520 to 750, more preferred from 540 to 700 nm. Further, the inventive compounds preferably exhibit an absorption maximum in the range of 450 to 600 nm.

The light-emitting compositions usually exhibit a fluorescence quantum yield ("FQY") in the range of from 1>FQY≧0.3 (measured in aerated toluene or DMF). Further, in general, the inventive compositions exhibit a molar absorption coefficient in the range of from 5000 to 100000.

Another embodiment of the present invention relates to a method of coloring high molecular weight organic materials (having a molecular weight usually in the range of from $10^3$ to $10^7$ g/mol; comprising biopolymers, and plastic materials, including fibres) by incorporating therein the inventive compounds or compositions by methods known in the art.

The inventive compounds and compositions can be used, as described for the DPP compounds of formula I' in EP-A-1087005, for the preparation of inks, for printing inks in printing processes, for flexographic printing, screen printing, packaging printing, security ink printing, intaglio printing or offset printing, for pre-press stages and for textile printing, for office, home applications or graphics applications, such as for paper goods, for example, for ballpoint pens, felt tips, fiber tips, card, wood, (wood) stains, metal, inking pads or inks for impact printing processes (with impact-pressure ink ribbons), for the preparation of colorants, for coating materials, for industrial or commercial use, for textile decoration and industrial marking, for roller coatings or powder coatings or for automotive finishes, for high-solids (low-solvent), water-containing or metallic coating materials or for pigmented formulations for aqueous paints, for the preparation of pigmented plastics for coatings, fibers, platters or mold carriers, for the preparation of non-impact-printing material for digital printing, for the thermal wax transfer printing process, the ink jet printing process or for the thermal transfer printing process, and also for the preparation of color filters, especially for visible light in the range from 400 to 700 nm, for liquid-crystal displays (LCDs) or charge combined devices (CCDs) or for the preparation of cosmetics or for the preparation of polymeric ink particles, toners, dye lasers, dry copy toners liquid copy toners, or electrophotographic toners, and electroluminescent devices.

Another preferred embodiment concerns the use of the inventive compounds and compositions for color changing media. There are three major techniques in order to realize full-color organic electroluminescent devices:
(i) use of the three primary colors blue, green and red generated by electroluminescence,
(ii) conversion of the electroluminescent blue or white to photoluminescent green and red via color changing media (CCM), which absorb the above electroluminescent blue, and fluorescence in green and red.
(iii) conversion of the white luminescent emission to blue, green and red via color filters.

The inventive compounds or compositions are useful for EL materials for the above category (i) and, in addition, for the above mention technique (ii). This is because the invented compounds or compositions can exhibit strong photoluminescence as well as electroluminescence.

Technique (ii) is, for example, known from U.S. Pat. No. 5,126,214, wherein EL blue with a maximum wavelength of ca. 470-480 nm is converted to green and red using coumarin, 4-(dicyanomethylene)-2-methyl-6-(p-dimethylaminostyryl)-4H-pyran, pyridine, rhodamine 6G, phenoxazone or other dyes.

The inventive compounds or compositions are useful for EL materials for the above category (iii) as an element of white luminescent in combination of other compensatory electroluminescence to construct white luminescent. This is because compounds or compositions can exhibit strong photoluminescence as well as electroluminescence.

Illustrative examples of suitable organic materials of high molecular weight which can be colored with the inventive compositions are described in EP-A-1087005.

Particularly preferred high molecular weight organic materials, in particular for the preparation of a paint system, a printing ink or ink, are, for example, cellulose ethers and esters, e.g. ethylcellulose, nitrocellulose, cellulose acetate and cellulose butyrate, natural resins or synthetic resins (polymerization or condensation resins) such as aminoplasts, in particular urea/formaldehyde and melamine/formaldehyde resins, alkyd resins, phenolic plastics, polycarbonates, polyolefins, polystyrene, polyvinyl chloride, polyamides, polyurethanes, polyester, ABS, ASA, polyphenylene oxides, vulcanized rubber, casein, silicone and silicone resins as well as their possible mixtures with one another.

It is also possible to use high molecular weight organic materials in dissolved form as film formers, for example boiled linseed oil, nitrocellulose, alkyd resins, phenolic resins, melamine/formaldehyde and urea/formaldehyde resins as well as acrylic resins.

Said high molecular weight organic materials may be obtained singly or in admixture, for example in the form of granules, plastic materials, melts or in the form of solutions, in particular for the preparation of spinning solutions, paint systems, coating materials, inks or printing inks.

In a particularly preferred embodiment of this invention, the inventive compounds and compositions are used for the mass coloration of polyvinyl chloride, polyamides and, especially, polyolefins such as polyethylene and polypropylene as well as for the preparation of paint systems, including powder coatings, inks, printing inks, color filters and coating colors.

Illustrative examples of preferred binders for paint systems are alkyd/melamine resin paints, acryl/melamine resin paints, cellulose acetate/cellulose butyrate paints and two-pack system lacquers based on acrylic resins which are crosslinkable with polyisocyanate.

Hence, another embodiment of the present invention relates to a composition comprising
(a) 0.01 to 50, preferably 0.01 to 5, particularly preferred 0.01 to 2% by weight, based on the total weight of the coloured high molecular organic material, of a fluorescent diketopyrrolopyrrole according to formula I, or III or of a composition according to the present invention, and
(b) 99.99 to 50, preferably 99.99 to 95, particularly preferred 99.99 to 98% by weight, based on the total weight of the coloured high molecular organic material, of a high molecular organic material, and
(c) optionally, customary additives such as rheology improvers, dispersants, fillers, paint auxiliaries, siccatives, plasticizers, UV-stabilizers, and/or additional pigments or corresponding precursors in effective amounts, such as e.g. from 0 to 50% by weight, based on the total weight of (a) and (b).

To obtain different shades, the inventive fluorescent DPP compounds of formula I, or III or the inventive compositions may advantageously be used in admixture with fillers, transparent and opaque white, colored and/or black pigments as well as customary luster pigments in the desired amount.

For the preparation of paints systems, coating materials, color filters, inks and printing inks, the corresponding high molecular weight organic materials, such as binders, synthetic resin dispersions etc. and the inventive compounds or compositions are usually dispersed or dissolved together, if desired together with customary additives such as dispersants, fillers, paint auxiliaries, siccatives, plasticizers and/or additional pigments or pigment precursors, in a common solvent or mixture of solvents. This can be achieved by dispersing or dissolving the individual components by themselves, or also several components together, and only then bringing all components together, or by adding everything together at once.

Hence, the present invention relates also to a method of coloring a high molecular weight organic material by incorporating therein the inventive compounds or compositions by known methods in the art.

Hence, a further embodiment of the present invention relates to a method of using the inventive compounds or compositions for the preparation of dispersions and the corresponding dispersions, and paint systems, coating materials, color filters, inks and printing inks comprising the inventive compositions.

A particularly preferred embodiment relates to the use of the inventive compounds or compositions for the preparation of fluorescent tracers for e.g. leak detection of fluids such as lubricants, cooling systems etc., as well as to fluorescent tracers or lubricants comprising the inventive compositions.

For the pigmentation of high molecular weight organic material, the inventive compounds or compositions, optionally in the form of masterbatches, are mixed with the high molecular weight organic materials using roll mills, mixing apparatus or grinding apparatus. Generally, the pigmented material is subsequently brought into the desired final form by conventional processes, such as calandering, compression molding, extrusion, spreading, casting or injection molding.

For pigmenting lacquers, coating materials and printing inks the high molecular weight organic materials and the inventive compounds or compositions, alone or together with additives, such as fillers, other pigments, siccatives or plasticizers, are generally dissolved or dispersed in a common organic solvent or solvent mixture. In this case it is possible to adopt a procedure whereby the individual components are dispersed or dissolved individually or else two or more are dispersed or dissolved together and only then are all of the components combined.

The present invention additionally relates to inks comprising a colorically effective amount of the pigment dispersion of the inventive compositions.

The weight ratio of the pigment dispersion to the ink in general is chosen in the range of from 0.001 to 75% by weight, preferably from 0.01 to 50% by weight, based on the overall weight of the ink.

The preparation and use of color filters or color-pigmented high molecular weight organic materials are well-known in the art and described e.g. in Displays 14/2, 1151 (1993), EP-A 784085, or GB-A 2,310,072.

The color filters can be coated for example using inks, especially printing inks, which can comprise pigment dispersions comprising the inventive compositions or can be prepared, for example, by mixing a pigment dispersion comprising an inventive composition with chemically, thermally or photolytically structurable high molecular weight organic material (so-called resist). The subsequent preparation can be carried out, for example, in analogy to EP-A 654 711 by application to a substrate, such as a LCD (liquid crystal display), subsequent photostructuring and development.

Particular preference for the production of color filters is given to pigment dispersions comprising an inventive compound or composition which possess non-aqueous solvents or dispersion media for polymers.

The present invention relates, moreover, to toners comprising a pigment dispersion containing an inventive compound or composition or a high molecular weight organic material pigmented with an inventive composition in a coloristically effective amount. The present invention additionally relates to colorants, colored plastics, polymeric ink particles, or non-impact-printing material comprising an inventive composition, preferably in the form of a dispersion, or a high molecular weight organic material pigmented with an inventive composition in a coloristically effective amount.

A coloristically effective amount of the pigment dispersion according to this invention comprising an inventive composition denotes in general from 0.0001 to 99.99% by weight, preferably from 0.001 to 50% by weight and, with particular preference, from 0.01 to 50% by weight, based on the overall weight of the material pigmented therewith.

The inventive compositions can be applied to colour polyamides, because they do not decompose during the incorporation into the polyamides. Further, they exhibit an exceptionally good lightfastness, a superior heat stability, especially in plastics.

The organic EL device of the present invention has significant industrial values since it can be adapted for a flat panel display of an on-wall television set, a flat light-emitting device, a light source for a copying machine or a printer, a light source for a liquid crystal display or counter, a display signboard and a signal light. The compounds and compositions of the present invention can be used in the fields of an organic EL device, an electrophotographic photoreceptor, a photoelectric converter, a solar cell, an image sensor, and the like.

The following examples are for illustrative purposes only and are not to be construed to limit the scope of the instant invention in any manner whatsoever. In the examples the "parts" denote "parts by weight" and the "percentages" denote "percentages by weight", unless otherwise stated.

EXAMPLES

Example 1 a) 70.56 g of sodium hydride (50-72% assay) are washed with toluene to remove oil. Then, the washed sodium hydride, 207.7 g of diethyl carbonate and 1 L of anhydrous dioxane are heated to 80° C. with stirring. 150 g of 1-acetyl naphthalene is added drop by drop during three hours and stirred at 80° C. for 15 hours. The reaction mixture is allowed to cool to room temperature and poured onto 1 L of ice. The water layer is separated and two times extracted with 200 ml of ethyl acetate. The organic layers are combined and dried over sodium sulfate, filtered, evaporated and dried, giving yield 212.6 g of ethyl 1-naphtoyl acetate. The crude product is used for the next reaction step without further purification.

b) 121 g of ethyl 1-naphthoyl acetate, 67.4 g of ethyl chloroacetate, 75.9 g potassium carbonate, 300 ml of acetone and 200 ml of 1,2-dimethoxyethane are placed in a vessel. The mixture is stirred at 80° C. for 20 hours. After the mixture has cooled down to room temperature, it is filtered and dried.

170 g of 1-naphthoyl-succinic acid diethyl ester are obtained. The crude product is used for the next reaction step without further purification.

c) 231 g of 1-naphthoyl-succinic acid diethyl ester, 543 g of ammonium acetate and 680 ml of acetic acid are stirred at 140° C. for 18 hours. After the reaction mixture has cooled down to room temperature, it is poured into ice. The produced solid is separated and the aqueous solution is extracted by 300 ml of dichloromethane. The extracts and the solid are combined and dried. The crude product is purified by column chromatography and 40.2 g of 4-carbetoxy-5-(-1-naphtyl)pyrroline-2-one are obtained.

d) 56.8 g of 9-cyanophenanthrene, 63.3 g of t-BuOK, 80 ml of dry toluene and 200 ml of t-amylalcohol are stirred at 120° C. and 40.2 g of 4-carbetoxy-5-(-1-naphtyl)pyrroline-2-one is added portion-wise during 2 hours. The reaction mixture is allowed to cool to room temperature and poured into ice. The product is colleted by filtration, washed with toluene and dried. 72.3 g of 1,4-diketo-3-(1-naphthyl)-6-(9-phenanthrenyl)-pyrrolo[3,4-c]pyrrole retained. The crude product contains impurities, but is used for the next step without purification.

e) 60 g of 1,4diketo-3-(1-naphthyl)-6-(9-phenanthrenyl)-pyrrolo[3,4-c]pyrrole, 16.5 g of sodium hydride (50-72% assay) and 300 ml of 1-methyl-2-pyrrolidinone are stirred for 2 hours at room temperature. 57.8 g of methyl iodide are added to the reaction mixture drop by drop and then the mixture is additionally stirred for 2 hours. The mixture is poured into 1 L of ice and the yellow solid is filtered off and washed with methanol. After drying 25.2 g of an orange solid are obtained (mp.=338-340° C.).

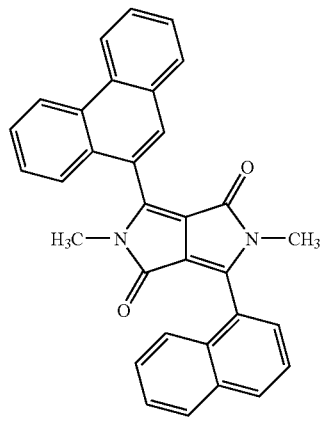

Example 2

Example 1 is repeated, except that 1-cyano-4-methyl naphthalene is used in place of 9-cyanophenanthrene, wherein an orange solid is obtained (mp.=360-364° C.).

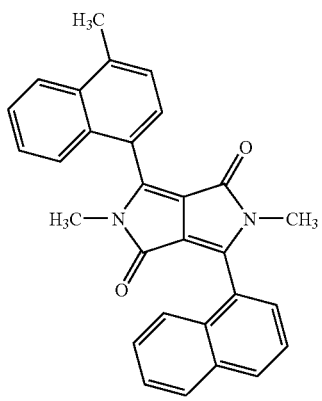

Example 3

Example 1 is repeated, except that 3-methyl-4-cyano-biphenyl is used in place of 9-cyanophenanthrene, wherein an orange solid is obtained (mp.=235-337° C.).

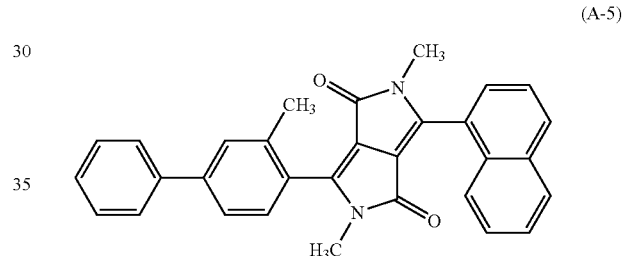

Example 4

Example 1 is repeated, except that 2-cyanonaphthalene is used in place of 9-cyanophnanthrene, wherein an orange solid was obtained (mp.=239-242° C.).

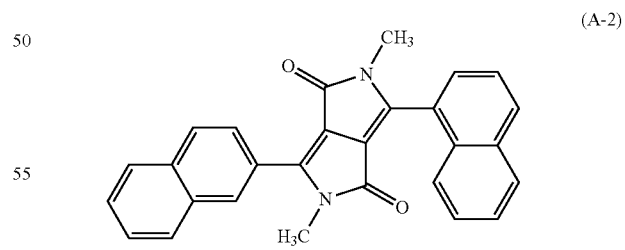

Example 5

Example 1 is repeated, except that 9-acetylphenanthrene and 4-methyl-1-cyanonaphthalene are used in place of 1-acetyl naphthalene in the step a) and 9-cyanophnanthrene in the step d), respectively (mp.=359-360° C.).

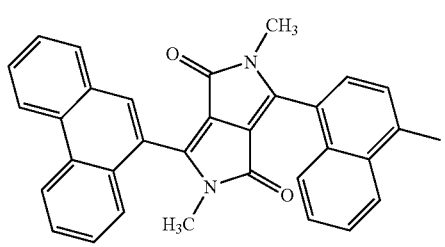

(A-21)

Example 6

25 g of 2-fluorenecarboaldehyde, 11.6 g of sodium acetate, 9.7 g of hydroxy ammonium chloride and 150 ml of acetic acid were stirred at 130 for 18 hours. The reaction mixture was allowed to room temperature, poured into 200 ml of water and the precipitate was collected by filtration. The crude product was purified by column chromatography, giving 15.57 g (63%) of 2-cyanofluorene.

14.29 g of 2-cyanofluorene, 8.9 g of sodium hydride (60% in oil) and 150 ml of NMP were stirred at room temperature for 2.5 hours. Then, 31.2 g of methyl iodide was added into the reaction mixture drop-wisely and stirred for an additional 2 hours at room temperature. The reaction mixture was poured into 200 ml of water and filtered. The crude product was purified by column chromatography, giving 8.5 g (60%) of 2-cyano-9,9-dimethylfluorene.

And then, Example 5 is repeated 2-cyano-9,9-dimethylfluorene is used in place of 4-methyl-1-cyanonaphthalene (mp.=209-210° C.).

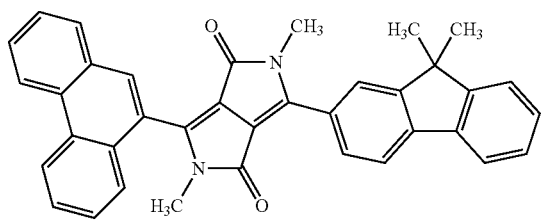

(A-7)

Example 7

A glass substrate (manufactured by Geomatek Co., a product prepared by an electron beam vapor deposition method) on which an ITO transparent electroconductive film has been deposited up to a thickness of 120 nm is cut into a size of 30×40 mm and etched. The substrate thus obtained is subjected to ultrasonic washing with acetone for 15 minutes, then with Semikoklin 56 for 15 minutes and washed with ultra-pure water. Subsequently, the substrate is subjected to ultrasonic washing with isopropyl alcohol for 15 minutes, dipped in hot methanol for 15 minutes and dried. Just before forming the substrate into an element, the substrate thus obtained is subjected to an UV-ozone treatment for one hour and placed in a vacuum vapor deposition apparatus, and the apparatus is evacuated until the inner pressure reaches $1 \times 10^{-5}$ Pa or less. Then, according to the resistance heating method, a phthalocyanine copper complex (CuPc) is vapor-deposited up to a thickness of 20 nm to form a positive hole injection layer. Then N,N'-di-(1-naphthalene)-N,N'-diphenyl-1,1'-diphenyl-4,4'-diamine (α-NPD) is vapor-deposited as a positive hole transporting material up to a thickness of 50 nm, to form a positive hole transporting layer. Subsequently, the DPP compound A-10 (as a light emitting material) is vapor-deposited up to a thickness of 50 nm to form a light emitting layer. Subsequently, an Alq3 layer having a thickness of 30 nm and lithium fluoride (0.5 nm) are vapor-deposited to form an electron transporting layer and a cathode, respectively.

The luminescent peak wavelength of the luminescent element thus obtained is 585 nm, and the maximum luminance thereof is 14210 $Cd/m^2$. Staring from emission with 963 $Cd/m^2$ of brightness in continuous driving mode, its brightness sustained 62% of the initial intensity after 70 hours. The compound A-10 shows higher emission intensity and durability than compound 1 of Reference Example 1 (Table 1).

Reference Example 1

An EL device is prepared in the same manner as in Example 5, except that compound 1 is used as light emitting layer. The luminescent peak wavelength of the luminescent element thus obtained is 583 nm, and the maximum luminance thereof is as high as 7225 $Cd/m^2$. Staring from an emission with 844 $Cd/m^2$ of brightness in continuous driving, the brightness sustained 56% of the initial intensity after 70 hours.

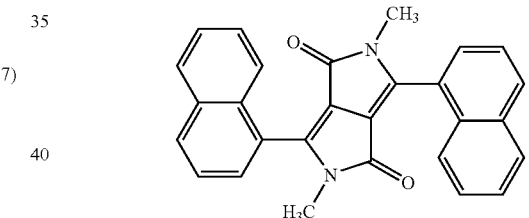

Compound 1 (Cpd. 1)

TABLE 1

| Example | Compound | EL initial performance Emission max ($Cd/m^2$) | EL durability Initial brightness ($Cd/m^2$) | Sustainability % of initial brightness* |
|---|---|---|---|---|
| Ex.7 | A-10 | 14,210 | 963 | 62% |
| Reference 1 | Cpd. 1 | 7,225 | 844 | 56% |

*After 70 hours in continuous driving mode

Example 8

Example 7 was repeated except that light emitting layer comprise example 1 and compound 2 (wt %). The light-emitting layer was prepared by simultaneous co-deposition method.

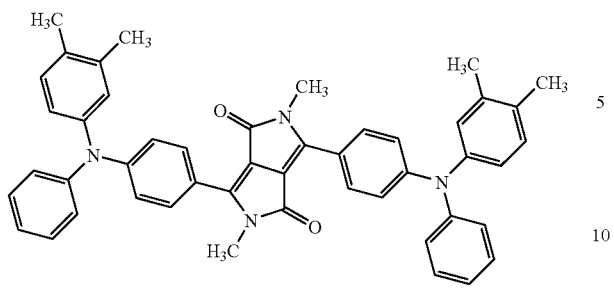

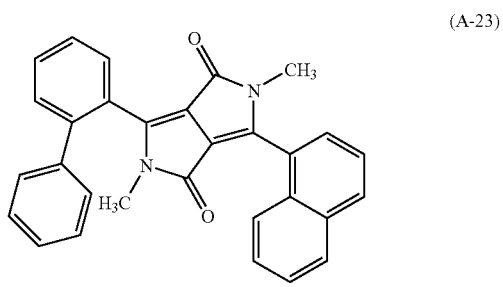

Compound 2 (Cpd. 2)

The luminescent peak wavelength of the luminescent element thus obtained is 608 nm, and the maximum luminance thereof is 16,740 Cd/m$^2$. Staring from emission with 843 Cd/m$^2$ of brightness in continuous driving mode, its brightness sustained 68% of the initial intensity after 280 hours. The emitting layer of Example 8 shows higher emission intensity and durability than that of Reference 2 (Table 2).

Reference 2

An EL device is prepared in the same manner as in Example 8, except that compound 1 and compound 2 (1.89%) are used as light emitting layer. The luminescent peak wavelength of the luminescent element thus obtained is 606 nm, and the maximum luminance thereof is as high as 14,010 Cd/m$^2$. Starting from an emission with 730 Cd/m$^2$ of brightness in continuous driving, the brightness sustained 60% of the initial intensity after 280 hours.

TABLE 2

| Example | Light emitting layer (H/G) | EL initial performance Emission max (Cd/m$^2$) | EL durability Initial brightness (Cd/m$^2$) | Sustainability % of initial brightness** |
|---|---|---|---|---|
| Ex. 8 | A-10/ Cpd. 2 | 16,740 | 843 | 68% |
| Reference 2 | Cpd. 1/ Cpd. 2 | 14,010 | 730 | 60% |

**After 280 hours in continuous driving mode

Example 9

Example 1 is repeated, except that 3,5-di-t-butylbenzonitrile is used in place of 9-cyanophnanthrene, wherein an orange solid was obtained (mp.=251-252).

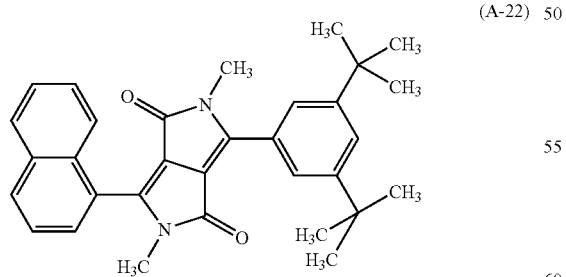

Example 10

Example 1 is repeated, except that 2-cyanobiphenyl is used in place of 9-cyanophnanthrene, wherein an orange solid was obtained (mp.=343).

Example 11

Example 1 is repeated, except that 4-cyanobiphenyl is used in place of 9-cyanophnanthrene, wherein an orange solid was obtained (mp.=247-250).

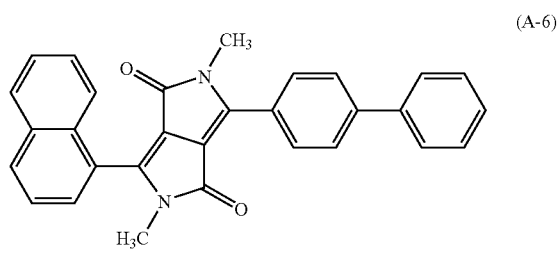

Example 12

Example 1 is repeated, except that 1-pyrenecarbonitrile is used in place of 9-cyanophenenthrene, wherein a red solid was obtained. (mp>300 C)

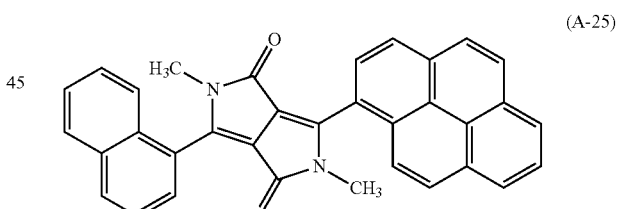

Example 13

4.25 g of 4-cyanofluorene, 2.6 g of sodium hydride (60% in oil) and 50 ml of NMP are stirred at room temperature for 2 hours. Then, 9.3 g of methyl iodide are added to the reaction mixture drop-wisely and stirred for an additional 2 hours at room temperature. The reaction mixture is poured into 100 ml of water and filtered. The crude product is purified by column chromatography, giving 3.9 g (80%) of 4-cyano-9,9-dimethylfluorene.

Then Example 1 is repeated, except that 4-cyano-9,9-dimethylfluorene is used in place of 9-cyanophenenthrene, wherein an orange solid is obtained.

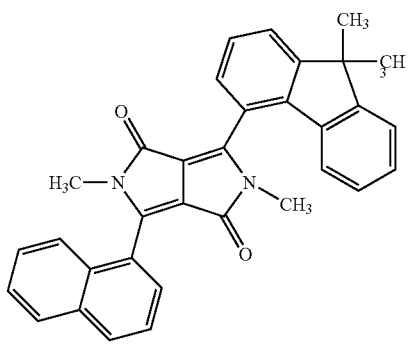

(A-52)

Example 14

Example 1 is repeated, except that 4-phenyl-1-cyanonaphthalene is used in place of 9-cyanophenenthrene, wherein a red solid is obtained.

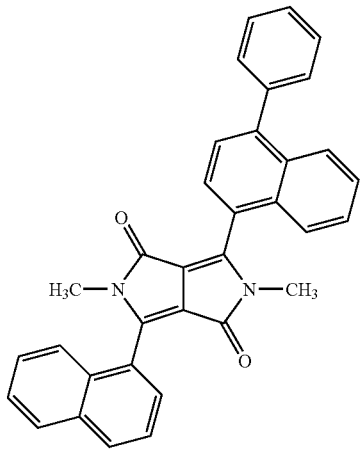

(A-55)

Example 15

Example 1 is repeated, except that 4-(1-naphthyl)-1-cyanonaphthalene is used in place of 9-cyanophenenthrene, wherein a red solid is obtained.

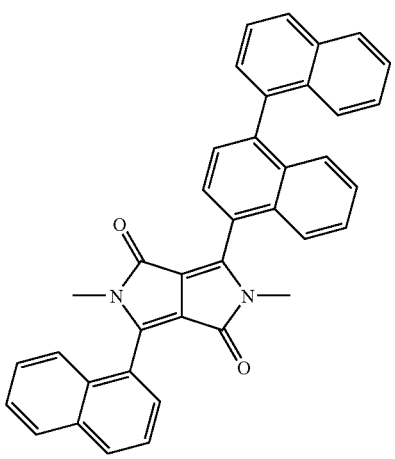

(A-56)

Example 16

3.6 g sodium is added to 100 ml t-amylalcohol and a spatula of $FeCl_3$, then heated to 115° C., until the sodium is completely dissolved. 3.7 g 5-tert-Butyl-isophthalonitrile is added to this solution. 7.0 g of 4-carbetoxy-5-(-1-naphtyl) pyrroline-2-one is dissolved in 200 ml dioxane and added via a dropping funnel during 2½ hours to the solution. After 2 other hours at 115° C., the reaction mixture is allowed to cool to room temperature and poured into a solution of 300 ml methanol/300 ml water/8 ml acid sulphuric. The product is colleted by filtration, washed with cold methanol and dried. 7.6 g of a dimeric DPP are obtained. The crude product contains impurities, but is used for the next step without purification.

The alkylation step is similar to the one described in example 1e), except that the amount of sodium hydride and methyl iodide is doubled. After drying an orange solid is obtained (mp.>300° C.; Tg=187° C.)

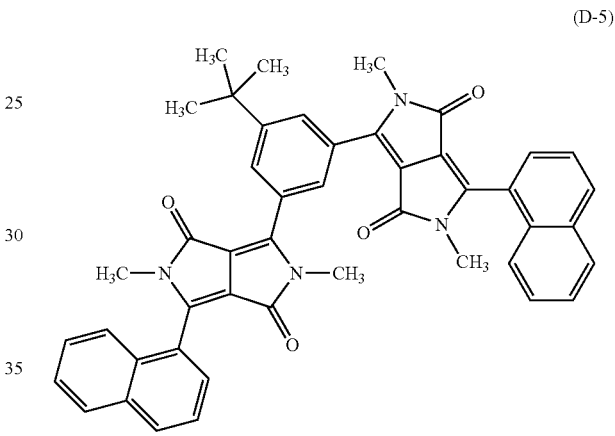

(D-5)

The invention claimed is:

1. A fluorescent diketopyrrolopyrrole of the formula

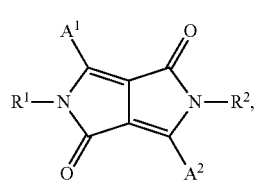

(I)

wherein $R^1$ and $R^2$ may be the same or different and are selected from a $C_1$-$C_{25}$alkyl group, an allyl group, which can be substituted one to three times with $C_1$-$C_3$alkyl, a cycloalkyl group, which can optionally be substituted one to three times with $C_1$-$C_8$alkyl and/or $C_1$-$C_8$alkoxy, a cycloalkyl group, which is condensed one or two times by phenyl which can be substituted one to three times with $C_1$-$C_4$-alkyl, halogen, nitro, or cyano, an alkenyl group, a cycloalkenyl group, an alkynyl group, a heterocyclic group, haloalkyl, haloalkenyl, haloalkynyl, a heterocyclic group, a ketone or aldehyde group, an ester group, a carbamoyl group, a silyl group, a siloxanyl group, aryl, heteroaryl, or —$CR^3R^4$—$(CH_2)_m$-$A^3$ wherein $R^3$ and $R^4$ independently from each other stand for hydrogen or $C_1$-$C_4$alkyl, or phenyl which can be substituted one to three times with $C_1$-$C_3$alkyl, $A^3$ stands for aryl, or heteroaryl, which can be substituted one to three times with $C_1$-$C_8$alkyl and/or $C_1$-$C_8$alkoxy, and m stands for 0, 1, 2, 3 or 4, $A^1$ stands for

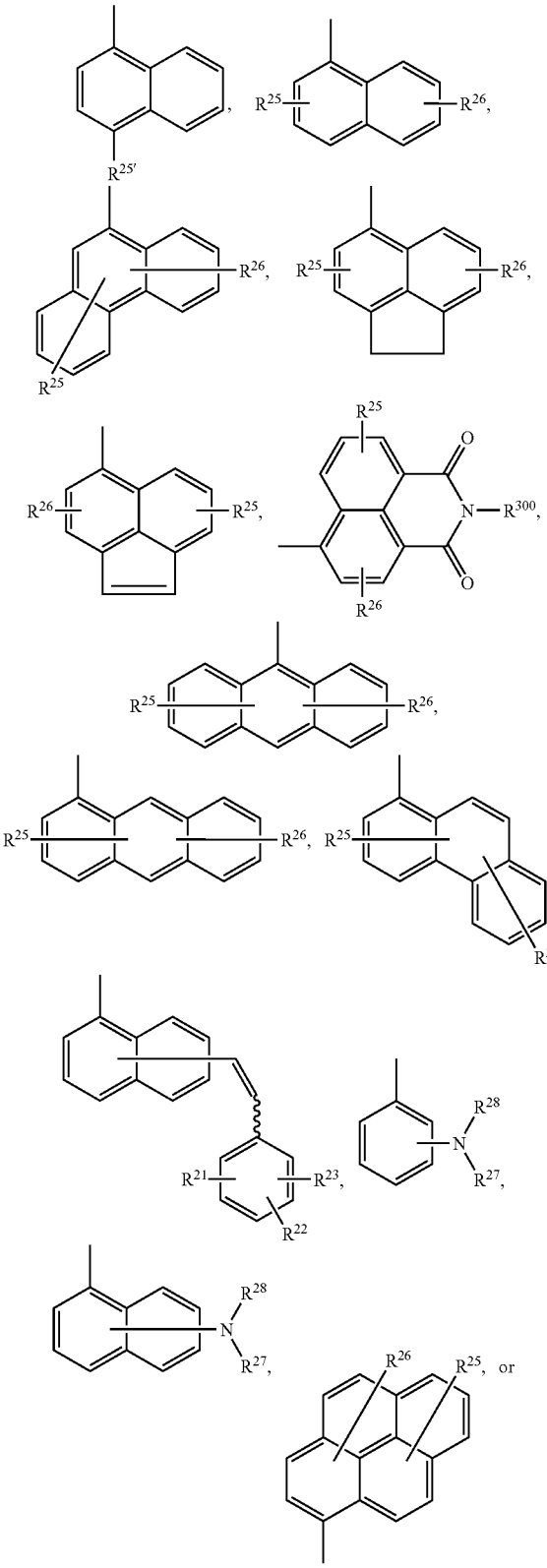

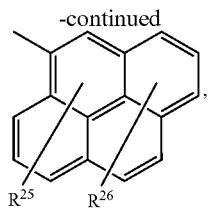

wherein $R^{25'}$ is a $C_6$-$C_{12}$aryl group, which may be substituted by one, or more $C_1$-$C_8$alkyl, or $C_1$-$C_8$alkoxy groups, $R^{300}$ is $C_1$-$C_8$alkyl, a $C_6$-$C_{24}$aromatic, or $C_2$-$C_{17}$heteroaromatic group, which may be substituted by one, or more $C_1$-$C_8$alkyl, or $C_1$-$C_8$alkoxy groups, $R^{21}$, $R^{22}$, $R^{23}$, $R^{25}$ and $R^{26}$ are independently of each other hydrogen, $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group, a silyl group or a siloxanyl group, $R^{27}$ and $R^{28}$ are independently of each other

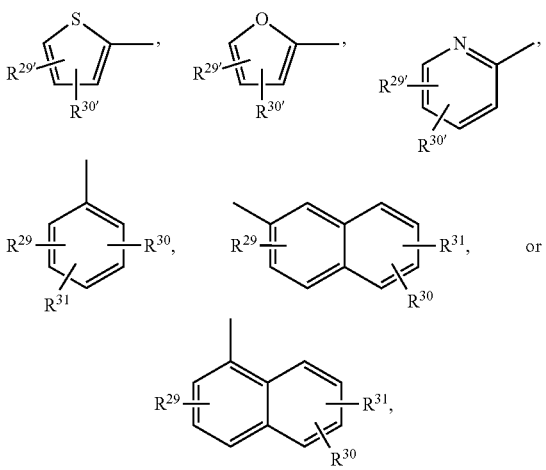

wherein $R^{29}$, $R^{30}$ and $R^{31}$ are independently of each other hydrogen, $C_1$-$C_8$alkyl, $C_1$-$C_8$alkoxy or a group —$NR^{32}R^{33}$, wherein $R^{32}$ and $R^{33}$ are independently of each other

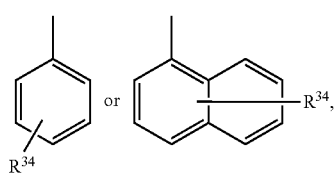

wherein $R^{34}$ is hydrogen, $C_1$-$C_8$alkyl or $C_1$-$C_8$alkoxy, or $R^{27}$ and $R^{28}$ together with the nitrogen atom to which they are bonded form a five or six membered heterocyclic ring, which can be condensed by one or two optionally substituted phenyl groups, $R^{29'}$ and $R^{30'}$ independently from each other stands for hydrogen, $C_1$-$C_8$-alkyl or $C_1$-$C_8$-alkoxy, and $A^2$ stands for $A^1$ with the proviso that $A^2$ and $A^1$ have different meanings within the same molecule;

$A^2$ stands for

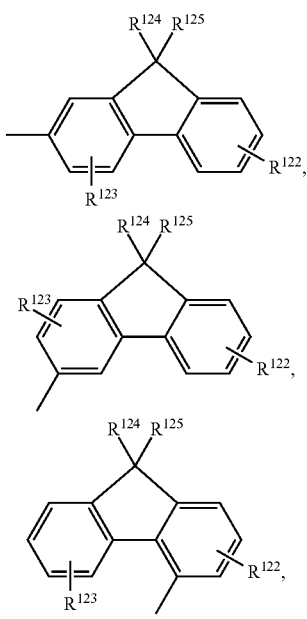

wherein $R^{122}$ to $R^{123}$ may be the same or different and are selected from hydrogen, $C_1$-$C_{25}$group, cycloalkyl, aralkyl, alkenyl, cycloalkenyl, alkynyl, hydroxyl, a mercapto group, alkoxy, alkylthio, an aryl ether group, an aryl thioether group, aryl, a heterocyclic group, halogen, haloalkyl, haloalkenyl, haloalkynyl, a cyano group, an aldehyde group, a carbonyl group, a carboxyl group, an ester group, a carbamoyl group, a group $NR^{27}R^{28}$, wherein $R^{27}$ and $R^{28}$ are as defined above, a nitro group, a silyl group, a siloxanyl group, a substituted or unsubstituted vinyl group, or at least two adjacent substituents $R^{115}$ to $R^{121}$ form an aromatic, heteroaromatic or aliphatic fused ring system, $R^{124}$ and $R^{125}$ may be the same or different and are selected from $C_1$-$C_{18}$alkyl; or $R^{124}$ and $R^{125}$ together form a five-, six- or seven-membered ring, which can optionally be substituted by $C_1$-$C_8$alkyl, or which can optionally be condensed one or two times by phenyl which can be substituted one to three times with $C_1$-$C_8$-alkyl, $C_1$-$C_8$-alkoxy, halogen and cyano; or $A^2$ stands for a heteroaromatic group

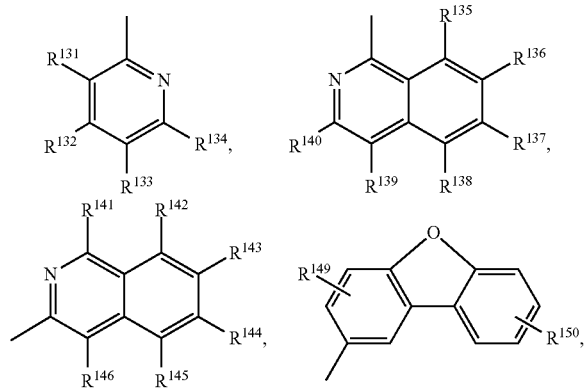

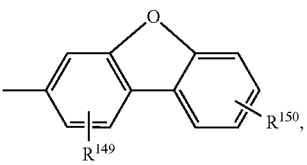

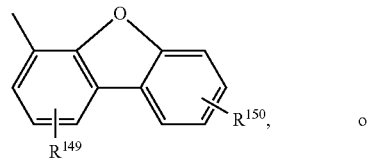

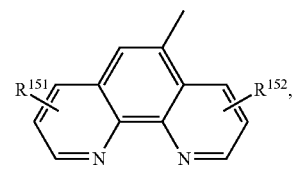

wherein $R^{131}$ to $R^{152}$ may be the same or different and are selected from hydrogen, $C_1$-$C_{25}$alkyl group, cycloalkyl, aralkyl, alkenyl, cycloalkenyl, alkynyl, hydroxyl, a mercapto group, alkoxy, alkylthio, an aryl ether group, an aryl thioether group, aryl, a heterocyclic group, halogen, haloalkyl, haloalkenyl, haloalkynyl, a cyano group, an aldehyde group, a carbonyl group, a carboxyl group, an ester group, a carbamoyl group, a group $NR^{27}R^{28}$, wherein $R^{27}$ and $R^{28}$ are as defined above, a nitro group, a silyl group, a siloxanyl group, a substituted or unsubstituted vinyl group.

2. The fluorescent diketopyrrolopyrrole according to claim 1, wherein $R^1$ and $R^2$ independently from each other stand for $C_1$-$C_8$alkyl, $C_5$-$C_{12}$-cycloalkyl, which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, or —$CR^3R^4$—$(CH_2)_m$-$A^3$, wherein $R^3$ and $R^4$ stand for hydrogen, or $C_1$-$C_4$alkyl, $A^3$ stands for phenyl or 1- or 2-naphthyl, which can be substituted one to three times with $C_1$-$C_8$alkyl and/or $C_1$-$C_8$alkoxy, and m stands for 0 or 1.

3. The fluorescent diketopyrrolopyrrole according to claim 1, wherein $A^1$ stands for

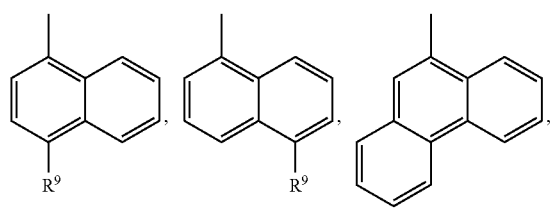

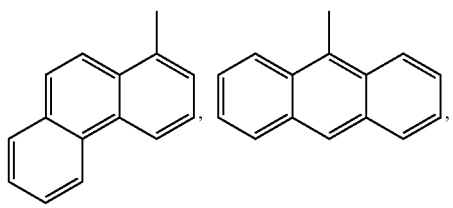

-continued

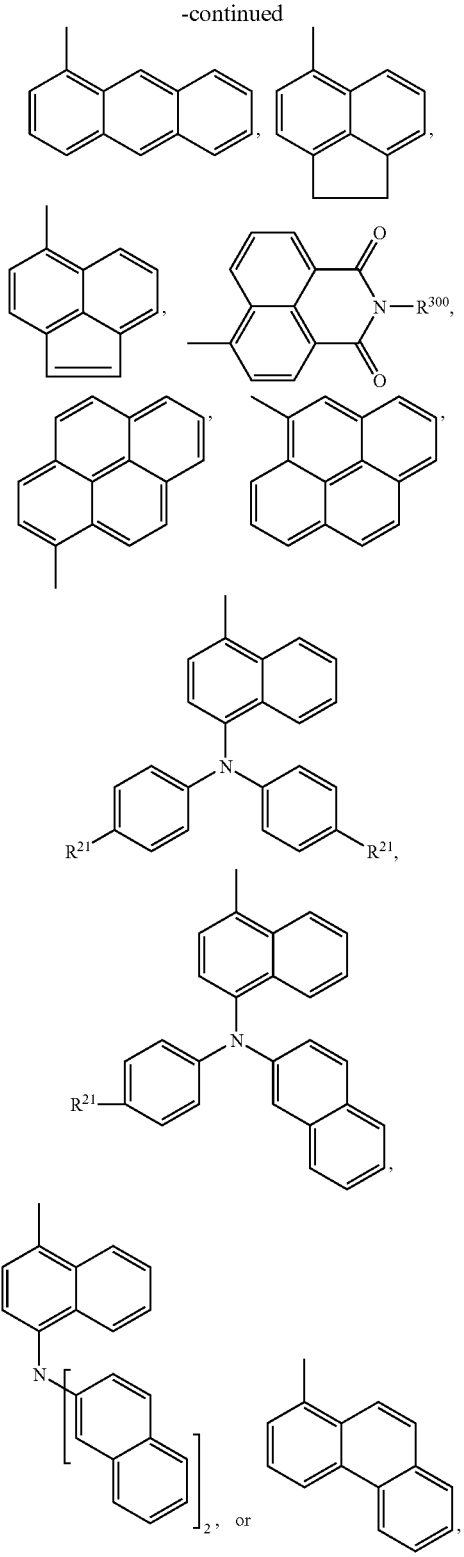

wherein $R^{300}$ is $C_1$-$C_8$alkyl, phenyl, which can be substituted by one, or more $C_1$-$C_8$alkyl, or $C_1$-$C_8$alkoxy groups, $R^9$ is hydrogen, phenyl, 1-naphthyl, which can be substituted by one, or more $C_1$-$C_8$alkyl, or $C_1$-$C_8$alkoxy groups; $C_1$-$C_8$alkyl, or $C_1$-$C_8$alkoxy, and $R^{21}$ is hydrogen, $C_1$-$C_8$alkyl or $C_1$-$C_8$alkoxy.

4. The fluorescent diketopyrrolopyrrole according to claim 3, selected from the group consisting of

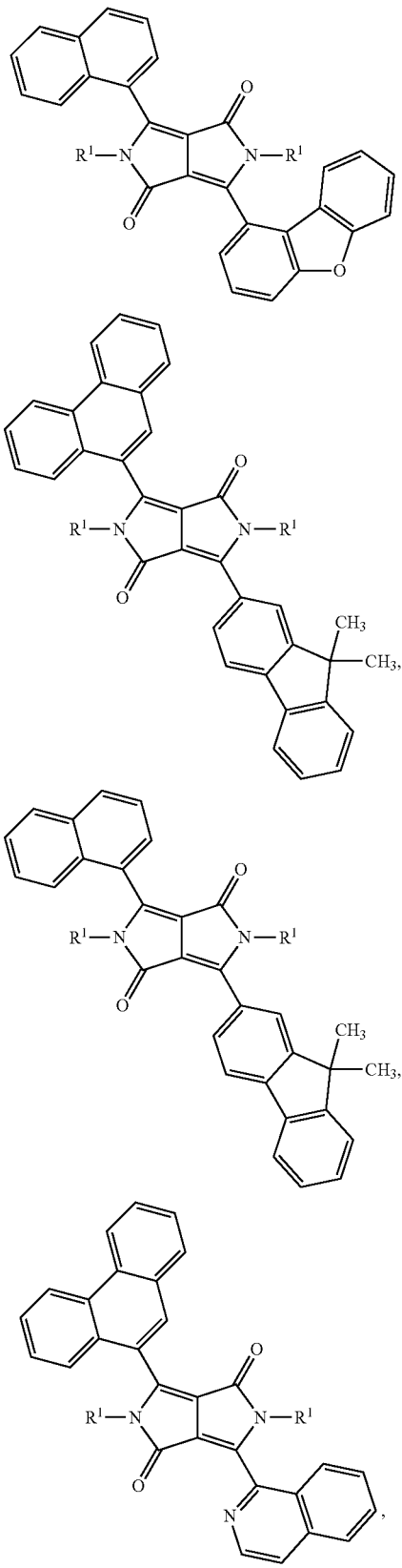

137
-continued
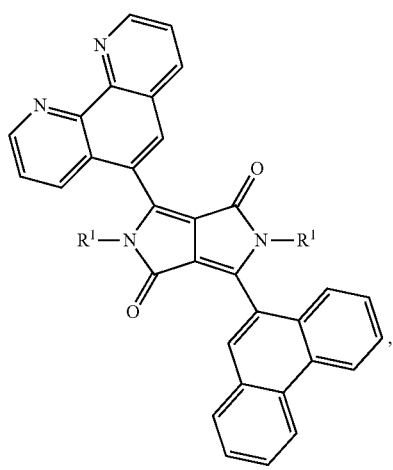
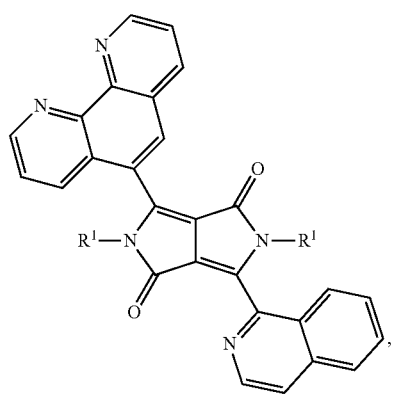
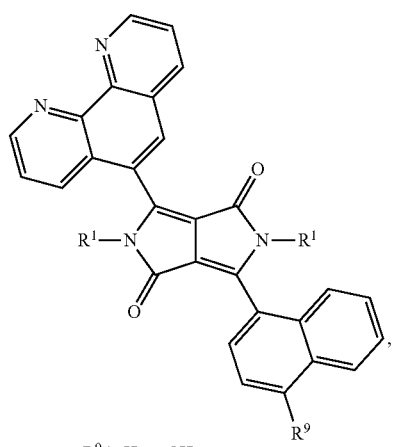
R⁹ is H, or CH₃,
138
-continued
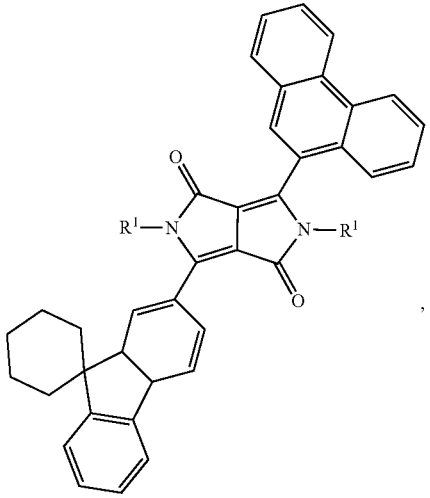
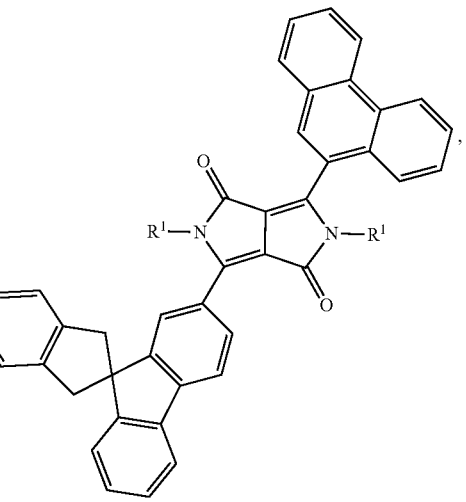
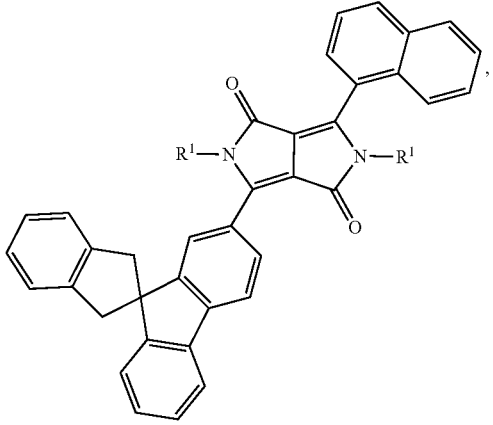

139
-continued
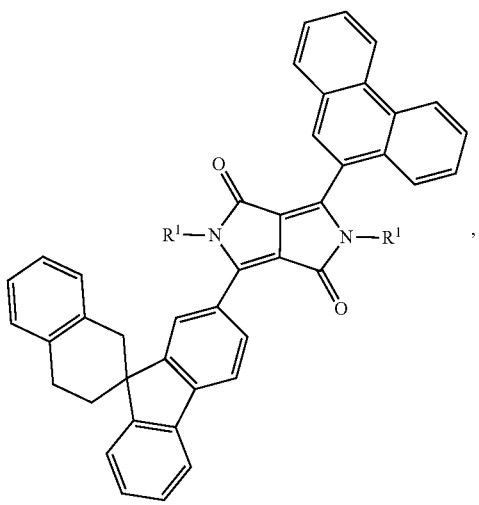
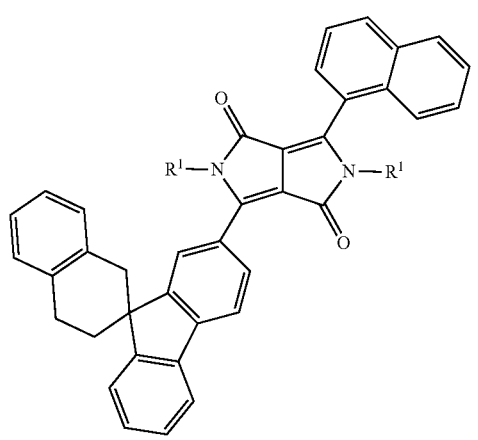
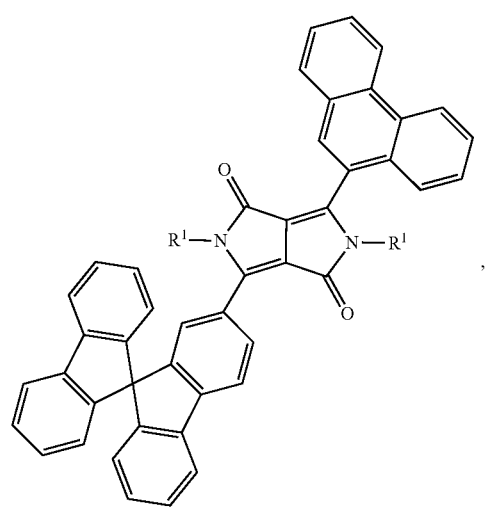
140
-continued
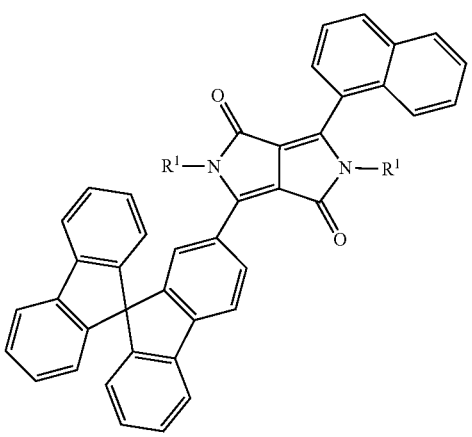
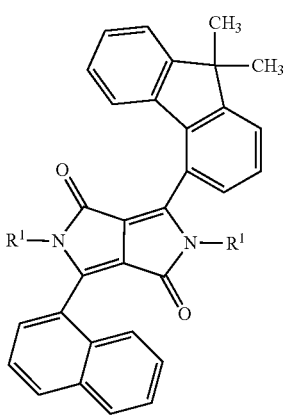
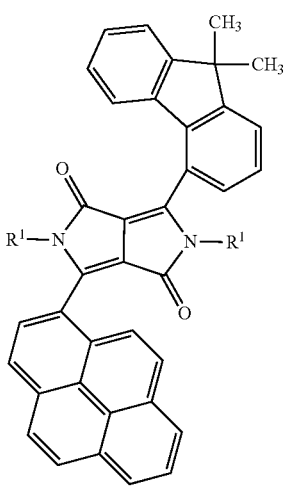

141
-continued
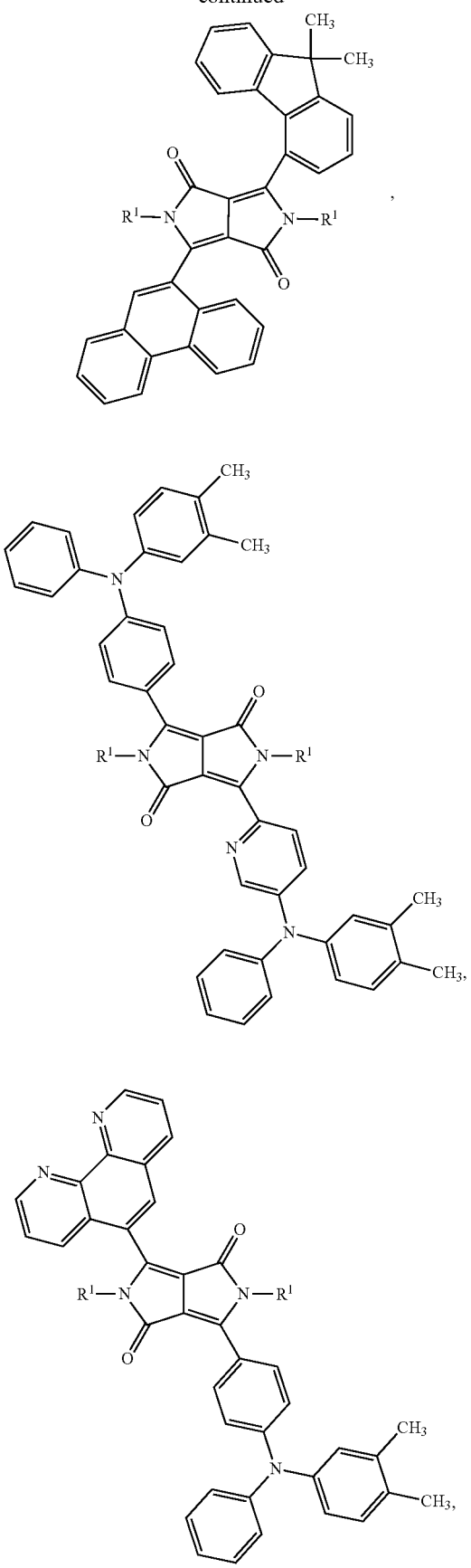
142
-continued
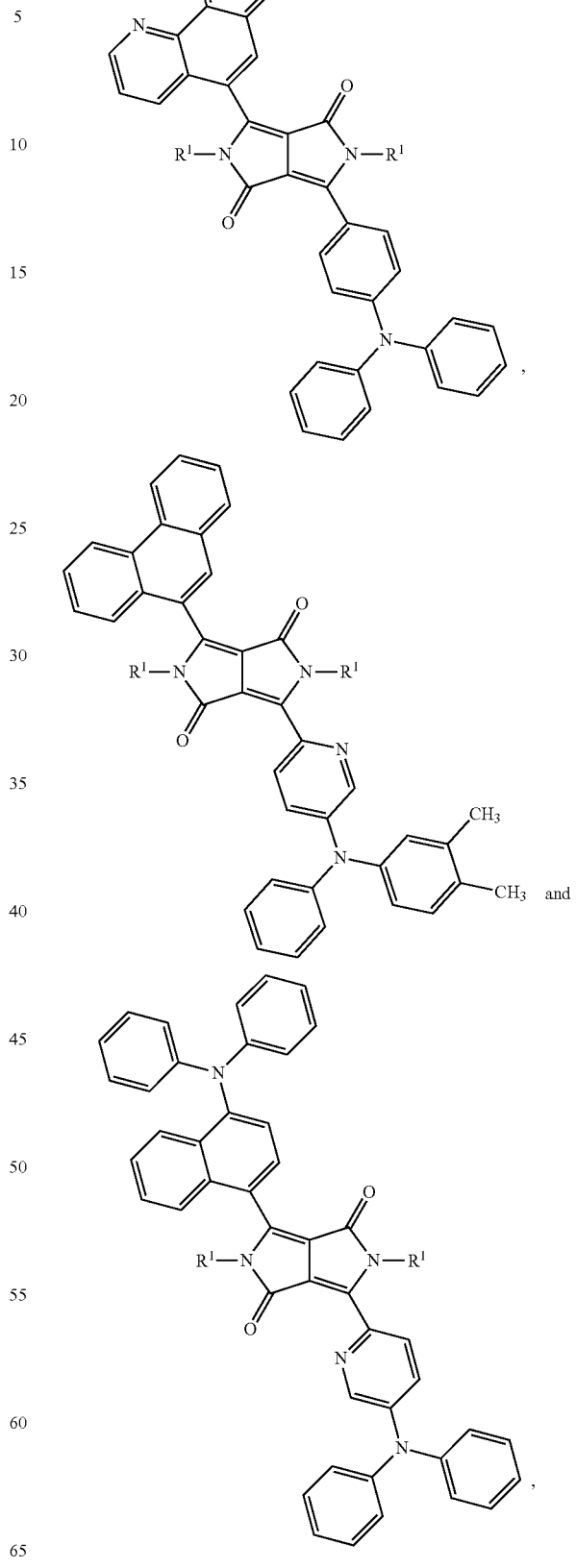

wherein $R^1$ is allyl, $C_1$-$C_8$alkyl, such as methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl, tri($C_1$-$C_8$alkyl)silyl, such as trimethylsilyl, —$CH_2$-$A^{3'}$, —$CHCH_3$-$A^3$ or —$CH_2$—$CH_2$-$A^3$, wherein $A^3$ stands for phenyl, which can be substituted one, two, or three times with $C_1$-$C_8$alkyl.

* * * * *